(12) United States Patent
Nosaka

(10) Patent No.: US 10,715,107 B2
(45) Date of Patent: Jul. 14, 2020

(54) ACOUSTIC WAVE DEVICE, RADIO FREQUENCY FRONT-END CIRCUIT, AND COMMUNICATION DEVICE

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/358,811

(22) Filed: Mar. 20, 2019

(65) Prior Publication Data
US 2019/0326884 A1 Oct. 24, 2019

Related U.S. Application Data

(63) Continuation of application No. PCT/JP2017/033566, filed on Sep. 15, 2017.

(30) Foreign Application Priority Data

Sep. 21, 2016 (JP) ................................ 2016-184894

(51) Int. Cl.
*H03H 9/54* (2006.01)
*H03H 9/64* (2006.01)
*H03H 9/145* (2006.01)

(52) U.S. Cl.
CPC ............ *H03H 9/542* (2013.01); *H03H 9/145* (2013.01); *H03H 9/6403* (2013.01); *H03H 9/6483* (2013.01)

(58) Field of Classification Search
CPC .... H03H 9/542; H03H 9/6403; H03H 9/6483; H03H 9/145; H03H 9/13; H03H 9/72; H04B 1/00

(Continued)

(56) References Cited

U.S. PATENT DOCUMENTS 6,472,953 B1 10/2002 Sakuragawa et al.
6,525,624 B1 2/2003 Hikita et al.
(Continued)

FOREIGN PATENT DOCUMENTS

JP       S64-68114 A     3/1989
JP       2000-323961 A   11/2000
(Continued)

OTHER PUBLICATIONS

International Search Report for International Application No. PCT/JP2017/033566, dated Dec. 5, 2017.
(Continued)

*Primary Examiner* — Barbara Summons
(74) *Attorney, Agent, or Firm* — Pearne & Gordon LLP

(57) ABSTRACT

A variable filter (10) includes a parallel arm resonance circuit and a serial arm resonance circuit, the parallel arm resonance circuit includes a parallel arm resonator (p1) having an IDT electrode (121) and a frequency variable circuit (11) connected to the parallel arm resonator (p1), the frequency variable circuit (11) includes a capacitance element (C1) and a switch (SW), the variable filter (10) further includes a capacitance element (C2) connected between a serial arm and ground, the IDT electrode (121), an IDT wiring connected to the IDT electrode (121), and a capacitance wiring connected to the capacitance element (C1) are formed on the same substrate, a wiring (141 or 144) of the capacitance wirings and a wiring (143) of the IDT wirings intersect with each other, and the capacitance element (C2) is configured of the capacitance wiring and the IDT wiring in the intersection region.

19 Claims, 24 Drawing Sheets

(58) Field of Classification Search
USPC .................................................. 333/193–196
See application file for complete search history.

(56) References Cited

U.S. PATENT DOCUMENTS

| | | |
|---|---|---|
| 2009/0251235 A1 | 10/2009 | Belot et al. |
| 2016/0028366 A1 | 1/2016 | Takamine |
| 2017/0279432 A1 | 9/2017 | Murase |

FOREIGN PATENT DOCUMENTS

| | | | |
|---|---|---|---|
| JP | 2001-069031 A | | 3/2001 |
| JP | 2007-259023 A | | 10/2007 |
| JP | 2011-259516 A | | 12/2011 |
| JP | 2017-050741 A | * | 3/2017 |
| WO | 2014/167752 A1 | | 10/2014 |
| WO | 2016/111315 A1 | | 7/2016 |

OTHER PUBLICATIONS

Written Opinion for International Application No. PCT/JP2017/033566, dated Dec. 5, 2017.

* cited by examiner

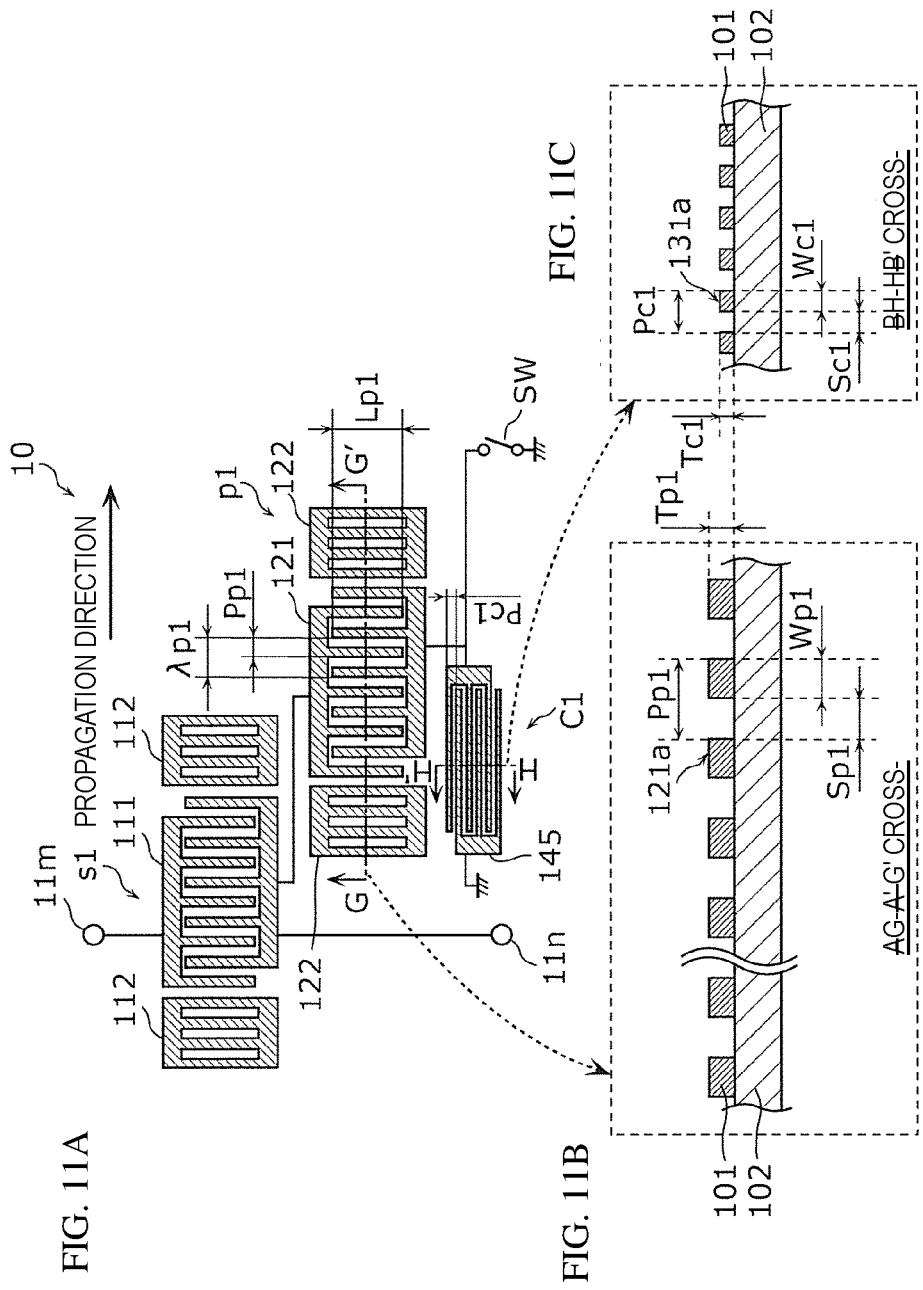

CAPACITANCE SELF-RESONANCE POINT

ACOUSTIC WAVE DEVICE, RADIO FREQUENCY FRONT-END CIRCUIT, AND COMMUNICATION DEVICE

This is a continuation of International Application No. PCT/JP2017/033566 filed on Sep. 15, 2017 which claims priority from Japanese Patent Application No. 2016-184894 filed on Sep. 21, 2016. The contents of these applications are incorporated herein by reference in their entireties.

BACKGROUND OF THE DISCLOSURE

Field of the Disclosure

The present disclosure relates to an acoustic wave device having an acoustic wave resonator, a radio frequency front-end circuit, and a communication device.

Description of the Related Art

An acoustic wave filter using an acoustic wave has been widely used as a band pass filter or the like arranged at a front end portion of an existing mobile communication apparatus. In addition, a radio frequency front-end circuit including a plurality of acoustic wave filters has been put into practical use in order to be compliant with composite system such as multi-mode/multi-band.

For example, as a multi-band capable acoustic wave filter, a configuration is known in which a pair of capacitors and a switch connected in parallel to each other is connected in series to a parallel arm resonance circuit (parallel arm resonator) of a ladder filter configured of a BAW resonator (see, for example, Patent Document 1). Such an acoustic wave filter configures a tunable filter (frequency variable filter) capable of varying a pass band in response to conduction and non-conduction of a switch.

Patent Document 1: U.S. Patent Application Publication No. 2009/0251235

BRIEF SUMMARY OF THE DISCLOSURE

However, in the frequency variable type acoustic wave device disclosed in Patent Document 1, although the pass band is varied by a frequency shift of an attenuation pole in the vicinity of the pass band by a switching operation, there is a problem that steepness of the pass band on a low-band side is not maintained.

In addition, in order to enhance the steepness of the pass band on the low-band side, although it is also conceivable to add a capacitance element connected in parallel to the parallel arm circuit or the acoustic wave resonator in the frequency variable type acoustic wave device disclosed in Patent Document 1, when an element having a low Q value, such as a comb-tooth electrode, is used as the capacitance element, a low loss characteristic in the pass band of the frequency variable type acoustic wave device deteriorates.

Accordingly, it is an object of the present disclosure to provide a frequency variable type acoustic wave device in which the steepness and the low loss characteristic of a pass band are secured, a radio frequency front-end circuit, and a communication device.

In order to achieve the above-described object, an acoustic wave device according to an aspect of the present disclosure is a frequency variable type acoustic wave device, the acoustic wave device includes: a first input and output terminal and a second input and output terminal; a first resonance circuit provided in one of a first path connecting the first input and output terminal and the second input and output terminal to each other and a second path connecting a node of the first path and ground to each other; and a second resonance circuit provided in another of the first path and the second path and forming a pass band with the first resonance circuit, in which the first resonance circuit includes a first acoustic wave resonator including a first interdigital transducer (IDT) electrode formed of a plurality of electrode fingers and a frequency variable circuit connected to the first acoustic wave resonator and for varying the pass band, the frequency variable circuit includes a first capacitance element connected to the first acoustic wave resonator and a switch element for switching a conduction path of the frequency variable circuit, the acoustic wave device further includes a second capacitance element connected between the node and the ground or the frequency variable circuit, in which the first IDT electrode, one or more first IDT wirings connected to the first IDT electrode, and one or more first capacitance wirings connected to at least one of the first capacitance element and the ground are formed on an identical substrate, at least one wiring of the one or more first capacitance wirings and at least one wiring of the one or more first IDT wirings make intersection with each other when the substrate is viewed in a plan view, and the second capacitance element is configured of the first capacitance wiring in a region of the intersection and the first IDT wiring in the region of the intersection.

In the above configuration, the first resonance circuit and the second resonance circuit configure an acoustic wave filter which switches (varies) frequencies of the pass band and an attenuation pole by switching conduction (on) and non-conduction (off) of the switch element. Specifically, by on and off switching of the switch element, a frequency of a resonant frequency or an anti-resonant frequency of the first resonance circuit configuring the attenuation pole is switched, and a frequency variable amount is defined by a constant of the first capacitance element. In other words, the first capacitance element is designed in accordance with a desired frequency variable amount, and requires a relatively large capacitance value.

On the other hand, the second capacitance element is connected in parallel to the first resonance circuit or the second resonance circuit, and contributes to a resonant frequency or an anti-resonant frequency of the first resonance circuit or the second resonance circuit which configures the pass band. Therefore, a high Q value is required with a relatively small capacitance value.

According to the above configuration, the second capacitance element has a configuration in which the first capacitance wiring and the first IDT wiring in the intersection region are used as opposite electrodes. Therefore, even when the first IDT electrode and the various wirings are formed on the same substrate, film thicknesses of the opposite electrodes can be adjusted without being limited by a film thickness of the first IDT electrode defined by propagation characteristics of the acoustic wave, and it is thus possible to form the second capacitance element having the large capacitance Q value. Accordingly, since the steepness and the low loss characteristic of the pass band on a low-band side are particularly secured, a bandpass characteristic of the acoustic wave device is improved.

Furthermore, the first resonance circuit may be provided in the second path, the first acoustic wave resonator may be directly or indirectly connected to the node, the frequency variable circuit may be connected between the first acoustic wave resonator and the ground, the first capacitance element and the switch element may be connected in parallel to each other, a first wiring, which is connected to the first capacitance element or the switch element and the ground, of the one or more first capacitance wirings and a second wiring, which is connected to the second resonance circuit, of the one or more first IDT wirings may make intersection with each other when the substrate is viewed in a plan view, and the second capacitance element may be configured of the first wiring in a region of the intersection and the second wiring in the region of the intersection.

In the above configuration, the pass band is configured by the anti-resonant frequency of the first resonance circuit. Additionally, the second capacitance element is connected in parallel to the first resonance circuit, contributes to the anti-resonant frequency of the first resonance circuit, and therefore has the relatively small capacitance value and requires the high Q value.

According to the above configuration, the second capacitance element has a configuration in which the first wiring and the second wiring in the intersection region are used as the opposite electrodes.

Therefore, even when the first wiring and the second wiring are formed on the same substrate, the film thicknesses of the opposite electrodes can be adjusted without being limited by the film thickness of the first IDT electrode defined by the propagation characteristics of the acoustic wave, and it is thus possible to form the second capacitance element having the large capacitance Q value. Accordingly, since the steepness and the low loss characteristic of the pass band on the low-band side are particularly secured, the bandpass characteristic of the acoustic wave device is improved.

Furthermore, the first resonance circuit may be provided in the second path, the first acoustic wave resonator may be directly or indirectly connected to the node, the frequency variable circuit may be connected between the first acoustic wave resonator and the ground, the first capacitance element and the switch element may be connected in parallel to each other, a third wiring, which is connected to the first capacitance element and the switch element or the first acoustic wave resonator, of the one or more first capacitance wirings and the second wiring, which is connected to the second resonance circuit, of the one or more first IDT wirings may make intersection with each other when the substrate is viewed in a plan view, and the second capacitance element may be configured of the third wiring in a region of the intersection and the second wiring in the region of the intersection.

In the above configuration, the pass band is configured by the anti-resonant frequency of the first resonance circuit. Additionally, the second capacitance element is connected in parallel to the first acoustic wave resonator of the first resonance circuit, contributes to the anti-resonant frequency of the first resonance circuit, and therefore has the relatively small capacitance value and requires the high Q value.

According to the above configuration, the second capacitance element has a configuration in which the third wiring and the second wiring in the intersection region are used as the opposite electrodes.

Therefore, even when the third wiring and the second wiring are formed on the same substrate, the film thicknesses of the opposite electrodes can be adjusted without being limited by the film thickness of the first IDT electrode defined by the propagation characteristics of the acoustic wave, and it is thus possible to form the second capacitance element having the large capacitance Q value. Accordingly, since the steepness and the low loss characteristic of the pass band on the low-band side are particularly secured, the bandpass characteristic of the acoustic wave device is improved.

Furthermore, the first resonance circuit may be provided on the first path, the first acoustic wave resonator and the frequency variable circuit may be connected in parallel to each other, the first capacitance element and the switch element may be connected in series to each other, a fourth wiring, which is connected to the second resonance circuit and the ground, of the one or more first capacitance wirings and the second wiring, which is connected to the second resonance circuit, of the one or more first IDT wirings may make intersection with each other when the substrate is viewed in a plan view, and the second capacitance element may be configured of the fourth wiring in a region of the intersection and the second wiring in the region of the intersection.

In the above configuration, the pass band is configured by the resonant frequency of the first resonance circuit and the anti-resonant frequency of the second resonance circuit. Additionally, the first capacitance element does not contribute to the resonant frequency of the first resonance circuit, and the second capacitance element contributes to the anti-resonant frequency of the second resonance circuit. Therefore, the second capacitance element has the relatively small capacitance value and requires the high Q value.

According to the above configuration, the second capacitance element has a configuration in which the fourth wiring and the second wiring in the intersection region are used as the opposite electrodes.

Therefore, even when the fourth wiring and the second wiring are formed on the same substrate, the film thicknesses of the opposite electrodes can be adjusted without being limited by the film thickness of the first IDT electrode defined by the propagation characteristics of the acoustic wave, and it is thus possible to form the second capacitance element having the large capacitance Q value. Accordingly, since the steepness and the low loss characteristic of the pass band on the low-band side are particularly secured, the bandpass characteristic of the acoustic wave device is improved.

Furthermore, the second capacitance element may be configured of the first capacitance wiring in the region of the intersection, the first IDT wiring in the region of the intersection, and a first intermediate layer made of an insulator or a dielectric sandwiched between the first capacitance wiring and the first IDT wiring.

With this configuration, the second capacitance element configures a parallel plate type capacitor formed by the first capacitance wiring and the first IDT wiring three-dimensionally intersecting with each other on the substrate with the first intermediate layer sandwiched therebetween. Additionally, by appropriately selecting a material and adjusting a dielectric constant of the first intermediate layer, it is possible to adjust the capacitance value of the second capacitance element.

Furthermore, the first intermediate layer may be made of at least one of silicon oxide, alumina, silicon nitride, and polyimide.

According to this configuration, since the material of the first intermediate layer can be selected from the above materials, the degree of freedom in adjusting the capacitance value of the second capacitance element is improved.

Furthermore, a film thickness of a wiring, which is not connected to the first capacitance element, of the one or more first IDT wirings may be larger than a film thickness of the first capacitance wiring.

Since the first capacitance element does not require the large capacitance Q value, it is not necessary to increase a film thickness of an electrode configuring the first capacitance element. On the other hand, the first capacitance element requires the large capacitance value in some cases, processing accuracy such as making a large number of cascades and making narrow pitches of the electrode is required, and therefore the film thickness is preferably small.

On the other hand, since the second capacitance element requires the large capacitance Q value, it is preferable to increase a film thickness of an electrode configuring the second capacitance element.

From the above-described viewpoint, in a case where the first IDT electrode, the first capacitance element, and the second capacitance element are formed on the same substrate, without increasing the film thickness of the first capacitance wiring connected to the first capacitance element, by increasing a film thickness of the wiring being a wiring that configures the second capacitance element and that is not connected to the first capacitance element, without impairing frequency characteristics of the first capacitance element, it is possible to increase the capacitance Q value of the second capacitance element.

Furthermore, the first capacitance element may be configured of the substrate and a comb-tooth capacitance electrode constituted of a plurality of electrode fingers formed on the substrate.

As described above, as compared with the second capacitance element, the first capacitance element does not require the large capacitance Q value, but requires the relatively large capacitance value. When the first capacitance element is formed on the substrate on which the first IDT electrode and the second capacitance element are formed, the comb-tooth capacitance electrode having an electrode finger configuration similar to that of the IDT electrode is configured on the substrate. Since the comb-tooth capacitance electrode has a configuration in which unit capacitances each configured of adjacent electrode fingers and the substrate having a relatively high dielectric constant are in cascading connection, a large capacitance value can be secured. Thus, it is possible to obtain the desired frequency variable amount based on a required specification.

Furthermore, a film thickness of one of the first capacitance wiring in the region of the intersection and the first IDT wiring in the region of the intersection may be larger than a film thickness of the comb-tooth capacitance electrode.

Since the first capacitance element does not require the large capacitance Q value, it is not absolutely necessary to increase the film thickness of the comb-tooth capacitance electrode. On the other hand, the first capacitance element requires the large capacitance value in some cases, the processing accuracy for narrowing an electrode finger pitch of the comb-tooth capacitance electrode is required, and therefore the film thickness is preferably small.

On the other hand, since the second capacitance element requires the large capacitance Q value, it is preferable to increase the film thickness of the electrode configuring the second capacitance element.

From the above-described viewpoint, without increasing the film thickness of the comb-tooth capacitance electrode, by increasing the film thickness of any one of the two wirings that configures the second capacitance element, without impairing the frequency characteristics of the first capacitance element, it is possible to increase the capacitance Q value of the second capacitance element.

Furthermore, a second intermediate layer formed on the comb-tooth capacitance electrode and made of an insulator or a dielectric, and a three-dimensional wiring formed on the second intermediate layer and connected to the first IDT wiring may be further provided.

With this configuration, since the three-dimensional wiring is arranged on the comb-tooth capacitance electrode, a wiring layout area of the acoustic wave device can be reduced, and miniaturization can be achieved. In addition, the degree of freedom in the arrangement of terminals including the input and output terminal and a ground terminal is improved. Additionally, since the three-dimensional wiring is disposed above the comb-tooth capacitance electrode with the second intermediate layer sandwiched therebetween, unnecessary acoustic wave radiation caused by the comb-tooth capacitance electrode is suppressed, so that the frequency characteristics of the comb-tooth capacitance configured of the comb-tooth capacitance electrode and a piezoelectric body layer are improved, and the bandpass characteristic of the acoustic wave device is improved.

Furthermore, the comb-tooth capacitance electrode, the substrate, and the three-dimensional wiring may suppress the excitation of an acoustic wave generated in the comb-tooth capacitance electrode and configure a capacitor.

With this configuration, since the three-dimensional wiring is arranged above the comb-tooth capacitance electrode, the unnecessary acoustic wave excitation caused by the comb-tooth capacitance electrode is suppressed, so that the frequency characteristics of the comb-tooth capacitance configured of the comb-tooth capacitance electrode and the substrate are improved, and the bandpass characteristic of the acoustic wave device is improved.

Furthermore, the three-dimensional wiring may be connected to one electrode of two electrodes configuring the comb-tooth capacitance electrode with the first IDT wiring interposed therebetween.

With this configuration, the capacitance value of the comb-tooth capacitance configured of the comb-tooth capacitance electrode and the substrate is obtained by adding not only the capacitance value defined by the comb-tooth capacitance electrode and the substrate but also the capacitance value defined by the other electrode of the comb-tooth capacitance electrode and the three-dimensional wiring. Therefore, it is possible to increase the capacitance value of the first capacitance element.

Furthermore, the three-dimensional wiring may connect two wirings formed on the substrate, and opposite from each other with the comb-tooth capacitance electrode sandwiched therebetween when the substrate is viewed in a plan view.

With this configuration, the two wirings are connected to each other by the three-dimensional wiring in the shortest length without being connected by a wiring bypassing the comb-tooth capacitance electrode in the plan view, and thus the wiring layout area on the substrate can be reduced. Therefore, the layout area of the acoustic wave device can be reduced and miniaturization can be achieved.

Furthermore, a film thickness of the three-dimensional wiring may be larger than a film thickness of the plurality of electrode fingers configuring the comb-tooth capacitance electrode.

With this configuration, the film thickness of the three-dimensional wiring can be increased regardless of the film thickness of the comb-tooth capacitance electrode optimized by the frequency characteristics of the Q value and the capacitance value of the first capacitance element. Thus, since wiring resistance of the three-dimensional wiring can be reduced, a radio frequency signal propagation loss of the acoustic wave device can be reduced. Additionally, when the three-dimensional wiring is connected to one of the two electrodes configuring the comb-tooth capacitance electrode, a resistance component of the comb-tooth capacitance can be reduced, so that the Q value of the comb-tooth capacitance can be improved.

Furthermore, the second intermediate layer may be made of at least one of silicon oxide, alumina, silicon nitride, and polyimide.

According to this configuration, since the material of the second intermediate layer can be selected from the above materials, the degree of freedom in adjusting the capacitance value of the first capacitance element is improved.

Furthermore, a pitch of the plurality of electrode fingers of the comb-tooth capacitance electrode may be narrower than a pitch of the plurality of electrode fingers of the first IDT electrode, the film thickness of the plurality of electrode fingers of the comb-tooth capacitance electrode may be smaller than a film thickness of the plurality of electrode fingers of the first IDT electrode, and a self-resonance point of a comb-tooth capacitance configured of the comb-tooth capacitance electrode and the substrate may be formed on a higher-band side than the pass band of the acoustic wave device.

Here, in the first capacitance element, as the pitch of the electrode fingers becomes narrower, the self-resonance point at which the Q value (capacitance Q) of the first capacitance element locally drops shifts to the higher-band side. Therefore, by making the pitch of the electrode fingers of the comb-tooth capacitance electrode narrower than the pitch of the electrode fingers of the first IDT electrode and driving the self-resonance point of the first capacitance element to the higher-band side than the pass band of the acoustic wave device, it is possible to increase the Q value of the first capacitance element in the pass band. In addition, when a frequency of the self-resonance point of the first capacitance element is identical to a frequency of a resonance point or an anti-resonance point obtained by combined characteristics of the acoustic wave resonator configured of the first IDT electrode and the first capacitance element, in the acoustic wave resonator, the Q value of the resonance point or the anti-resonance point drops due to the drop of the Q value of the first capacitance element. Therefore, by narrowing the pitch of the electrode fingers and driving the self-resonance point of the first capacitance element to the higher-band side than a resonant frequency and an anti-resonant frequency of the acoustic wave resonator, it is possible to suppress the Q value of a circuit configured of the acoustic wave resonator and the first capacitance element from dropping and to secure the required Q value. However, for the reasons in manufacturing, the pitch of the electrode fingers is limited by the film thickness of the electrode fingers. Therefore, by making the film thickness of the electrode fingers of the first capacitance element smaller than the film thickness of the electrode fingers of the first acoustic wave resonator, since the pitch of the electrode fingers of the first capacitance element can be made narrower, it becomes easy to secure both the Q value of the first acoustic wave resonator and the Q value of the first capacitance element. Thus, securing both of the Q value of the first acoustic wave resonator and the Q value of the first capacitance element makes it possible to suppress the loss in the pass band and to increase the steepness of an attenuation slope.

Furthermore, a duty ratio that is a ratio of a width of each of the plurality of electrode fingers to the pitch of the plurality of electrode fingers of the comb-tooth capacitance electrode may be larger than a duty ratio that is a ratio of a width of each of the plurality of electrode fingers to the pitch of the plurality of electrode fingers of the first IDT electrode.

With this configuration, a capacitance value of the first capacitance element per unit area can be increased. Thus, miniaturization and space saving can be achieved.

Furthermore, the second resonance circuit may include a second acoustic wave resonator having a second IDT electrode configured of a plurality of electrode fingers, the first resonance circuit may be provided in the second path and the second resonance circuit may be provided in the first path, the switch element may be connected in parallel to the first capacitance element, and the frequency variable circuit may be connected in series to the first acoustic wave resonator between the node and the ground.

With this configuration, since the attenuation pole of the pass band on at least one of the low-band side and the high-band side can be subjected to a frequency shift in accordance with the on and off state of the switch element, a tunable filter for switching the pass band can be obtained.

Furthermore, the first resonance circuit may further include a third acoustic wave resonator, the third acoustic wave resonator may be connected in parallel to a circuit in which the first acoustic wave resonator and the frequency variable circuit are connected in series to each other between the node and the ground, and a resonant frequency of the third acoustic wave resonator may be different from a resonant frequency of the first acoustic wave resonator and an anti-resonant frequency of the third acoustic wave resonator may be different from an anti-resonant frequency of the first acoustic wave resonator.

With this configuration, the tunable filter capable of performing the frequency shift for at least one of the attenuation pole of the pass band on the low-band side and the attenuation pole of the pass band on the high-band side can be obtained.

Furthermore, the resonant frequency of the third acoustic wave resonator may be lower than the resonant frequency of the first acoustic wave resonator, the anti-resonant frequency of the third acoustic wave resonator may be lower than the anti-resonant frequency of the first acoustic wave resonator, and the frequency variable circuit may be connected in series only to the first acoustic wave resonator of the first acoustic wave resonator and the third acoustic wave resonator.

With this configuration, while shifting the attenuation pole of the pass band on the high-band side to the higher-band side, without dropping a shoulder of the pass band on the low-band side, the pass band can be shifted to the higher-band side.

Furthermore, the resonant frequency of the third acoustic wave resonator may be higher than the resonant frequency of the first acoustic wave resonator, the anti-resonant frequency of the third acoustic wave resonator may be higher than the anti-resonant frequency of the first acoustic wave resonator, and the frequency variable circuit may be connected in series only to the first acoustic wave resonator of the first acoustic wave resonator and the third acoustic wave resonator.

With this configuration, the tunable filter capable of shifting the pass band to the higher-band side, while shifting the attenuation pole of the pass band on the low-band side to the higher-band side, without dropping the shoulder of the pass band on the low-band side, can be obtained.

Furthermore, the frequency variable circuit may be connected in series to a circuit in which the first acoustic wave resonator and the third acoustic wave resonator are connected in parallel to each other.

With this configuration, the tunable filter capable of shifting both the attenuation poles of the pass band on both sides to the higher-band side can be obtained.

Furthermore, the frequency variable circuit may be connected in series only to one of the first acoustic wave resonator and the third acoustic wave resonator, and the first resonance circuit may further include another frequency variable circuit connected in series only to another of the first acoustic wave resonator and the third acoustic wave resonator between the node and the ground.

With this configuration, while shifting the attenuation poles of the pass band on the high-band side and of the pass band on the low-band side to the higher-band side, without dropping the shoulders of the pass band on the high-band side and of the pass band on the low-band side, the pass band can be shifted to the higher-band side. As a result, for example, the tunable filter capable of shifting a center frequency while maintaining a band width can be obtained.

Furthermore, the frequency variable circuit may further include an inductor connected in series to the switch element, and a circuit in which the switch element and the inductor are connected in series to each other may be connected in parallel to the comb-tooth capacitance.

With this configuration, the tunable filter having a wide frequency variable width of the pass band can be obtained.

Furthermore, the first resonance circuit may be provided in the first path, the second resonance circuit may be provided in the second path, the switch element may be connected in series to the first capacitance element and configure a frequency variable circuit with the first capacitance element, and the frequency variable circuit may be connected in parallel to the first acoustic wave resonator.

With this configuration, the tunable filter capable of shifting the attenuation pole of the pass band on the high-band side to the higher-band side can be obtained.

Furthermore, a radio frequency front-end circuit according to an aspect of the present disclosure includes the acoustic wave device described above, and an amplifier circuit connected to the acoustic wave device.

With this configuration, the radio frequency front-end circuit including the frequency variable type acoustic wave device in which the steepness and the low loss characteristic of the pass band are secured can be provided.

Furthermore, a communication device according to an aspect of the present disclosure includes an RF signal processing circuit that processes a radio frequency signal transmitted and received by an antenna element, and the radio frequency front-end circuit described above that transmits the radio frequency signal between the antenna element and the RF signal processing circuit.

With this configuration, the communication device including the frequency variable type acoustic wave device in which the steepness and the low loss characteristic of the pass band are secured can be provided.

According to the present disclosure, it is possible to provide a frequency variable type acoustic wave device in which the steepness and the low loss characteristic of a pass band are secured, a radio frequency front-end circuit, and a communication device.

BRIEF DESCRIPTION OF THE SEVERAL
VIEWS OF THE DRAWINGS

FIG. 1A is a circuit configuration diagram of a variable filter according to a first embodiment.
FIG. 1B is a graph showing a bandpass characteristic of the variable filter according to the first embodiment.
FIG. 2A is a planar configuration diagram of the variable filter according to the first embodiment (first working example).
FIG. 2B is a cross-sectional configuration diagram of a multilayer capacitance of the variable filter according to the first embodiment (first working example).
FIG. 2C is a cross-sectional configuration diagram of a comb-tooth capacitance of the variable filter according to the first embodiment (first working example).
FIG. 3A includes graphs showing a comparison of bandpass characteristics when variable filters according to the first working example and a first comparative example are switched on.
FIG. 3B includes graphs showing a comparison of bandpass characteristics when the variable filters according to the first working example and the first comparative example are switched off.
FIG. 4A is a graph showing frequency characteristics of a capacitance value of the comb-tooth type capacitance.
FIG. 4B is a graph showing frequency characteristics of a capacitance value of the multilayer type capacitance.
FIG. 5A is a graph showing frequency characteristics of a capacitance Q value of the comb-tooth type capacitance.
FIG. 5B is a graph showing frequency characteristics of a capacitance Q value of the multilayer type capacitance.
FIG. 6A is a circuit configuration diagram of a variable filter according to a second embodiment.
FIG. 6B is a graph showing a bandpass characteristic of the variable filter according to the second embodiment.
FIG. 7A is a planar configuration diagram of the variable filter according to the second embodiment (second working example).
FIG. 7B is a cross-sectional configuration diagram of a multilayer capacitance of the variable filter according to the second embodiment (second working example).
FIG. 7C is a cross-sectional configuration diagram of a comb-tooth capacitance of the variable filter according to the second embodiment (second working example).
FIG. 8A is a circuit configuration diagram of a variable filter according to a modification of the second embodiment.
FIG. 8B is a planar configuration diagram of the variable filter according to the modification of the second embodiment.
FIG. 9A is a planar configuration diagram of a variable filter according to a third embodiment (third working example).
FIG. 9B is a cross-sectional configuration diagram of a multilayer capacitance of the variable filter according to the third embodiment (third working example).
FIG. 9C is a cross-sectional configuration diagram of a comb-tooth capacitance of the variable filter according to the third embodiment (third working example).
FIG. 10A is a graph showing a comparison of capacitance values of the comb-tooth capacitances according to the third working example and a third comparative example.
FIG. 10B is a graph showing a comparison of capacitance Q values of the comb-tooth capacitances according to the third working example and the third comparative example.
FIG. 11A is a plan view illustrating an electrode structure of a variable filter according to a fourth embodiment.
FIG. 11B is a cross-sectional view taken along a line G-G' in FIG. 11A.
FIG. 11C is a cross-sectional view taken along a line H-H' in FIG. 11A.
FIG. 12A is a cross-sectional view of a structure of an electrode film and the periphery thereof in the fourth embodiment.

DETAILED DESCRIPTION OF THE DISCLOSURE

Figure 1A:
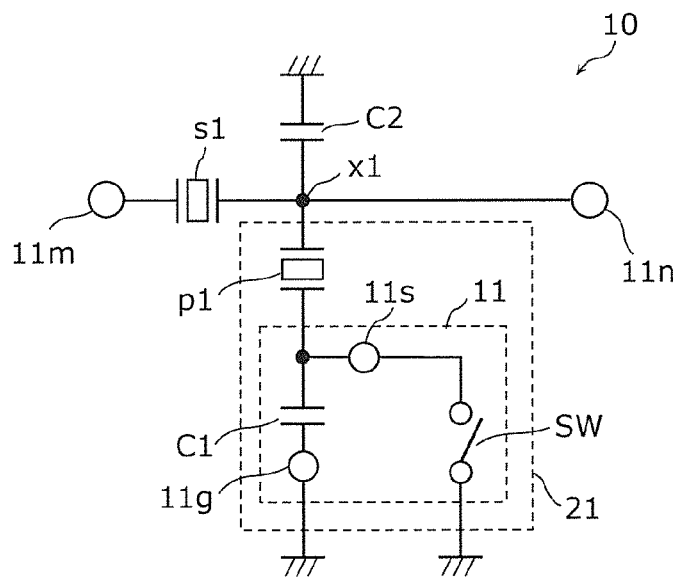

Hereinafter, embodiments of the present disclosure will be described in detail with reference to the working examples and the drawings. Note that all embodiments described below indicate comprehensive or specific examples. Numerical values, shapes, materials, constituent elements, arrangement and connection forms of the constituent elements, and the like, which will be described in the following embodiments, are examples, and are not intended to limit the present disclosure. Constituent elements which are not described in independent claims among the constituent elements in the following embodiments are described as arbitrary constituent elements. In addition, sizes or size ratios of the constituent elements illustrated in the drawings are not necessarily strict. In addition, in the drawings, configurations that are substantially identical are given identical reference numerals, redundant descriptions thereof will be omitted or simplified.

First Embodiment

[1.1 Circuit Configuration of Variable Filter 10]

FIG. 1A is a circuit configuration diagram of a variable filter 10 according to a first embodiment.

The variable filter 10 is, for example, a radio frequency filter circuit arranged at a front end portion of a multi-mode/multi-band capable cellular phone. The variable filter 10 is a band pass filter which is built in a multi-band capable cellular phone based on a communication standard such as LTE (Long Term Evolution), for example, and which allows a radio frequency signal of a predetermined band to pass therethrough and filters a radio frequency signal which interferes with the communication. The variable filter 10 is an acoustic wave device having a function of varying frequencies of a pass band and an attenuation band using an acoustic wave resonator and a switch element.

As illustrated in the diagram, the variable filter 10 includes a serial arm resonator s1, a parallel arm resonator p1, a frequency variable circuit 11, and a capacitance element C2.

The serial arm resonator s1 is connected between an input and output terminal 11m (first input and output terminal) and an input and output terminal 11n (second input and output terminal). In other words, the serial arm resonator s1 is a resonance circuit (second resonance circuit) provided in a serial arm connecting the input and output terminal 11m and the input and output terminal 11n. Note that it is sufficient that a serial arm resonance circuit including one or more acoustic wave resonators, which is not limited to the serial arm resonator s1, is provided in the serial arm. In the present embodiment, the serial arm resonance circuit is configured of one acoustic wave resonator, but may be configured of a plurality of acoustic wave resonators. The serial arm resonance circuit configured of the plurality of acoustic wave resonators includes, for example, a longitudinally coupled resonator formed of a plurality of acoustic wave resonators, or a plurality of divided resonators obtained by one acoustic wave resonator being subjected to serial division or the like. For example, by using the longitudinally coupled resonator as the serial arm resonance circuit, adaptation to a filter characteristic in which attenuation enhancement or the like is required can be achieved.

The parallel arm resonator p1 is a first acoustic wave resonator connected between a node (node x1 in FIG. 1A) on a path connecting the input and output terminal 11m and the input and output terminal 11n and a ground (reference terminal). In other words, the parallel arm resonator p1 is a resonator provided in a parallel arm connecting the node x1 on the serial arm and the ground.

This parallel arm resonator p1 has a resonant frequency on a lower-band side than a pass band of the variable filter 10, and has an anti-resonant frequency within the pass band. In the present embodiment, the resonant frequency of the parallel arm resonator p1 is lower than a resonant frequency of the serial arm resonator s1, and the anti-resonant frequency of the parallel arm resonator p1 is lower than an anti-resonant frequency of the serial arm resonator s1.

Here, a resonant frequency of a resonator is a frequency of a "resonance point" which is a singular point at which the impedance of the resonator becomes minimum (ideally, a point at which the impedance becomes 0). Additionally, an anti-resonant frequency of the resonator is a frequency of an "anti-resonance point" which is a singular point at which the impedance of the resonator becomes maximum (ideally, a point at which the impedance becomes infinity). Note that in the following descriptions, for the sake of convenience, not only for the resonator alone but also for a circuit configured of a plurality of resonators or impedance elements, the singular point at which the impedance becomes minimum (ideally, a point at which the impedance becomes 0) is referred to as the "resonance point", and a frequency thereof is referred to as a "resonant frequency". Additionally, the singular point at which the impedance becomes maximum (ideally, a point at which the impedance becomes infinity) is referred to as the "anti-resonance point", and a frequency thereof is referred to as an "anti-resonant frequency".

In addition, in the present embodiment, the parallel arm resonator p1 is configured of one acoustic wave resonator. However, the parallel arm resonator p1 may be configured of a plurality of divided resonators obtained by one acoustic wave resonator being subjected to serial division or the like.

The frequency variable circuit 11 includes a capacitance element C1 connected to the parallel arm resonator p1 and a switch SW.

The capacitance element C1 is connected between the node (node x1 in FIG. 1A) on the path connecting the input and output terminal 11m and the input and output terminal 11n and the ground (reference terminal), and configured of a comb-tooth capacitance electrode, which will be described later. The capacitance element C1 has a self-resonance point formed on a higher-band side than the pass band of the filter 10. Here, although a frequency of the self-resonance point depends on a structure of the comb-tooth electrode and the like, this will be described later. Note that the self-resonance point refers to a singular point (frequency) at which a Q value (capacitance Q) of the comb-tooth capacitance locally drops.

In the present embodiment, the parallel arm resonator p1 and the capacitance element C1 are connected in series to each other and connected between the node x1 and the ground. In the present embodiment, in the parallel arm resonator p1, one terminal is connected to the node x1, and the other terminal is connected to one terminal of the capacitance element C1. In the capacitance element C1, the one terminal is connected to the other terminal of the parallel arm resonator p1, and the other terminal is connected to a ground terminal 11g. Note that the connection order of the parallel arm resonator p1 and the capacitance element C1 is not limited to this, and may be reversed from the connection order described above.

In the present embodiment, the switch SW is connected in parallel to the capacitance element C1, and is a switch element in which one terminal is connected to a connection terminal 11s on a connection node between the parallel arm resonator p1 and the capacitance element C1 and the other terminal is connected to the ground. With the connection configuration described above, the switch SW is turned on (conduction) or off (non-conduction) in accordance with a control signal from a control unit such as an RF signal processing circuit (RFIC: Radio Frequency Integrated Circuit) or the like, for example. The frequency variable circuit 11 including the switch SW varies a frequency of the first acoustic wave resonator to which the frequency variable circuit 11 is connected (in the present embodiment, the resonant frequency of the parallel arm resonator p1).

For example, in order to achieve miniaturization, the switch SW is configured of an FET (Field Effect Transistor) switch made of GaAs or CMOS (Complementary Metal Oxide Semiconductor) or a diode switch.

In other words, in the present embodiment, the frequency variable circuit 11 is connected in series to the first acoustic wave resonator (in the present embodiment, the parallel arm resonator p1) between the node x1 and the ground. By providing the frequency variable circuit 11 as described above, the variable filter 10 can be obtained as a tunable (frequency variable type) filter which can switch the pass band according to the on or off state of the switch SW.

The parallel arm resonator p1, the capacitance element C1, and the switch SW configure a parallel arm resonance circuit 21 (first resonance circuit) provided in a second path (parallel arm) connecting the node x1 on a first path (on the serial arm) to the ground, the first path connecting the input and output terminal 11m to the input and output terminal 11n. That is, the parallel arm resonance circuit 21 is provided in one parallel arm connecting the serial arm and the ground. Accordingly, the variable filter 10 has a one-stage ladder filter structure configured of the serial arm resonator s1 (second resonance circuit) and the parallel arm resonance circuit (first resonance circuit).

In other words, the parallel arm resonance circuit 21 (first resonance circuit) provided in the second path forms the pass band of the variable filter 10 together with the serial arm resonator s1 (second resonance circuit) provided in the first path.

With the above-described configuration, in the variable filter 10, when the switch SW of the frequency variable circuit 11 is off, an attenuation pole of the pass band on a low-band side shifts to the higher-frequency side than when the switch is on. Thus, the variable filter 10 configures a frequency variable type filter in which the low-band end of the pass band is variable. However, only by the shift of the attenuation pole by the frequency variable circuit 11, there are risks that the steepness of the pass band on the low-band side is changed and the insertion loss of the pass band on the low-band end is deteriorated.

In response to this, the variable filter 10 further includes the capacitance element C2 connected between the node x1 and the ground. The capacitance element C2 is connected in parallel to the parallel arm resonator p1 and the frequency variable circuit 11, and shifts an anti-resonant frequency at which each impedance of synthesis circuits with the parallel arm resonator p1 and with the parallel arm resonator p1 and the capacitance element C1 becomes maximum to a lower-frequency side. This anti-resonant frequency is present on a higher-frequency side than the resonant frequency of the parallel arm resonator p1, and forms the pass band of the variable filter 10. In other words, the capacitance element C2 has a function of narrowing a frequency difference between a resonance point and an anti-resonance point of the parallel arm resonance circuit 21 (first resonance circuit), and improves the steepness of the pass band on the low-band side when the switch SW is on. Note that when the switch SW is off, since a frequency variable amount, that is, the frequency difference between the resonance point and the anti-resonance point of the first resonance circuit is defined by a constant of an impedance element (capacitance element C1) of the frequency variable circuit 11, the steepness of the pass band on the low-band side is not affected.

[1.2 Bandpass Characteristic of Variable Filter 10]

Next, a filter bandpass characteristic of the variable filter 10 according to the present embodiment will be described.

Figure 1B:
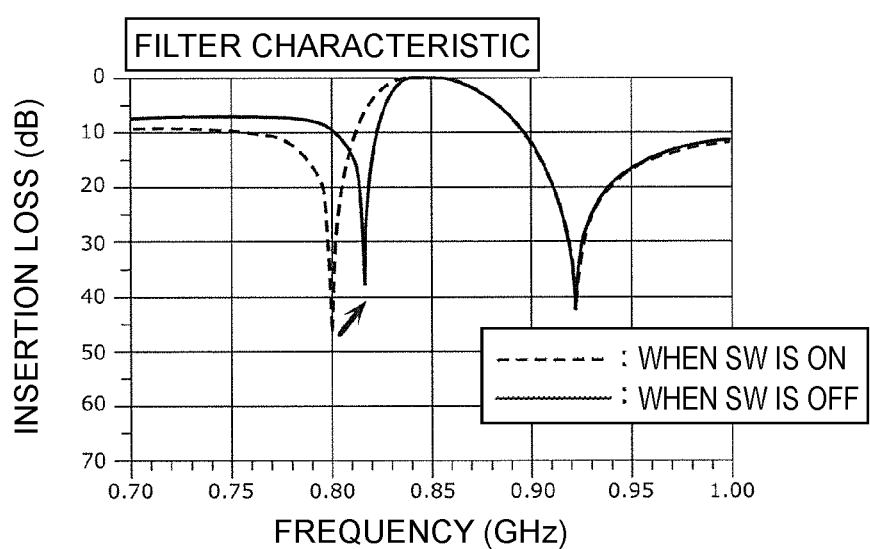

FIG. 1B is a graph showing the bandpass characteristic of the variable filter 10 according to the first embodiment. Specifically, the figure is a graph showing a comparison of the bandpass characteristics when the switch SW is on/off. This graph shows a filter characteristic when the switch SW is on by a broken line, and shows a filter characteristic when the switch SW is off by a solid line. Note that the same applies to the subsequent graphs of the present embodiment showing the filter characteristics.

In the variable filter 10, the anti-resonant frequency of the parallel arm resonance circuit 21 and the resonant frequency of the serial arm resonance circuit (in the present embodiment, the serial arm resonator s1) are brought close to each other to form the pass band.

At this time, in the present embodiment, only when the switch SW is off, the capacitance element C1 is added to the parallel arm resonator p1. Therefore, the resonant frequency of the parallel arm resonance circuit 21 shifts to the higher-band side than the resonant frequency of the parallel arm resonator p1 alone, when the switch SW is off. Here, the attenuation pole of the pass band on the low-band side of the variable filter 10 is defined by the resonant frequency of the parallel arm resonance circuit 21. Therefore, as shown in the graph, the variable filter 10 can shift the attenuation pole of the pass band on the low-band side to the higher-band side by switching the switch SW from on to off. In other words, the variable filter 10 can switch the pass band according to the on/off state of the switch SW. However, only by the shift of the attenuation pole by the frequency variable circuit 11, there are risks that the steepness of the pass band on the low-band side is changed and the insertion loss of the pass band on the low-band end is deteriorated.

On the other hand, as described above, the capacitance element C2 functions as the synthesis circuit with the parallel arm resonance circuit 21, has a function of narrowing the frequency difference between the resonance point and the anti-resonance point of the parallel arm resonance circuit 21 (first resonance circuit), and improves the steepness of the pass band on the low-band side when the switch SW is on.

From the above-described viewpoint, a frequency variable width of the pass band of the variable filter 10 depends on the constant of the capacitance element C1, for example, as the constant of the capacitance element C1 decreases, the frequency variable width widens, and as the constant of the capacitance element C1 increases, the frequency variable width narrows. Therefore, since a capacitance value of the capacitance element C1 needs to be compliant with a frequency specification required for the variable filter 10, a structure capable of taking a large capacitance value is required. On the other hand, the capacitance element C1 is an element for varying the resonant frequency configuring the attenuation pole of the variable filter 10 and does not affect the insertion loss of the pass band, so that a large capacitance Q value is not required.

In contrast, the capacitance element C2 shifts the anti-resonant frequency of the parallel arm resonator p1 to the lower-band side. Here, since the anti-resonant frequency of the parallel arm resonator p1 is a frequency for defining the pass band of the variable filter 10, when the anti-resonant frequency is shifted to the lower-band side by the capacitance element C2, it is necessary to maintain a Q value of the anti-resonance point. In other words, it is preferable that the capacitance Q value of the capacitance element C2 be large.

According to the characteristics required for the capacitance elements C1 and C2 described above, the capacitance element C1 has the larger capacitance value than that of the capacitance element C2, and the capacitance element C2 has the larger capacitance Q value than that of the capacitance element C1.

[1.3 Electrode Configuration of Variable Filter 10]

Figure 2A:
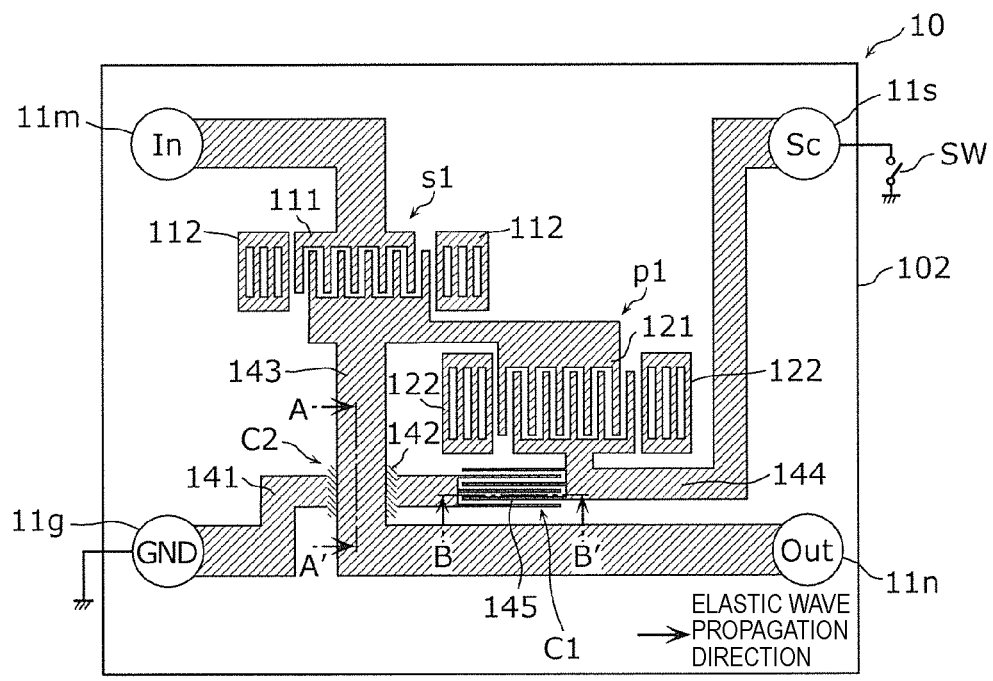
Figure 2B:
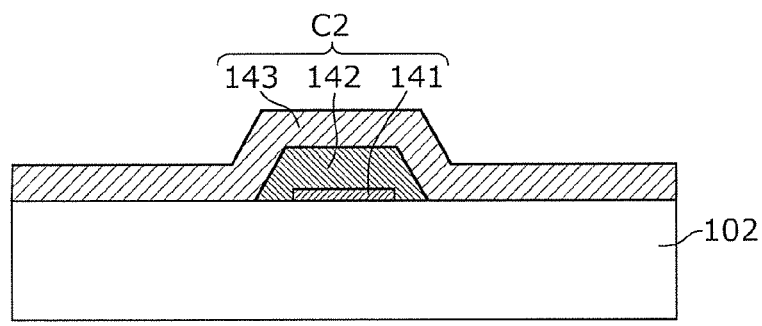
Figure 2C:
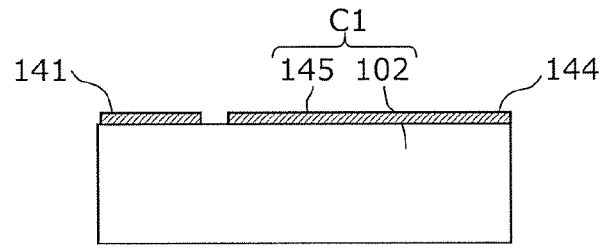

FIG. 2A is a planar configuration diagram of the variable filter 10 according to the first embodiment (first working example). Furthermore, FIG. 2B is a cross-sectional configuration diagram of the capacitance element C2 of the variable filter 10 according to the first embodiment (first working example). Furthermore, FIG. 2C is a cross-sectional configuration diagram of the capacitance element C1 of the variable filter 10 according to the first embodiment (first working example). More specifically, FIG. 2A illustrates a layout of electrodes configuring the serial arm resonator s1, the parallel arm resonator p1, and the capacitance elements C1 and C2 on a substrate 102, FIG. 2B is a cross-sectional view taken along a line A-A' in FIG. 2A, and FIG. 2C is a cross-sectional view taken along a line B-B' in FIG. 2A.

As illustrated in FIG. 2A, in an outer peripheral portion on a surface of the substrate 102, there are formed an input electrode In corresponding to the input and output terminal 11m, an output electrode Out corresponding to the input and output terminal 11n, a ground electrode GND corresponding to the ground terminal 11g, and a switch connection electrode Sc corresponding to the connection terminal 11s of the switch SW. Additionally, on the surface of the substrate 102 and in a region surrounded by the input electrode In, the output electrode Out, and the ground electrode GND, an IDT electrode 111 and reflectors 112 configuring the serial arm resonator s1, and an IDT electrode 121 and reflectors 122 configuring the parallel arm resonator p1 are formed. Furthermore, as illustrated in FIG. 2A to FIG. 2C, the capacitance elements C1 and C2 are formed on the surface of the substrate 102. Additionally, on the surface of the substrate 102, respective wirings for connecting the input electrode In, the output electrode Out, the ground electrode GND, the switch connection electrode Sc, the IDT electrode 111, the IDT electrode 121, and the capacitance elements C1 and C2 are formed.

The substrate 102 is a substrate having piezoelectricity at least on the surface thereof. For example, the substrate may include a piezoelectric thin film on the surface thereof, and may be configured of a multilayer body of a film having a different acoustic velocity from that of the piezoelectric thin film, a support substrate, and the like. In addition, the substrate 102 may have piezoelectricity on the entire substrate. In this case, the substrate 102 is a piezoelectric substrate formed of a single piezoelectric body layer.

The IDT electrode 111 and the reflectors 112 are formed of a plurality of electrode fingers and are formed on the substrate 102. The IDT electrode 111 and the reflectors 112 configure the serial arm resonator s1 together with the substrate 102. In addition, the IDT electrode 121 (first IDT electrode) and the reflectors 122 are formed of a plurality of electrode fingers and are formed on the substrate 102. The IDT electrode 121 and the reflectors 122 configure the parallel arm resonator p1 together with the substrate 102. Here, an extending direction of the electrode fingers of the IDT electrode 111 and an extending direction of the electrode fingers of the IDT electrode 121 substantially coincide with each other, and the extending direction is a direction perpendicular to the propagation direction of the substrate 102. With this configuration, the serial arm resonator s1 and the parallel arm resonator p1 excite an acoustic wave in the same propagation direction.

A comb-tooth capacitance electrode 145 includes a plurality of electrode fingers, and is formed on the substrate 102. Here, an extending direction of the electrode fingers of the comb-tooth capacitance electrode 145 and the extending direction of the electrode fingers of the IDT electrodes 111 and 121 intersect with each other. The comb-tooth capacitance electrode 145 configures, together with the substrate 102, the capacitance element C1 (capacitor) which is a comb-tooth capacitance. Additionally, as illustrated in FIG. 2A, one electrode of two electrodes configuring the comb-tooth capacitance electrode 145 is connected to a wiring 144, and the other electrode of the two electrodes configuring the comb-tooth capacitance electrode 145 is connected to a wiring 141 connected to the ground electrode GND.

As described above, as compared with the capacitance element C2, the capacitance element C1 does not require the large capacitance Q value, but requires the relatively large capacitance value. Accordingly, when the capacitance element C1 is formed on the substrate 102 on which the IDT electrode 121 and the capacitance element C2 are formed, the comb-tooth capacitance electrode 145 is configured on the substrate 102. Since the comb-tooth capacitance electrode 145 has a configuration in which unit capacitances each configured of adjacent electrode fingers and the substrate having a high relative dielectric constant are in cascading connection, the large capacitance value can be secured. Thus, it is possible to obtain the desired frequency variable amount based on the required specification.

As illustrated in FIG. 2A, the one electrode of the comb-tooth capacitance electrode 145 is connected to the wiring 144, and the other electrode of the comb-tooth capacitance electrode 145 is connected to the wiring 141.

The wiring 144 is one of one or more first IDT wirings connected to the IDT electrode 121 (parallel arm resonator p1). Furthermore, the wiring 144 is one of one or more first capacitance wirings connected to the comb-tooth capacitance electrode 145 (capacitance element C1). The wiring 144 is a third wiring, which is connected to the comb-tooth capacitance electrode 145 and the switch connection electrode Sc (switch SW), of the first capacitance wirings.

Furthermore, the wiring 141 is one of the one or more first capacitance wirings connected to the comb-tooth capacitance electrode 145 (capacitance element C1). The wiring 141 is a first wiring, which is connected to the comb-tooth capacitance electrode 145 and the ground electrode GND, of the one or more first capacitance wirings.

A wiring 143 is one of the one or more first IDT wirings connected to the IDT electrode 121 (parallel arm resonator p1). The wiring 143 is a second wiring, which is connected to the IDT electrode 111 (serial arm resonator s1, second resonance circuit), of the one or more first IDT wirings. In addition, the wiring 143 connects the IDT electrode 111, the IDT electrode 121, and the output electrode Out.

The capacitance element C2 is a multilayer type capacitor formed in an intersection region of the wiring 141 and the wiring 143 and using the wiring 141 and the wiring 143 in the intersection region as opposite electrodes.

In addition, at a location where the wiring 141 and the wiring 143 intersect with and are opposed to each other, an intermediate layer 142 is formed between the wiring 141 and the wiring 143. The intermediate layer 142 is a first intermediate layer made of an insulator or a dielectric, and is made of, for example, at least one of silicon oxide, alumina, silicon nitride, and polyimide. With this configuration, since the material of the intermediate layer 142 can be selected from the above materials, the degree of freedom in adjusting the capacitance value of the capacitance element C2 is improved.

According to the above electrode configuration, the capacitance element C2 has a configuration in which the wiring 141 and the wiring 143 in the intersection region are used as the opposite electrodes. Here, as a film thickness of the electrode configuring the capacitance element is increased, a resistance component of the capacitance element can be reduced, so that the capacitance Q value can be increased. From this viewpoint, even when the IDT electrode 121 and the various wirings are formed on the same substrate, without being limited by a film thickness of the IDT electrode 121 defined by propagation characteristics of the acoustic wave, the film thickness and the electrode area of each of the opposite electrodes configuring the capacitance element C2 can be adjusted. With this configuration, the parallel plate type capacitance element C2 can have the larger capacitance Q value than that of the comb-tooth capacitance type capacitance element C1. Accordingly, since the steepness and the low loss characteristic of the pass band on the low-band side are particularly secured, the bandpass characteristic of the acoustic wave device is improved.

Note that as illustrated in FIG. 2B, it is preferable that a film thickness of the wiring 143 be larger than a film thickness of the wiring 141. In other words, in the opposite electrodes configuring the capacitance element C2, the film thickness of the wiring 143, which is not connected to the capacitance element C1, of the wirings connected to the IDT electrode 121 is preferably larger than the film thickness of the wiring 141 that is connected to the capacitance element C1.

Since the capacitance element C1 does not require the large capacitance Q value, it is not necessary to increase a film thickness of the comb-tooth capacitance electrode 145. On the other hand, the capacitance element C1 requires a large capacitance value in some cases, processing accuracy such as making a large number of cascades and making narrow pitches of the electrode is required, and therefore the film thickness of the comb-tooth capacitance electrode 145 is preferably small.

On the other hand, since the capacitance element C2 requires the large capacitance Q value, it is preferable to increase the film thickness of the electrode configuring the capacitance element C2.

From the above-described viewpoint, in a case where the IDT electrode 121 and the capacitance elements C1 and C2 are formed on the same substrate 102, without increasing the film thickness of the wiring 141 connected to the capacitance element C1, by increasing the film thickness of the wiring 143 that configures the capacitance element C2, without impairing frequency characteristics of the capacitance value of the capacitance element C1, it is possible to increase the capacitance Q value of the capacitance element C2.

In addition, the film thickness of any one of the wirings 141 and 143 in the intersection region may be larger than the film thickness of the comb-tooth capacitance electrode 145. In other words, the film thickness of one of the first capacitance wiring in the intersection region and the first IDT wiring in the intersection region may be larger than the film thickness of the comb-tooth capacitance electrode 145.

In other words, without increasing the film thickness of the comb-tooth capacitance electrode 145, by increasing the film thickness of any one of the two wirings that configures the capacitance element C2, without impairing the frequency characteristics of the capacitance value of the capacitance element C1, it is possible to increase the capacitance Q value of the capacitance element C2.

[1.4 Comparison of Bandpass Characteristic of Variable Filter]

Figure 3A:
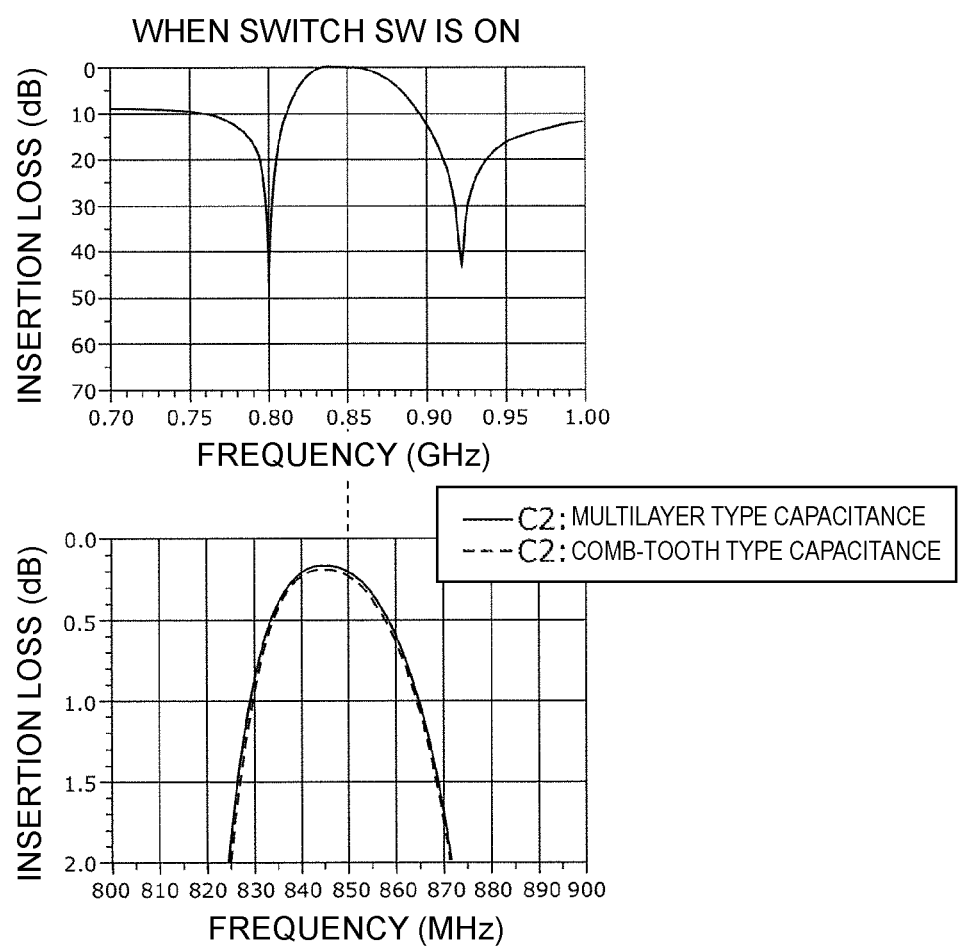

FIG. 3A includes graphs showing a comparison of bandpass characteristics when the variable filters according to the first working example and a first comparative example are switched on. Furthermore, FIG. 3B includes graphs showing a comparison of bandpass characteristics when the variable filters according to the working example and the comparative example are switched off.

The graphs show the bandpass characteristic of the variable filter 10 according to the first embodiment (first working example) and the bandpass characteristic of the variable filter according to the comparative example (first comparative example). The variable filter 10 according to the first working example includes the multilayer type capacitor in which the capacitance element C2 is formed by intersection of the wirings 141 and 143. On the other hand, the variable filter according to the comparative example includes a capacitor in which the capacitance element C2 is formed by a comb-tooth capacitance electrode.

Figure 3B:
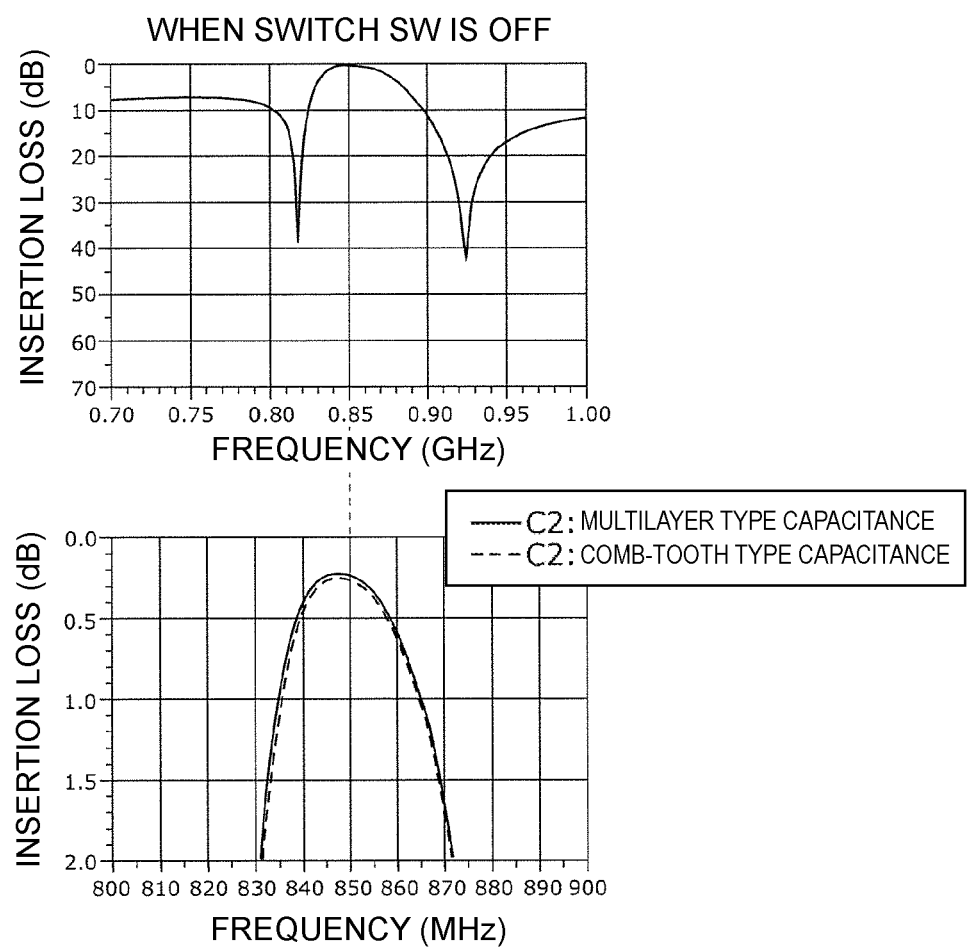

In both FIG. 3A and FIG. 3B, it can be seen that the variable filter 10 according to the first working example has a lower loss in the pass band than the variable filter according to the first comparative example.

Figure 4A:
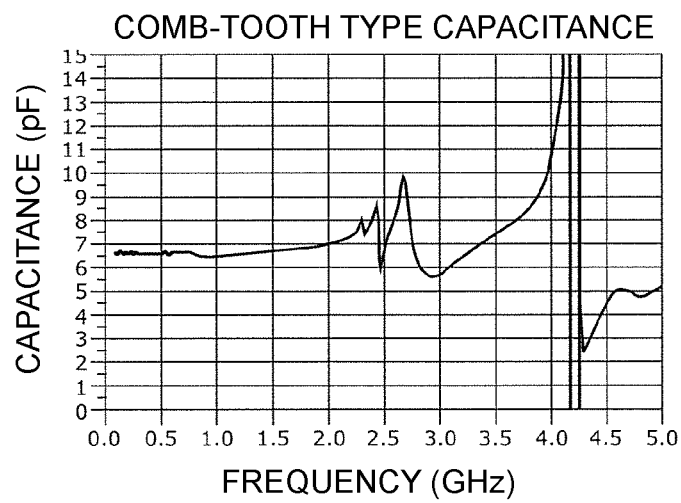
Figure 4B:
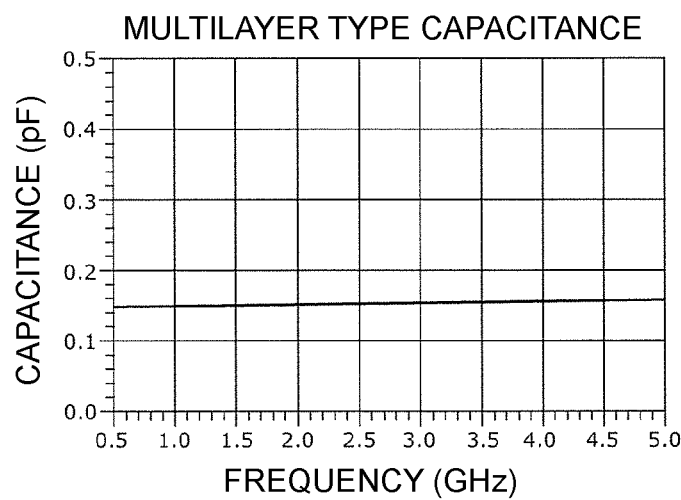

FIG. 4A is a graph showing frequency characteristics of the capacitance value of the comb-tooth type capacitance. FIG. 4B is a graph showing frequency characteristics of the capacitance value of the multilayer type capacitance. Comparing FIG. 4A and FIG. 4B, it can be seen that, although frequency dependence of the capacitance value is strong in the comb-tooth type capacitance, the comb-tooth type capacitance has a larger capacitance value than that of the multilayer type capacitance. This is because the comb-tooth type capacitance has the configuration in which the unit capacitances each configured of the adjacent electrode fingers and the substrate having the high relative dielectric constant are in cascading connection, and therefore the large capacitance value can be secured.

Figure 5A:
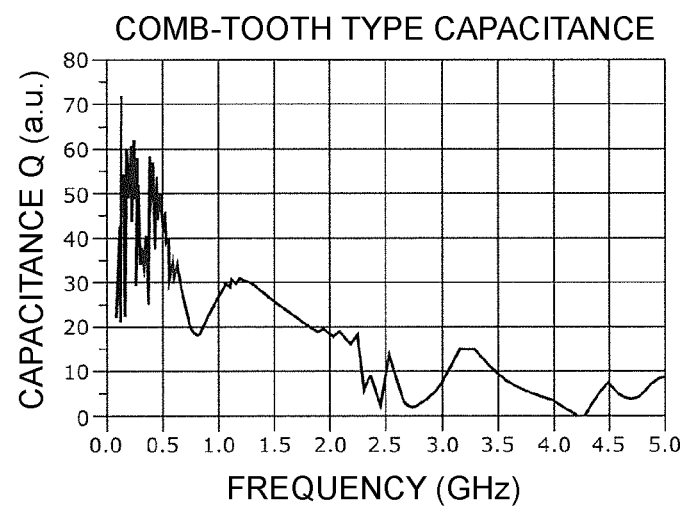
Figure 5B:
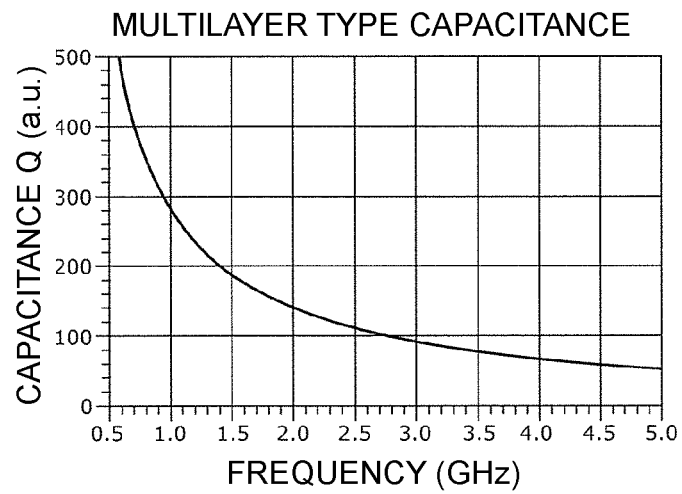

FIG. 5A is a graph showing frequency characteristics of the capacitance Q value of the comb-tooth type capacitance. Furthermore, FIG. 5B is a graph showing frequency characteristics of the capacitance Q value of the multilayer type capacitance. Comparing FIG. 5A and FIG. 5B, it can be seen that the multilayer type capacitance has a larger capacitance Q value than that of the comb-tooth type capacitance. This is because, in the multilayer type capacitance, the film thickness and the electrode area of the opposite electrode can be increased and the resistance component can be reduced, and therefore a large capacitance Q value can be secured.

As described above, the capacitance element C1 can secure the larger capacitance value than that of the capacitance element C2, and the capacitance element C2 can secure the larger capacitance Q value than that of the capacitance element C1. Accordingly, with the variable filter 10 according to the present embodiment, it is possible to cope with the required frequency variable amount and to secure the steepness and the low loss characteristic of the pass band.

Second Embodiment

In the present embodiment, a variable filter in which a connection form of the capacitance element C2 is different from that in the variable filter 10 according to the first embodiment will be described.

[2.1 Circuit Configuration of Variable Filter 10A]

Figure 6A:
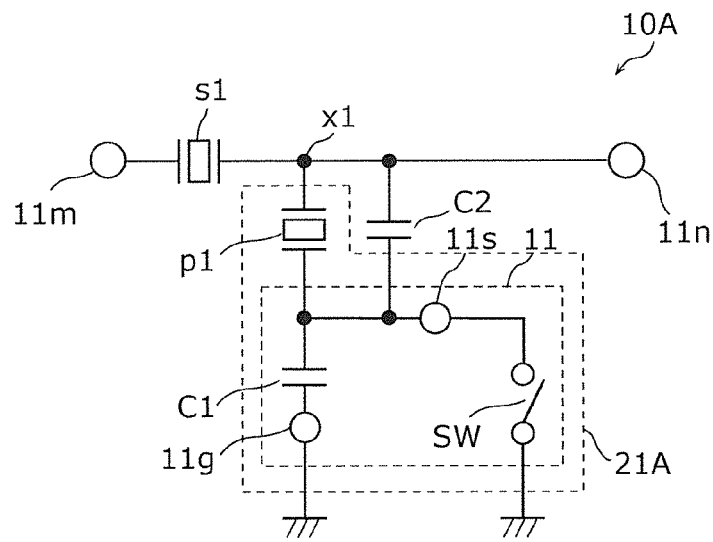

FIG. 6A is a circuit configuration diagram of a variable filter 10A according to a second embodiment.

As illustrated in the diagram, the variable filter 10A includes the serial arm resonator s1, the parallel arm resonator p1, the frequency variable circuit 11, and the capacitance element C2. The variable filter 10A according to the present embodiment is different from the variable filter 10 according to the first embodiment in the connection form of the capacitance element C2 as a configuration.

Hereinafter, the descriptions of the same points as those of the variable filter 10 according to the first embodiment will be omitted, and different points will be mainly described.

The parallel arm resonator p1, the capacitance element C1, and the switch SW configure a parallel arm resonance circuit 21A (first resonance circuit) provided in the second path (parallel arm) connecting the node x1 on the first path (on the serial arm) to the ground, the first path connecting the input and output terminal 11m to the input and output terminal 11n. That is, the parallel arm resonance circuit 21A is provided in one parallel arm connecting the serial arm and the ground. Accordingly, the variable filter 10A has the one-stage ladder filter structure configured of the serial arm resonator s1 (second resonance circuit) and the parallel arm resonance circuit 21A (first resonance circuit).

In other words, the parallel arm resonance circuit 21A (first resonance circuit) provided in the second path forms a pass band of the variable filter 10A together with the serial arm resonator s1 (second resonance circuit) provided in the first path.

The variable filter 10A further includes the capacitance element C2 connected between the node x1 and the frequency variable circuit 11. The capacitance element C2 and the parallel arm resonator p1 are connected in parallel to each other between the node x1 and the connection terminal 11s. With this configuration, the capacitance element C2 shifts an anti-resonant frequency at which each impedance of synthesis circuits with the parallel arm resonator p1 and with the parallel arm resonator p1 and the capacitance element C1 becomes maximum to a lower-frequency side. This anti-resonant frequency is present on a higher-frequency side than the resonant frequency of the parallel arm resonator p1, and forms the pass band of the variable filter 10A. In other words, the capacitance element C2 has a function of narrowing a frequency difference between a resonance point and an anti-resonance point of the parallel arm resonance circuit 21A (first resonance circuit), and improves the steepness of the pass band on the low-band side when the switch SW is on. Note that when the switch SW is off, since the frequency variable amount, that is, the frequency difference between the resonance point and the anti-resonance point of the first resonance circuit is defined by the constant of the impedance element (capacitance element C1) of the frequency variable circuit 11, the steepness of the pass band on the low-band side is not affected.

[2.2 Bandpass Characteristic of Variable Filter 10A]

Figure 6B:
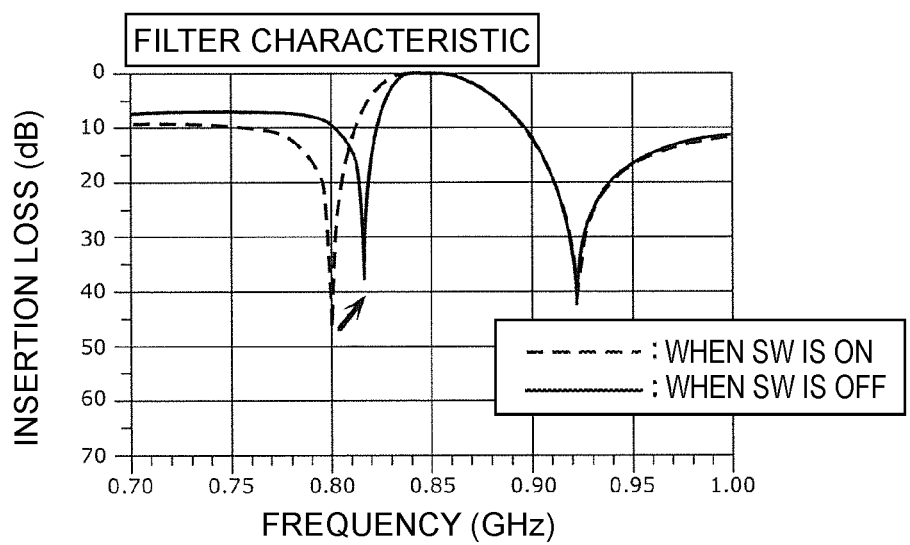

FIG. 6B is a graph showing a bandpass characteristic of the variable filter 10A according to the second embodiment. Specifically, the figure is a graph showing a comparison of the bandpass characteristics when the switch SW is on/off. Since the bandpass characteristic of the variable filter 10A shown in the graph is substantially the same as the bandpass characteristic of the variable filter 10 according to the first embodiment, the descriptions thereof will be omitted.

A frequency variable width of the pass band of the variable filter 10A depends on the constant of the capacitance element C1, for example, as the constant of the capacitance element C1 decreases, the frequency variable width widens. Therefore, since the capacitance value of the capacitance element C1 needs to be compliant with the frequency specification required for the variable filter 10A, a structure capable of taking a large capacitance value is required. On the other hand, the capacitance element C1 is an element for varying the resonant frequency configuring the attenuation pole of the variable filter 10A and does not affect the insertion loss of the pass band, so that a large capacitance Q value is not required.

In contrast, the capacitance element C2 shifts the anti-resonant frequency of the parallel arm resonator p1 to the lower-band side. Here, since the anti-resonant frequency of the parallel arm resonator p1 is a frequency for defining the pass band of the variable filter 10A, when the anti-resonant frequency is shifted to the lower-band side by the capacitance element C2, it is necessary to maintain the Q value of the anti-resonance point. In other words, it is preferable that the capacitance Q value of the capacitance element C2 be large.

According to the characteristics required for the capacitance elements C1 and C2 described above, the capacitance element C1 has the larger capacitance value than that of the capacitance element C2, and the capacitance element C2 has the larger capacitance Q value than that of the capacitance element C1.

[2.3 Electrode Configuration of Variable Filter 10A]

Figure 7A:
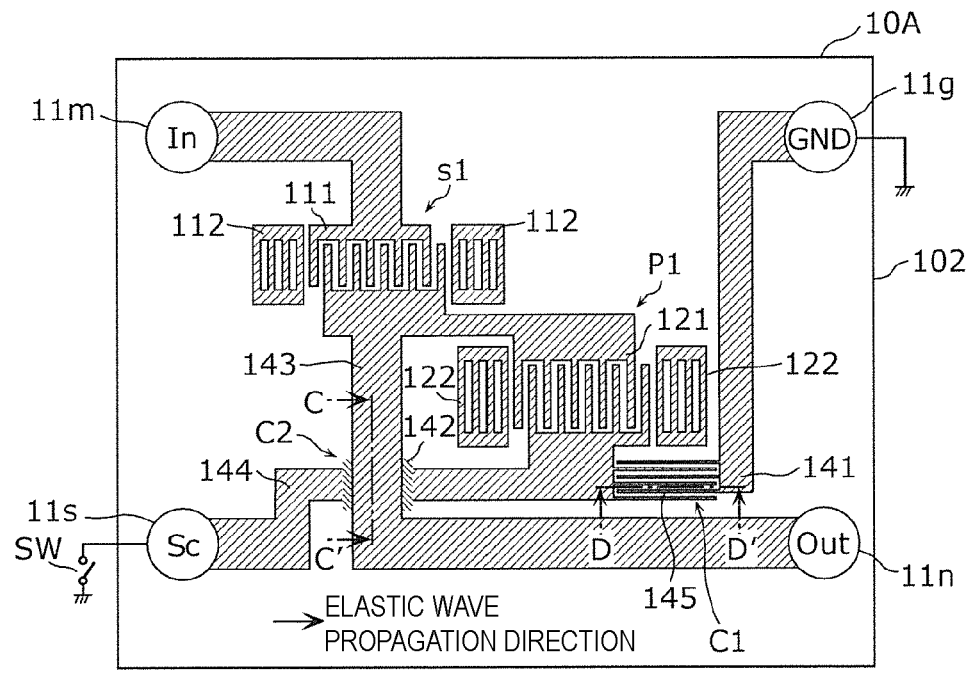
Figure 7B:
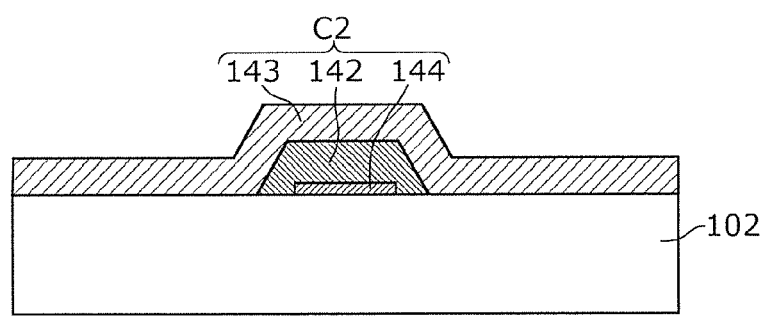
Figure 7C:
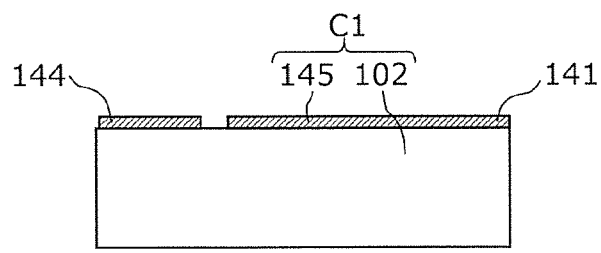

FIG. 7A is a planar configuration diagram of the variable filter 10A according to the second embodiment (second working example). Furthermore, FIG. 7B is a cross-sectional configuration diagram of the capacitance element C2 of the variable filter 10A according to the second embodiment (second working example). Furthermore, FIG. 7C is a cross-sectional configuration diagram of the capacitance element C1 of the variable filter 10A according to the second embodiment (second working example). More specifically, FIG. 7A illustrates a layout of electrodes configuring the serial arm resonator s1, the parallel arm resonator p1, and the capacitance elements C1 and C2 on the substrate 102, FIG. 7B is a cross-sectional view taken along a line C-C' in FIG. 7A, and FIG. 7C is a cross-sectional view taken along a line D-D' in FIG. 7A.

As illustrated in FIG. 7A, in the outer peripheral portion on the surface of the substrate 102, there are formed the input electrode In corresponding to the input and output terminal 11m, the output electrode Out corresponding to the input and output terminal 11n, the ground electrode GND corresponding to the ground terminal 11g, and the switch connection electrode Sc corresponding to the connection terminal 11s of the switch SW. Additionally, on the surface of the substrate 102 and in the region surrounded by the input electrode In, the output electrode Out, and the ground electrode GND, the IDT electrode 111 and the reflectors 112 configuring the serial arm resonator s1, and the IDT electrode 121 and the reflectors 122 configuring the parallel arm resonator p1 are formed. Furthermore, as illustrated in FIG. 7A to FIG. 7C, the capacitance elements C1 and C2 are formed on the surface of the substrate 102. Additionally, on the surface of the substrate 102, respective wirings for connecting the input electrode In, the output electrode Out, the ground electrode GND, the switch connection electrode Sc, the IDT electrode 111, the IDT electrode 121, and the capacitance elements C1 and C2 are formed.

Note that in a terminal array of the variable filter 10A illustrated in FIG. 7A (an array of the input electrode In, the output electrode Out, the ground electrode GND, and the switch connection electrode SC), the positions of the ground electrode GND and the switch connection electrode Sc are interchanged as compared with a terminal array of the variable filter 10 illustrated in FIG. 2A. In other words, it is possible to select the terminal arrangement of the variable filter 10 or the variable filter 10A according to a specification of the arrangement of external terminals.

The comb-tooth capacitance electrode 145 includes a plurality of electrode fingers, and is formed on the substrate 102. Here, the extending direction of the electrode fingers of the comb-tooth capacitance electrode 145 and the extending direction of the electrode fingers of the IDT electrodes 111 and 121 intersect with each other. The comb-tooth capacitance electrode 145 configures, together with the substrate 102, the capacitance element C1 (capacitor) which is the comb-tooth capacitance.

As compared with the capacitance element C2, the capacitance element C1 does not require the large capacitance Q value, but requires the relatively large capacitance value. Accordingly, when the capacitance element C1 is formed on the substrate 102 on which the IDT electrode 121 and the capacitance element C2 are formed, the comb-tooth capacitance electrode 145 having the same electrode finger configuration as that of the IDT electrode 121 is configured on the substrate 102. Since the comb-tooth capacitance electrode 145 has the configuration in which the unit capacitances each configured of the adjacent electrode fingers and the substrate having the high relative dielectric constant are in cascading connection, the large capacitance value can be secured. Thus, it is possible to obtain the desired frequency variable amount based on the required specification.

As illustrated in FIG. 7A, the one electrode of the comb-tooth capacitance electrode 145 is connected to the wiring 144, and the other electrode of the comb-tooth capacitance electrode 145 is connected to the wiring 141.

The wiring 144 is one of the one or more first IDT wirings connected to the IDT electrode 121 (parallel arm resonator p1). Furthermore, the wiring 144 is one of the one or more first capacitance wirings connected to the comb-tooth capacitance electrode 145 (capacitance element C1). The wiring 144 is the third wiring, which is connected to the comb-tooth capacitance electrode 145 and the switch connection electrode Sc (switch SW), of the one or more first capacitance wirings.

Furthermore, the wiring 141 is one of the one or more first capacitance wirings connected to the comb-tooth capacitance electrode 145 (capacitance element C1). The wiring 141 is the first wiring, which is connected to the comb-tooth capacitance electrode 145 and the ground electrode GND, of the one or more first capacitance wirings.

The wiring 143 is one of the one or more first IDT wirings connected to the IDT electrode 121 (parallel arm resonator p1). The wiring 143 is the second wiring, which is connected to the IDT electrode 111 (serial arm resonator s1, second resonance circuit), of the one or more first IDT wirings. In addition, the wiring 143 connects the IDT electrode 111, the IDT electrode 121, and the output electrode Out.

The capacitance element C2 is the multilayer type capacitor formed in the intersection region of the wiring 144 and the wiring 143 and using the wiring 144 and the wiring 143 in the intersection region as the opposite electrodes. The wiring 143 is a wiring, which is not connected to the capacitance element C1, of the one or more first IDT wirings connected to the IDT electrode 121. The wiring 144 is the first capacitance wiring which connects the capacitance element C1 and the switch connection electrode Sc.

In addition, at a location where the wiring 144 and the wiring 143 intersect with and are opposed to each other, the intermediate layer 142 is formed between the wiring 144 and the wiring 143. The intermediate layer 142 is the first intermediate layer made of an insulator or a dielectric, and is made of, for example, at least one of silicon oxide, alumina, silicon nitride, and polyimide. With this configuration, since the material of the intermediate layer 142 can be selected from the above materials, the degree of freedom in adjusting the capacitance value of the capacitance element C2 is improved.

According to the above electrode configuration, the capacitance element C2 has the configuration in which the wiring 144 and the wiring 143 in the intersection region are used as the opposite electrodes. Here, as the film thickness of the electrode configuring the capacitance element is increased, the resistance component of the capacitance element can be reduced, so that the capacitance Q value can be increased. From this viewpoint, even when the IDT electrode 121 and the various wirings are formed on the same substrate, without being limited by the film thickness of the IDT electrode 121 defined by the propagation characteristics of the acoustic wave, the film thickness and the electrode area of each of the opposite electrodes configuring the capacitance element C2 can be adjusted. With this configuration, the parallel plate type capacitance element C2 can have the larger capacitance Q value than that of the comb-tooth capacitance type capacitance element C1. Accordingly, since the steepness and the low loss characteristic of the pass band on the low-band side are particularly secured, the bandpass characteristic of the acoustic wave device is improved.

Note that as illustrated in FIG. 7B, it is preferable that the film thickness of the wiring 143 be larger than the film thickness of the wiring 144. In other words, in the opposite electrodes configuring the capacitance element C2, the film thickness of the wiring 143, which is not connected to the capacitance element C1, of the wirings connected to the IDT electrode 121 is preferably larger than the film thickness of the wiring 144 that is connected to the capacitance element C1.

Since the capacitance element C1 does not require the large capacitance Q value, it is not necessary to increase the film thickness of the comb-tooth capacitance electrode 145. On the other hand, the capacitance element C1 requires a large capacitance value in some cases, processing accuracy such as making a large number of cascades and making narrow pitches of the electrode is required, and therefore the film thickness of the comb-tooth capacitance electrode 145 is preferably small.

On the other hand, since the capacitance element C2 requires the large capacitance Q value, it is preferable to increase the film thickness of the electrode configuring the capacitance element C2.

From the above-described viewpoint, in a case where the IDT electrode 121 and the capacitance elements C1 and C2 are formed on the same substrate 102, without increasing the film thickness of the wiring 144 connected to the capacitance element C1, by increasing the film thickness of the wiring 143 that configures the capacitance element C2, without impairing the frequency characteristics of the capacitance value of the capacitance element C1, it is possible to increase the capacitance Q value of the capacitance element C2.

In addition, the film thickness of any one of the wirings 144 and 143 in the intersection region may be larger than the film thickness of the comb-tooth capacitance electrode 145. In other words, the film thickness of one of the first capacitance wiring in the intersection region and the first IDT wiring in the intersection region may be larger than the film thickness of the comb-tooth capacitance electrode 145.

In other words, without increasing the film thickness of the comb-tooth capacitance electrode 145, by increasing the film thickness of any one of the two wirings that configures the capacitance element C2, without impairing the frequency characteristics of the capacitance value of the capacitance element C1, it is possible to increase the capacitance Q value of the capacitance element C2.

According to the configuration described above, the capacitance element C1 can secure the larger capacitance value than that of the capacitance element C2, and the capacitance element C2 can secure the larger capacitance Q value than that of the capacitance element C1. Accordingly, with the variable filter 10A according to the present embodiment, it is possible to cope with the required frequency variable amount and to secure the steepness and the low loss characteristic of the pass band.

[2.4 Circuit Configuration of Variable Filter 10B According to Modification]

Figure 8A:
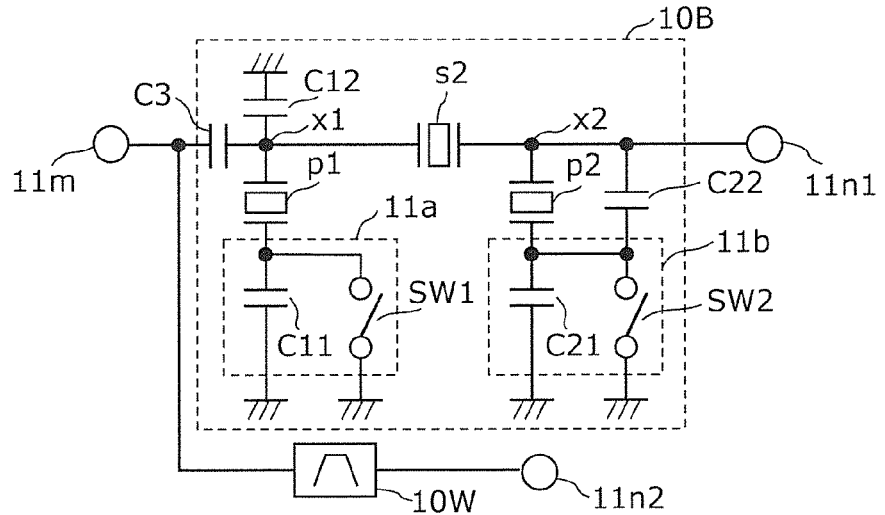

FIG. 8A is a circuit configuration diagram of a multiplexer according to a modification of the second embodiment. This diagram illustrates the multiplexer in which a variable filter 10B and a filter 10W are bundled together by the input and output terminal 11m.

The filter 10W is a filter having a fixed pass band, which is connected between input and output terminals 11m and 11n2.

The variable filter 10B is a frequency variable type filter connected between input and output terminals 11m and 11n1. The variable filter 10B includes a serial arm resonator s2, parallel arm resonators p1 and p2, capacitance elements C12, C22, and C3, and frequency variable circuits 11a and 11b. The variable filter 10B illustrated in FIG. 8A is a circuit in which the parallel arm resonance circuit 21 included in the variable filter 10 according to the first embodiment, the parallel arm resonance circuit 21A included in the variable filter 10A according to the second embodiment, and the capacitance element C3 connected in series to the input and output terminal 11m are added to the serial arm resonator s2. Hereinafter, the descriptions of the same points as those of the variable filter 10 according to the first embodiment and the variable filter 10A according to the second embodiment will be omitted, and different points will be mainly described.

The parallel arm resonator p1, a capacitance element C11, and a switch SW1 configure a parallel arm resonance circuit (first resonance circuit) provided in the second path (parallel arm) connecting the node x1 on the first path (on the serial arm) to the ground, the first path connecting the input and output terminal 11m to the input and output terminal 11n1. Additionally, the parallel arm resonator p2, a capacitance element C21, and a switch SW2 configure a parallel arm resonance circuit (first resonance circuit) provided in a third path (parallel arm) connecting a node x2 on the first path (on the serial arm) to the ground, the first path connecting the input and output terminal 11m to the input and output terminal 11n1. With this configuration, the variable filter 10B has a π-shaped ladder filter structure configured of the serial arm resonator s2 (second resonance circuit) and the two parallel arm resonance circuits (first resonance circuits). In the variable filter 10B, as compared with the variable filter 10 according to the first embodiment and the variable filter 10A according to the second embodiment, the two parallel arm resonance circuits are arranged, so that it is possible to improve attenuation characteristics.

Note that resonance characteristics of the parallel arm resonators p1 and p2 are substantially the same, and a relative frequency relationship between the resonance characteristics of the parallel arm resonators p1 and p2 and resonance characteristics of the serial arm resonator s2 is substantially the same as a relative relationship between the resonance characteristics of the parallel arm resonator p1 and the resonance characteristics of the serial arm resonator s1 in the variable filters 10 and 10A.

Furthermore, the frequency variable circuit 11a corresponds to the frequency variable circuit 11 of the variable filter 10, and the frequency variable circuit 11b corresponds to the frequency variable circuit 11 of the variable filter 10A.

The capacitance element C12 corresponds to the capacitance element C2 of the variable filter 10, and the capacitance element C22 corresponds to the capacitance element C2 of the variable filter 10A.

In the variable filter 10B, the capacitance element C3 is connected to the input and output terminal 11m while being closest thereto. In the case where the variable filter 10B and the filter 10W are bundled by the input and output terminal 11m, the capacitance element C3 is a capacitor for suppressing the bandpass characteristics of the variable filter 10B and the filter 10W from being affected by reflection characteristics of the filters on the other sides, respectively.

According to the above-described configuration, in the variable filter 10B, when the switches SW1 and SW2 are off, the attenuation pole of the pass band on a low-band side shifts to the higher-frequency side than that when the switches are on. Thus, the variable filter 10B configures a frequency variable type filter in which the low-band end of the pass band is variable. However, only by the shift of the attenuation pole by the frequency variable circuits 11a and 11b, there are risks that the steepness of the pass band on the low-band side is changed and the insertion loss of the pass band on the low-band end is deteriorated.

In response to this, the variable filter 10B further includes the capacitance element C12 connected between the node x1 and the ground and the capacitance element C22 connected between the node x2 and the frequency variable circuit 11b. The capacitance elements C12 and C22 have functions of narrowing frequency differences between the resonance points and the anti-resonance points, respectively, of the parallel arm resonance circuit (first resonance circuit) configured of the parallel arm resonator p1 and the frequency variable circuit 11a and the parallel arm resonance circuit (first resonance circuit) configured of the parallel arm resonator p2 and the frequency variable circuit 11b, and improves the steepness of the pass band on the low-band side when the switches SW1 and SW2 are on. Note that when the switches SW1 and SW2 are off, since the frequency variable amounts, that is, the frequency differences between the resonance points and the anti-resonance points of the first resonance circuits are defined, respectively, by the constants of the impedance elements (capacitance elements C12 and C22) of the frequency variable circuits 11a and 11b, the steepness of the pass band on the low-band side is not affected.

[2.5 Electrode Configuration of Variable Filter 10B]

Figure 8B:
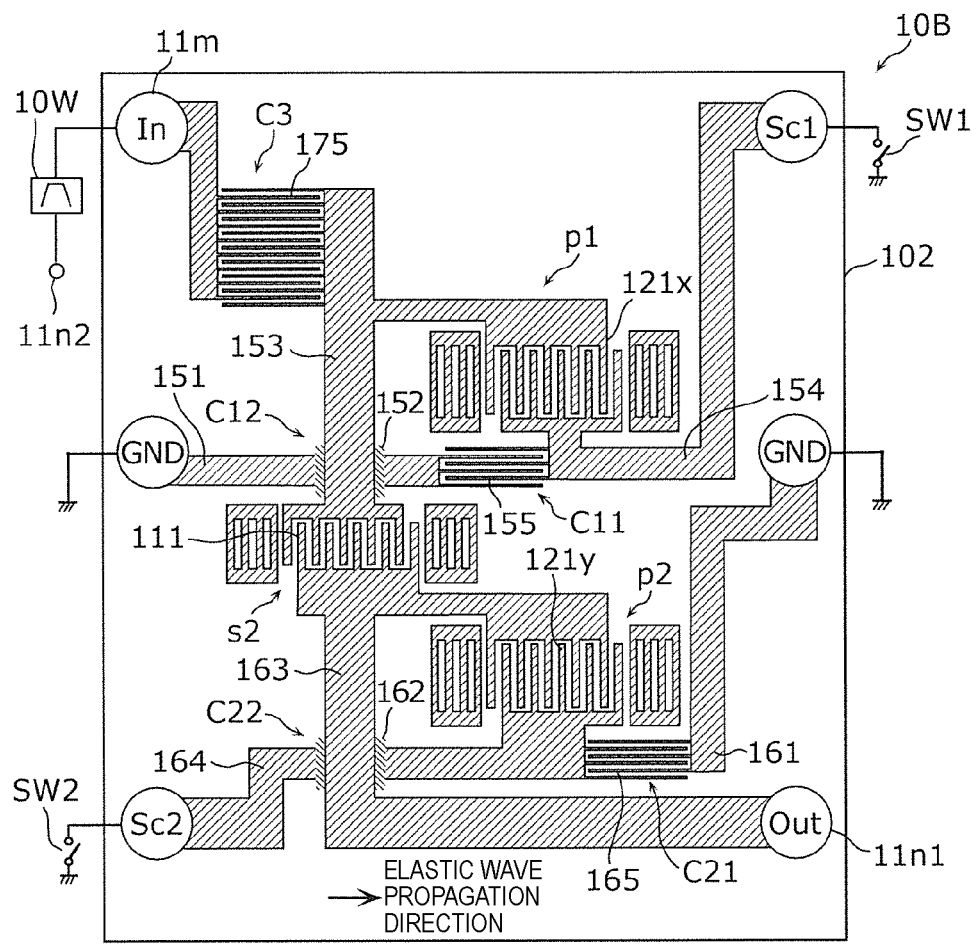

FIG. 8B is a planar configuration diagram of the variable filter 10B according to the modification of the second embodiment.

As illustrated in FIG. 8B, in the outer peripheral portion on the surface of the substrate 102, there are formed the input electrode In corresponding to the input and output terminal 11m, the output electrode Out corresponding to the input and output terminal 11n1, the ground electrode GND corresponding to the ground terminal 11g, and switch connection electrodes Sc1 and Sc2 respectively corresponding to the connection terminals of the switches SW1 and SW2. Additionally, on the surface of the substrate 102 and in a region surrounded by the input electrode In, the output electrode Out, and the ground electrode GND, the IDT electrode 111 and the reflectors configuring the serial arm resonator s2, an IDT electrode 121x and reflectors configuring the parallel arm resonator p1, and an IDT electrode 121y and reflectors configuring the parallel arm resonator p2 are formed. Furthermore, the capacitance elements C11, C12, C21, C22, and C3 are formed on the surface of the substrate 102. Additionally, on the surface of the substrate 102, respective wirings for connecting the input electrode In, the output electrode Out, the ground electrode GND, the switch connection electrodes Sc1 and Sc2, the IDT electrode 111, the IDT electrodes 121x and 121y, and the capacitance elements C11, C12, C21, C22, and C3 are formed.

Comb-tooth capacitance electrodes 155, 165, and 175 each include a plurality of electrode fingers, and are formed on the substrate 102. Here, an extending direction of the electrode fingers of each of the comb-tooth capacitance electrodes 155, 165, and 175 and an extending direction of the electrode fingers of each of the IDT electrodes 111, 121x, and 121y intersect with each other.

The comb-tooth capacitance electrode 155 configures, together with the substrate 102, the capacitance element C11 (capacitor) which is a comb-tooth capacitance. The comb-tooth capacitance electrode 165 configures, together with the substrate 102, the capacitance element C21 (capacitor) which is a comb-tooth capacitance. The comb-tooth capacitance electrode 175 configures, together with the substrate 102, the capacitance element C3 (capacitor) which is a comb-tooth capacitance.

As compared with the capacitance elements C12 and C22, the capacitance elements C11 and C21 do not require the large capacitance Q value, but require the relatively large capacitance value. Accordingly, as a constituent element of the capacitance element C11, the comb-tooth capacitance electrode 155 having the same electrode finger configuration as that of the IDT electrode 121x is configured on the substrate 102. Additionally, as a constituent element of the capacitance element C21, the comb-tooth capacitance electrode 165 having the same electrode finger configuration as that of the IDT electrode 121y is configured on the substrate 102. Since the comb-tooth capacitance electrodes 155 and 165 each have the configuration in which the unit capacitances each configured of the adjacent electrode fingers and the substrate 102 having the high relative dielectric constant are in cascading connection, the large capacitance value can be secured. Thus, it is possible to obtain the desired frequency variable amount based on the required specification.

Additionally, one electrode of the comb-tooth capacitance electrode 155 is connected to a wiring 154, and the other electrode of the comb-tooth capacitance electrode 155 is connected to a wiring 151.

The wiring 154 is one of the one or more first IDT wirings connected to the IDT electrode 121x (parallel arm resonator p1). Furthermore, the wiring 154 is one of the first capacitance wirings connected to the comb-tooth capacitance electrode 155 (capacitance element C11). The wiring 154 is the third wiring, which is connected to the comb-tooth capacitance electrode 155 and the switch connection electrode Sc1 (switch SW1), of the first capacitance wirings.

Furthermore, the wiring 151 is one of the first capacitance wirings connected to the comb-tooth capacitance electrode 155 (capacitance element C11). The wiring 151 is the first wiring, which is connected to the comb-tooth capacitance electrode 155 and the ground electrode GND, of the first capacitance wirings.

A wiring 153 is one of the one or more first IDT wirings connected to the IDT electrode 121x (parallel arm resonator p1). The wiring 153 is the second wiring, which is connected to the IDT electrode 111 (serial arm resonator s2, second resonance circuit), of the one or more first IDT wirings. In addition, the wiring 153 connects the IDT electrode 111, the IDT electrode 121x, and the comb-tooth capacitance electrode 175 (capacitance element C3).

Additionally, one electrode of the comb-tooth capacitance electrode 165 is connected to a wiring 164, and the other electrode of the comb-tooth capacitance electrode 165 is connected to a wiring 161.

The wiring 164 is one of the one or more first IDT wirings connected to the IDT electrode 121y (parallel arm resonator p2). Furthermore, the wiring 164 is one of the one or more first capacitance wirings connected to the comb-tooth capacitance electrode 165 (capacitance element C21). The wiring 164 is the third wiring, which is connected to the comb-tooth capacitance electrode 165 and the switch connection electrode Sc2 (switch SW2), of the one or more first capacitance wirings.

Furthermore, the wiring 161 is one of the first capacitance wirings connected to the comb-tooth capacitance electrode 165 (capacitance element C21). The wiring 161 is the first wiring, which is connected to the comb-tooth capacitance electrode 165 and the ground electrode GND, of the first capacitance wirings.

A wiring 163 is one of the one or more first IDT wirings connected to the IDT electrode 121y (parallel arm resonator p2). The wiring 163 is the second wiring, which is connected to the IDT electrode 111 (serial arm resonator s2, second resonance circuit), of the one or more first IDT wirings. In addition, the wiring 163 connects the IDT electrode 111, the IDT electrode 121y, and the output electrode Out.

The capacitance element C12 is the multilayer type capacitor formed in an intersection region of the wiring 151 and the wiring 153 and using the wiring 151 and the wiring 153 in the intersection region as the opposite electrodes. The wiring 153 is a wiring, which is not connected to the capacitance element C11, of the IDT wirings connected to the IDT electrode 121x. The wiring 151 is the capacitance wiring which connects the capacitance element C1 and the ground electrode GND.

The capacitance element C22 is the multilayer type capacitor formed in an intersection region of the wiring 164 and the wiring 163 and using the wiring 164 and the wiring 163 in the intersection region as the opposite electrodes. The wiring 163 is a wiring, which is not connected to the capacitance element C21, of the IDT wirings connected to the IDT electrode 121y. The wiring 164 is the capacitance wiring which connects the capacitance element C21 and the switch connection electrode Sc2.

In addition, at a location where the wiring 151 and the wiring 153 intersect with and are opposed to each other, an intermediate layer 152 is formed between the wiring 151 and the wiring 153. At a location where the wiring 164 and the wiring 163 intersect with and are opposed to each other, an intermediate layer 162 is formed between the wiring 164 and the wiring 163. Each of the intermediate layers 152 and 162 is the first intermediate layer made of an insulator or a dielectric, and is made of, for example, at least one of silicon oxide, alumina, silicon nitride, and polyimide. With this configuration, since the material of each of the intermediate layers 152 and 162 can be selected from the above materials, the degree of freedom in adjusting the capacitance value of each of the capacitance elements C12 and C22 is improved.

According to the above electrode configuration, the capacitance elements C12 and C22 each have the configuration in which the two wirings in the intersection region are used as the opposite electrodes. Here, as the film thickness is increased and as the electrode area is increased of the electrode configuring the capacitance element, the resistance component of the capacitance element can be reduced, so that the capacitance Q value can be increased. From this viewpoint, even when the IDT electrodes 121x and 121y and the various wirings are formed on the same substrate, without being limited by the film thickness of each of the IDT electrodes 121x and 121y defined by the propagation characteristics of the acoustic wave, the film thickness and the electrode area of each of the opposite electrodes configuring each of the capacitance elements C12 and C22 can be adjusted. With this configuration, each of the parallel plate type capacitance elements C12 and C22 can have the larger capacitance Q value than that of each of the comb-tooth capacitance type capacitance elements C11 and C21. Accordingly, since the steepness and the low loss characteristic of the pass band on the low-band side are particularly secured, the bandpass characteristic of the acoustic wave device is improved.

Note that it is preferable that a film thickness of the wiring 153 be larger than a film thickness of the wiring 151. In other words, in the opposite electrodes configuring the capacitance element C12, the film thickness of the wiring 153, which is not connected to the capacitance element C11, of the wirings connected to the IDT electrode 121x is preferably larger than the film thickness of the wiring 151 that is connected to the capacitance element C11. Additionally, it is preferable that a film thickness of the wiring 163 be larger than a film thickness of the wiring 164. In other words, in the opposite electrodes configuring the capacitance element C22, the film thickness of the wiring 163, which is not connected to the capacitance element C21, of the wirings connected to the IDT electrode 121y is preferably larger than the film thickness of the wiring 164 that is connected to the capacitance element C21.

Since the capacitance elements C11 and C21 do not require the large capacitance Q value, it is not necessary to increase a film thickness of each of the comb-tooth capacitance electrodes 155 and 165. On the other hand, the capacitance elements C11 and C21 require a large capacitance value in some cases, processing accuracy such as making a large number of cascades of the electrode is required, and therefore the film thickness of each of the comb-tooth capacitance electrodes 155 and 165 is preferably small.

On the other hand, since the capacitance elements C12 and C22 require the large capacitance Q value, it is preferable to increase the film thickness of the electrode configuring each of the capacitance elements C12 and C22.

From the above-described viewpoint, without increasing the film thickness of each of the wiring 151 connected to the capacitance element C11 and the wiring 164 connected to the capacitance element C21, by increasing the film thickness of each of the wiring 153 that configures the capacitance element C12 and the wiring 163 that configures the capacitance element C22, without impairing frequency characteristics of the capacitance value of each of the capacitance elements C11 and C21, it is possible to increase the capacitance Q value of each of the capacitance elements C12 and C22.

In addition, the film thickness of any one of the wirings 151 and 153 of the capacitance element C12 in the intersection region may be larger than the film thickness of the comb-tooth capacitance electrode 155. In addition, the film thickness of any one of the wirings 164 and 163 of the capacitance element C22 in the intersection region may be larger than the film thickness of the comb-tooth capacitance electrode 165. In other words, the film thickness of one of the capacitance wiring in the intersection region and the IDT wiring in the intersection region may be larger than the film thickness of each of the comb-tooth capacitance electrodes 155 and 165.

In other words, without increasing the film thickness of each of the comb-tooth capacitance electrodes 155 and 165, by increasing the film thickness of any one of the two wirings that configures each of the capacitance elements C12 and C22, without impairing the frequency characteristics of the capacitance value of each of the capacitance elements C11 and C21, it is possible to increase the capacitance Q value of each of the capacitance elements C12 and C22.

According to the configuration described above, each of the capacitance elements C11 and C21 can secure the larger capacitance value than that of the capacitance elements C12 and C22, and each of the capacitance elements C12 and C22 can secure the larger capacitance Q value than that of the capacitance elements C11 and C21. Accordingly, with the variable filter 10B according to the present embodiment, it is possible to cope with the required frequency variable amount and to secure the steepness and the low loss characteristic of the pass band.

Third Embodiment

Although the first and second embodiments describe variable filters 10, 10A, and 10B having the comb-tooth type capacitance element and the multilayer type capacitance element, the present embodiment describes a variable filter in which the comb-tooth type capacitance element has a different configuration.

[3.1 Electrode Configuration of Variable Filter 10C]

Figure 9A:
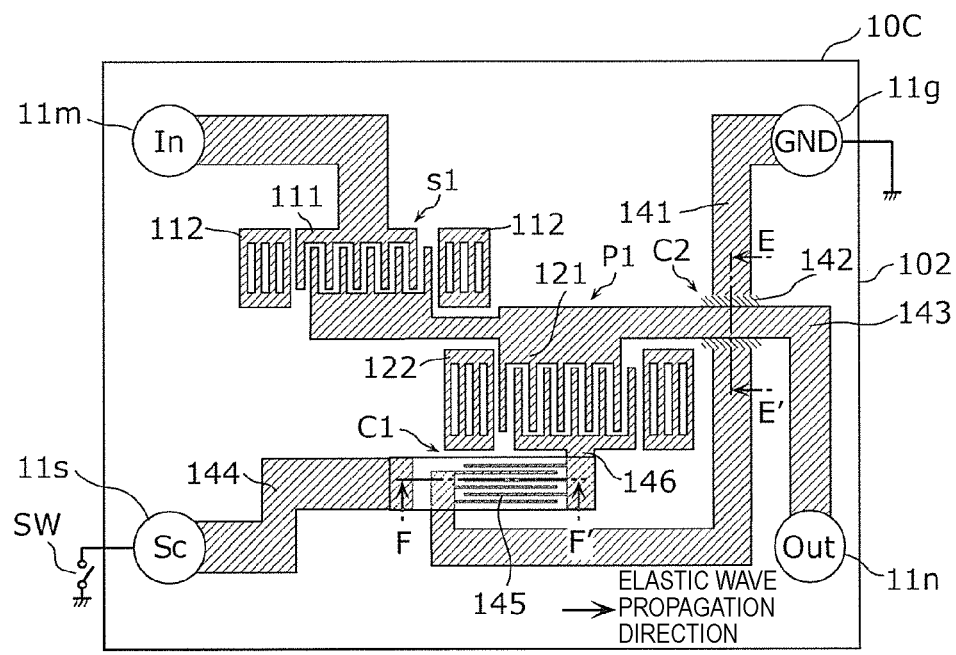
Figure 9B:
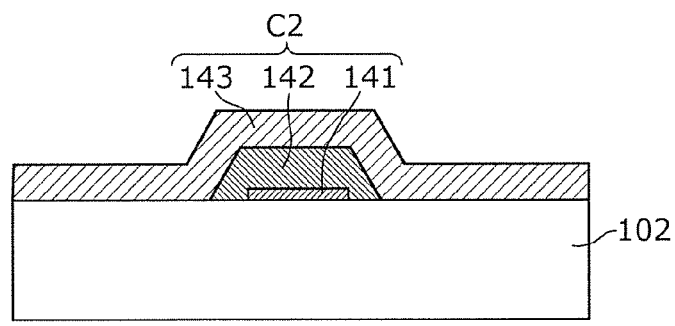
Figure 9C:
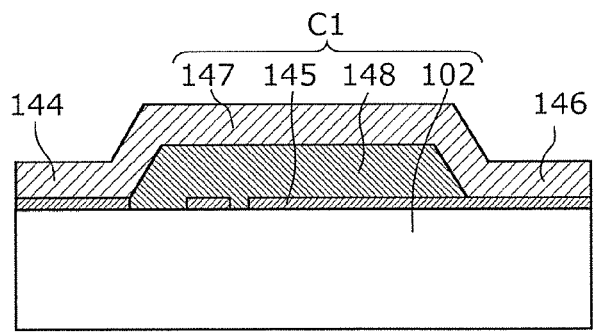

FIG. 9A is a planar configuration diagram of a variable filter 10C according to a third embodiment (third working example). Furthermore, FIG. 9B is a cross-sectional configuration diagram of the capacitance element C2 of the variable filter 10C according to the third embodiment (third working example). Furthermore, FIG. 9C is a cross-sectional configuration diagram of the capacitance element C1 of the variable filter 10C according to the third embodiment (third working example). More specifically, FIG. 9A illustrates a layout of electrodes configuring the serial arm resonator s1, the parallel arm resonator p1, and the capacitance elements C1 and C2 on the substrate 102, FIG. 9B is a cross-sectional view taken along a line E-E' in FIG. 9A, and FIG. 9C is a cross-sectional view taken along a line F-F' in FIG. 9A.

The variable filter 10C according to the present embodiment is different from the variable filter 10 according to the first embodiment in the configuration of the capacitance element C1 and the layout of the respective wirings and the terminal electrodes. Hereinafter, the descriptions of the same points as those of the variable filter 10 according to the first embodiment will be omitted, and different points will be mainly described.

As illustrated in FIG. 9A, in the outer peripheral portion on the surface of the substrate 102, there are formed the input electrode In corresponding to the input and output terminal 11m, the output electrode Out corresponding to the input and output terminal 11n, the ground electrode GND corresponding to the ground terminal 11g, and the switch connection electrode Sc corresponding to the connection terminal 11s of the switch SW. Additionally, on the surface of the substrate 102 and in the region surrounded by the input electrode In, the output electrode Out, and the ground electrode GND, the IDT electrode 111 and the reflectors 112 configuring the serial arm resonator s1, and the IDT electrode 121 and the reflectors 122 configuring the parallel arm resonator p1 are formed. Furthermore, as illustrated in FIG. 9A to FIG. 9C, the capacitance elements C1 and C2 are formed on the surface of the substrate 102. Additionally, on the surface of the substrate 102, respective wirings for connecting the input electrode In, the output electrode Out, the ground electrode GND, the switch connection electrode Sc, the IDT electrode 111, the IDT electrode 121, and the capacitance elements C1 and C2 are formed.

Note that in a terminal array of the variable filter 10C illustrated in FIG. 9A (an array of the input electrode In, the output electrode Out, the ground electrode GND, and the switch connection electrode SC), the positions of the ground electrode GND and the switch connection electrode Sc are interchanged as compared with the terminal array of the variable filter 10 illustrated in FIG. 2A. In other words, it is possible to select the terminal arrangement of the variable filter 10 or the variable filter 10C according to the specification of the arrangement of the external terminals.

As illustrated in FIG. 9C, the variable filter 10C further includes an intermediate layer 148 and a three-dimensional wiring 147 as compared with the variable filter 10.

The intermediate layer 148 is formed on the comb-tooth capacitance electrode 145, and is configured of an insulator or a dielectric. The intermediate layer 148 is, for example, configured of at least one of silicon oxide, alumina, silicon nitride, and polyimide. It is preferable that a film thickness of the intermediate layer 148 be, for example, equal to or smaller than 1.5 μm.

The three-dimensional wiring 147 is formed on the intermediate layer 148 and is connected to wirings 144 and 146 formed on the substrate 102. The wiring 146 is connected to one electrode of each of the IDT electrode 121 and the comb-tooth capacitance electrode 145. In addition, the wiring 144 is connected to the switch connection electrode Sc and is not connected to the ground electrode GND. Note that the three-dimensional wiring 147 covers the comb-tooth capacitance electrode 145 and the intermediate layer 148 when the substrate 102 is viewed in a plan view, but the configuration is not limited thereto. The three-dimensional wiring 147 may partially overlap with the comb-tooth capacitance electrode 145 and the intermediate layer 148.

In addition, a film thickness of the three-dimensional wiring 147 is preferably larger than the film thickness of the plurality of electrode fingers configuring the comb-tooth capacitance electrode 145. With this configuration, the film thickness of the three-dimensional wiring 147 can be increased regardless of the film thickness of the comb-tooth capacitance electrode 145 optimized by the frequency characteristics of the Q value and the capacitance value of the capacitance element C1. Thus, since wiring resistance of the three-dimensional wiring 147 can be reduced, a radio frequency signal propagation loss of the variable filter 10C can be reduced. Furthermore, since the three-dimensional wiring 147 is connected to the one electrode of the two electrodes configuring the comb-tooth capacitance electrode 145 with the wiring 146 formed on the substrate 102 interposed therebetween, a resistance component of the capacitance element C1 can be reduced, and the Q value of the capacitance element C1 can be improved.

According to the above-described configuration, the comb-tooth capacitance electrode 145 configures, together with the intermediate layer 148 and the substrate 102, the capacitance element C1 (capacitor).

Furthermore, the three-dimensional wiring 147 is connected to the one electrode of the two electrodes configuring the comb-tooth capacitance electrode 145 with the wiring 146 formed on the substrate 102 interposed therebetween. According to this configuration, the comb-tooth capacitance electrode 145 configures, together with the intermediate layer 148 and the three-dimensional wiring 147, a part of the capacitance element C1 (capacitor).

In the electrode layout according to the third working example illustrated in FIG. 9A, the three-dimensional wiring 147 is arranged as a wiring connecting the IDT electrode 121 and the switch connection electrode Sc. In other words, the three-dimensional wiring 147 is a wiring which is formed on the substrate 102 and is a wiring which connects the two wirings 146 (connected to the IDT electrode 121) and 144 (connected to the switch connection electrode Sc) which are opposed to each other with the comb-tooth capacitance electrode 145 sandwiched therebetween. With this configuration, as compared with a case where the wirings 146 and 144 are connected to each other by bypassing the capacitance element C1 without using the three-dimensional wiring 147, it is possible to reduce an area of the wiring layout on the substrate 102.

Furthermore, as described above, comparing the electrode layout of the variable filter 10C according to the third working example and the electrode layout of the variable filter 10 according to the first working example, the arrangements of the ground electrode GND and the switch connection electrode Sc are interchanged. In other words, it is possible to improve the degree of freedom in the arrangement of the terminals including the ground electrode GND and the switch connection electrode Sc.

According to the above electrode configuration of the variable filter 10C according to the third working example, since the three-dimensional wiring 147 is arranged on the comb-tooth capacitance electrode 145, the layout area of the variable filter 10C can be reduced, and thus miniaturization can be achieved. In addition, the degree of freedom in the arrangement of the respective terminals is improved.

[3.2 Frequency Characteristics of Comb-Tooth Type Capacitance]

Figure 10A:
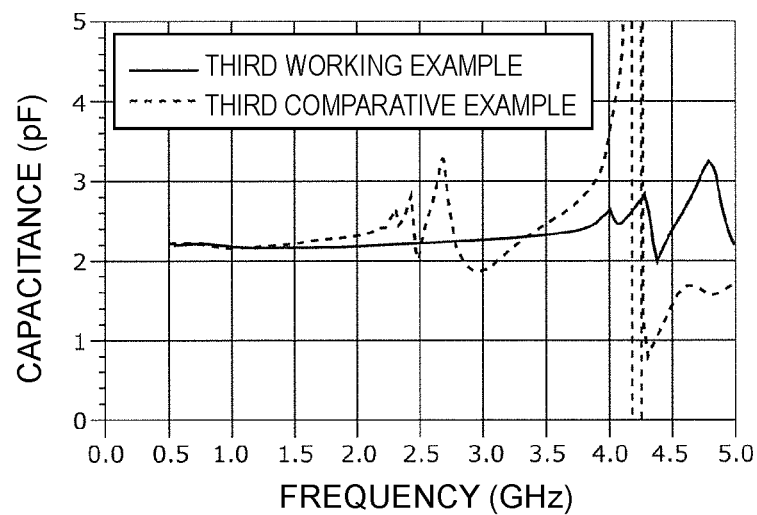

FIG. 10A is a graph showing a comparison of capacitance values of the capacitance elements C1 according to the third working example and a third comparative example. In the graph, the capacitance element C1 according to the third working example is the comb-tooth capacitance having the intermediate layer 148 and the three-dimensional wiring 147, and the capacitance element C1 according to the third comparative example is a comb-tooth capacitance not having the intermediate layer 148 and the three-dimensional wiring 147. Note that electrode parameters of the comb-tooth capacitance electrode 145 of the capacitance element C1 for which the capacitance value in FIG. 10A and the capacitance Q value in FIG. 10B are measured are as follows.

(1) Electrode finger pitch=0.75 μm
(2) Duty=0.50
(3) Electrode finger film thickness=150 nm
(4) The number of electrode fingers=105 pairs
(5) Cross-width=10.8 μm Note that the detailed definition of the above-described electrode parameters of (1) to (5) will be described in [4.1 Filter Electrode Structure] and FIGS. 11A, 11B and 11C, which will be described later.

As shown in FIG. 10A, in the comb-tooth capacitance according to the third comparative example, singular points of the capacitance value are particularly expressed in the vicinity of 2.6 GHz and in the vicinity of 4.2 GHz, and an unnecessary ripple is observed. In contrast, in the capacitance element C1 according to the third working example, the unnecessary ripple is reduced in the frequency characteristics of the capacitance value. This can be thought of as an effect of the reduction of the unnecessary excitation of the comb-tooth capacitance electrode 145 configuring the capacitance element C1, by arranging the three-dimensional wiring 147 on the comb-tooth capacitance electrode 145.

Figure 10B:
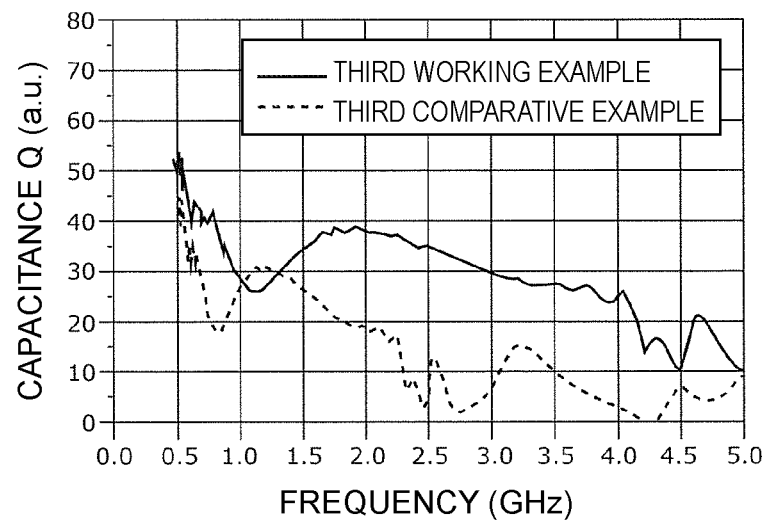

FIG. 10B is a graph showing a comparison of capacitance Q values of the capacitance elements C1 according to the third working example and the third comparative example. As shown in the graph, in almost the entire region of the radio frequency region (0.5 GHz to 5 GHz), the capacitance Q value of the capacitance element C1 according to the third working example is higher than the capacitance Q value of the comb-tooth capacitance according to the third comparative example. This is because, as described above, the unnecessary ripple occurring in the third comparative example is reduced in the third working example. Furthermore, since the three-dimensional wiring 147 having the film thickness larger than that of the electrode fingers of the comb-tooth capacitance electrode 145 is connected to the one electrode of the two electrodes configuring the comb-tooth capacitance electrode 145, an effect that the resistance component of the capacitance element C1 can be reduced is also obtained.

Here, the capacitance Q value of the capacitance element C1 according to the third working example will be described. The capacitance element C1 is a parallel combined capacitance of a comb-tooth capacitance C11 configured of the comb-tooth capacitance electrode 145, the substrate 102, and the intermediate layer 148 and a multilayer capacitance C12 configured of the comb-tooth capacitance electrode 145, the intermediate layer 148, and the three-dimensional wiring 147. The capacitance Q value tends to increase as the resistance component of the capacitance becomes lower. Here, the resistance component of the comb-tooth capacitance C11 is determined by the comb-tooth capacitance electrode 145 configured of the plurality of electrode fingers. Furthermore, since the comb-tooth capacitance C11 is configured of the comb-tooth capacitance electrode configured on the piezoelectric substrate, unnecessary acoustic wave excitation caused by the comb-tooth capacitance electrode is generated, an unnecessary ripple is generated, and a radio frequency signal locally leaks to the substrate. In other words, the local signal leakage to the substrate is equalized with the resistance generated in the comb-tooth capacitance electrode 145. However, in the capacitance element C1 according to the third working example, since the unnecessary acoustic wave excitation can be suppressed by the three-dimensional wiring 147 arranged above the comb-tooth capacitance electrode 145, the unnecessary ripple can be suppressed. That is, as compared with the third comparative example, the resistance in the frequency band is reduced. On the other hand, the resistance component of the multilayer capacitance C12 is determined by the three-dimensional wiring 147. Accordingly, when taking the shape and the film thickness of each of the comb-tooth capacitance electrode 145 and the three-dimensional wiring 147 into consideration, the resistance component of the multilayer capacitance C12 is smaller than the resistance component of the comb-tooth capacitance C11. Therefore, it can be seen that the capacitance element C1 according to the third working example to which the three-dimensional wiring 147 is added can have the larger capacitance Q value than that of the comb-tooth capacitance according to the third comparative example to which the three-dimensional wiring 147 is not added.

As described above, in the variable filter 10C according to the third working example, the unnecessary excitation of the capacitance element C1 is reduced and the frequency characteristics of the capacitance value and the capacitance Q value of the capacitance element C1 are improved, and thus the bandpass characteristic of the variable filter 10C is improved.

Note that in the present embodiment, although the three-dimensional wiring 147 is connected to the one electrode of the two electrodes configuring the comb-tooth capacitance electrode 145 with the wiring 146 interposed therebetween, the three-dimensional wiring 147 may not be connected to the one electrode of the comb-tooth capacitance electrode 145. Furthermore, the three-dimensional wiring 147 may not be connected to both of the wirings 146 and 144. In this case, it is preferable that the three-dimensional wiring 147 be connected to a wiring, which has a ground potential, formed on the substrate 102. According to these connection forms as well, the unnecessary excitation of the capacitance element C1 is reduced.

Furthermore, the three-dimensional wiring 147 may be connected to a wiring that is formed on the substrate 102 and whose potential is determined. According to this configuration as well, the effect of reducing the unnecessary excitation of the capacitance element C1 can be obtained. Furthermore, the three-dimensional wiring 147 may be in a so-called floating (the potential not being determined) state. According to this configuration as well, the three-dimensional wiring 147 can provide the effect of reducing the excitation of unnecessary waves.

Fourth Embodiment

In the present embodiment, a configuration of the capacitance element C1 included in each of the variable filters according to the first to third embodiments is defined in detail. Hereinafter, the configuration relating to the capacitance element C1 of each of the variable filters according to the first to third embodiments will be mainly described, and the descriptions of the other configurations will be omitted.

[4.1 Filter Electrode Structure]

Each of FIGS. 11A, 11B and 11C is a diagram schematically illustrating an electrode structure of the filter 10 according to a fourth embodiment. Specifically, FIG. 11A is a plan view, FIG. 11B is a cross-sectional view taken along a line G-G' in FIG. 11A, and FIG. 11C is a cross-sectional view taken along a line H-H' in FIG. 11A. Note that the electrode structure illustrated in FIGS. 11A, 11B and 11C is used to describe a typical structure of the respective resonators and the comb-tooth capacitance electrode 145 configuring the filter 10. Therefore, the number and the length of the electrode fingers configuring each of the IDT electrodes of the respective resonators and the comb-tooth capacitance electrode 145 of the filter 10 are not limited to the number and the length of the electrode fingers illustrated in the diagram. In addition, in FIGS. 11A, 11B and 11C, in order to describe the structures of the IDT electrodes 111 and 121 and the comb-tooth capacitance electrode 145 in detail, the intermediate layer 148 and the three-dimensional wiring 147 included in the variable filter 10C according to the third embodiment are not illustrated. Furthermore, in FIGS. 11A, 11B and 11C, the multilayer type capacitance element C2 is not also illustrated. Additionally, although the switch SW is also schematically illustrated in the diagram, an arrangement and a structure of the switch SW are not particularly limited, and for example, the switch SW may be configured as a chip different from the respective resonators and the comb-tooth capacitance electrode 145. Additionally, the arrangement of the input electrode In, the output electrode Out, the ground electrode GND, and the switch connection electrode Sc illustrated in FIG. 2A is not limited in FIGS. 11A, 11B and 11C.

Additionally, the characteristic comparison of the capacitance values and the capacitance Q values shown below is obtained by changing the electrode parameters for the capacitance element C1 in which the intermediate layer 148 and the three-dimensional wiring 147 are not arranged. However, the relative difference obtained by the above characteristic comparison is similarly obtained in the capacitance element C1 of the variable filter 10C in which the intermediate layer 148 and the three-dimensional wiring 147 are arranged, as well as in the variable filters 10, 10A and 10B, and is applied in the capacitance element C1 according to the first to third embodiments.

As illustrated in FIGS. 11A, 11B and 11C, each resonator configuring the filter 10 is an acoustic wave resonator using an acoustic wave. With this configuration, since the filter 10 can be configured of the IDT electrodes formed on the substrate 102 having piezoelectricity, a small and low height filter circuit having the bandpass characteristic with a high steepness can be obtained.

The serial arm resonator s1 is configured of the IDT electrode 111, a single pair of the reflectors 112, and the substrate 102. The parallel arm resonator p1 is configured of the IDT electrode 121 configured of a plurality of electrode fingers 121a, a single pair of the reflectors 122, and the substrate 102.

As illustrated in FIGS. 11A and 11B, the IDT electrode 121 of the parallel arm resonator p1 is configured of an electrode film 101, and the electrode film 101 is formed on the substrate 102. Note that a specific structure of the electrode film 101, the substrate 102, and the like will be described later.

The IDT electrode 121 includes the plurality of electrode fingers 121a and a single pair of busbar electrodes arranged so as to be opposed to each other with the plurality of electrode fingers 121a sandwiched therebetween, and is configured by alternately connecting the plurality of electrode fingers 121a to one and the other of the single pair of busbar electrodes. Here, the plurality of electrode fingers 121a is formed along a direction orthogonal to the propagation direction of the acoustic wave, and are periodically formed along the propagation direction.

In the parallel arm resonator p1 configured as described above, a wave length of the acoustic wave to be excited is defined depending on the design parameters and the like of the IDT electrode 121. Hereinafter, the design parameters of the IDT electrode 121 will be described.

The wave length of the acoustic wave is defined by a repetition period $\lambda p1$ of the electrode fingers 121a connected to the one busbar electrode of the plurality of electrode fingers 121a. Furthermore, an electrode finger pitch (a pitch of the plurality of electrode fingers 121a, that is, an electrode finger period) Pp1 is ½ of the repetition period $\lambda p1$, and is defined, when a line width of the electrode finger 121a is taken as Wp1 and a space width between the adjacent electrode fingers 121a is taken as Sp1, by Pp1=(Wp1+Sp1). Furthermore, a cross-width Lp1 of the IDT electrode 121 is an overlapping electrode finger length when the electrode finger 121a connected to the one of the single pair of busbar electrodes and the electrode finger 121a connected to the other of the single pair of busbar electrodes are viewed from the propagation direction of the acoustic wave. Furthermore, an electrode duty (duty ratio) is a line width occupation ratio of the plurality of electrode fingers 121a, and is defined by a ratio of the line width to an addition value of the line width and the space width of the plurality of electrode fingers 121a, that is, Wp1/(Wp1+Sp1). In other words, the electrode duty is defined by a ratio of a width of each of the plurality of electrode fingers 121a to the electrode finger pitch (a pitch of the plurality of electrode fingers 121a), that is, Wp1/Pp1. In addition, the number of pairs is the number of electrode fingers 121a that form the pairs, and is approximately half of the total number of electrode fingers 121a. For example, the number of pairs is taken as Np1 and the total number of electrode fingers 121a is taken as Mp1, Mp1=2Np1+1 is satisfied. Furthermore, a film thickness of the electrode finger 121a is a thickness Tp1 of the electrode film 101 forming the electrode finger 121a.

Next, a structure of a comb-tooth capacitance electrode 145 will be described.

The comb-tooth capacitance electrode 145 is configured of a plurality of electrode fingers 131a. As illustrated in FIGS. 11A and 11C, the comb-tooth capacitance electrode 145 is configured of the electrode film 101 in the same manner as the IDT electrode 121. In other words, the comb-tooth capacitance electrode 145 configuring the capacitance element C1 is formed on the same substrate 102 as the IDT electrode 121 configuring the parallel arm resonator p1. Note that the comb-tooth capacitance electrode 145 and the IDT electrode 121 may be formed on different substrates from each other.

The comb-tooth capacitance electrode 145 includes the plurality of electrode fingers 131a and a single pair of busbar electrodes arranged so as to be opposed to each other with the plurality of electrode fingers 131a sandwiched therebetween, and is configured by alternately connecting the plurality of electrode fingers 131a to one and the other of the single pair of busbar electrodes. Here, the plurality of electrode fingers 131a is formed along the propagation direction of the acoustic wave, and are periodically formed along a direction orthogonal to the propagation direction.

In the capacitance element C1 configured as described above, characteristics such as the capacitance value, the Q value, and the like are defined depending on the design parameters and the like of the comb-tooth capacitance electrode 145. Hereinafter, the design parameters of the comb-tooth capacitance electrode 145 will be described.

An electrode finger pitch (a pitch of the electrode fingers, that is, an electrode finger period) Pc1 is defined, when a line width of the electrode finger 131a is taken as Wc1 and a space width between the adjacent electrode fingers 131a is taken as Sc1, by Pc1=(Wc1+Sc1). Furthermore, a cross-width Lc1 of a comb-tooth capacitance electrode 145 is an overlapping electrode finger length when the electrode finger 131a connected to the one of the single pair of busbar electrodes and the electrode finger 131a connected to the other of the single pair of busbar electrodes are viewed from the propagation direction of the acoustic wave. Furthermore, an electrode duty (duty ratio) is a line width occupation ratio of the plurality of electrode fingers 131a, and is defined by a ratio of the line width to an addition value of the line width and the space width of the plurality of electrode fingers 131a, that is, Wc1/(Wc1+Sc1). In other words, the electrode duty is defined by a ratio of a width of each of the plurality of electrode fingers 131a to a pitch of the plurality of electrode fingers 131a, that is, Wc1/Pc1. In addition, the number of pairs is the number of electrode fingers 131a that form the pairs, and is approximately half of the total number of electrode fingers 131a. For example, the number of pairs is taken as Nc1 and the total number of electrode fingers 131a is taken as Mc1, Mc1=2Nc1+1 is satisfied. Furthermore, a film thickness of the electrode finger 131a is a thickness Tc1 of the electrode film 101 forming the electrode finger 131a.

Next, the design parameters of the comb-tooth capacitance electrode 145 configuring the capacitance element C1 and the IDT electrode of the first acoustic wave resonator connected to the capacitance element C1 (the IDT electrode 121 configuring the parallel arm resonator p1 in the present embodiment) will be compared and described.

The electrode finger pitch of the capacitance element C1 is narrower than the electrode finger pitch of the parallel arm resonator p1 (first acoustic wave resonator). In other words, Pc1<Pp1 is satisfied. Here, it is preferable that the pitch of the plurality of electrode fingers 131a of the capacitance element C1 be equal to or less than 80% of the pitch of the plurality of electrode fingers 121a of the parallel arm resonator p1 (first acoustic wave resonator) (that is, $Pc1 \leq 0.8 \times Pp1 = 0.4 \times \lambda p1$).

In addition, the film thickness of the plurality of electrode fingers 131a of the capacitance element C1 is smaller than the film thickness of the plurality of electrode fingers 121a of the parallel arm resonator p1. In other words, Tc1<Tp1 is satisfied. Here, for the reasons in manufacturing, in the capacitance element C1, it is preferable that the film thickness Tc1 of the electrode finger 131a be equal to or less than 40% of the electrode finger pitch Pc1 (that is, $Tc1 \leq 0.40 \times Pc1$). Furthermore, for the same reason, in the parallel arm resonator p1, it is preferable that the film thickness Tp1 of the electrode finger 121a be equal to or less than 40% of the electrode finger pitch Pp1 (that is, $Tp1 \leq 0.40 \times Pp1$). Furthermore, the lower limit of the film thickness Tc1 of the electrode finger 131a is not particularly limited, but is, for example, equal to or more than 15% of the electrode finger pitch Pc1 (that is, $0.15 \times Pc1 \leq Tc1$). In the same manner, the lower limit of the film thickness Tp1 of the electrode finger 121a is not particularly limited, but is, for example, equal to or more than 15% of the electrode finger pitch Pp1 (that is, $0.15 \times Pp1 \leq Tp1$).

Furthermore, it is preferable that the electrode duty of the capacitance element C1 be larger than the electrode duty of the parallel arm resonator p1. In other words, it is preferable that the capacitance element C1 and the parallel arm resonator p1 satisfy Wc1/Pc1>Wp1/Pp1. By employing the configuration as described above, since the capacitance value of the capacitance element C1 per unit area can be increased, miniaturization and space saving can be achieved.

Note that in each element (the serial arm resonator s1, the parallel arm resonator p1, the comb-tooth capacitance C1, and the like), the electrode finger pitch, the film thickness, the electrode duty, and the like are not always uniform, but may be uneven due to variations in a manufacturing process or the like, or may be uneven for adjustment of the characteristics or the like. Therefore, in the comb-tooth capacitance C1 and the parallel arm resonator p1, the comb-tooth capacitance electrode 145 and the IDT electrode 121 configuring them do not partially satisfy the relationships of the electrode finger pitch, the film thickness, the electrode duty, and the like as described above in some cases. In other words, it is sufficient that the above-described relationships of the electrode finger pitch, the film thickness, and the electrode duty between the comb-tooth capacitance C1 and the parallel arm resonator p1 are substantially satisfied, and it is sufficient that the relationships between average values of the comb-tooth capacitance C1 and average values of the parallel arm resonator p1 are satisfied, for example.

[4.2 Detailed Structure of Electrode Finger]

Next, the structures of the electrode fingers 121a of the IDT electrode 121 and the electrode fingers 131a of the comb-tooth capacitance electrode 145 will be described including also configurations of the substrate 102 on which the electrode fingers 121a and the electrode fingers 131a are formed and a protective layer (which will be described later). Note that in the present embodiment, the electrode fingers 121a of the IDT electrode and the electrode fingers 131a of the comb-tooth capacitance electrode 145 are configured of the common electrode film 101 except for a point that the film thicknesses are different from each other, but may be configured of electrode films having different structures, compositions, or the like.

Figure 12A:
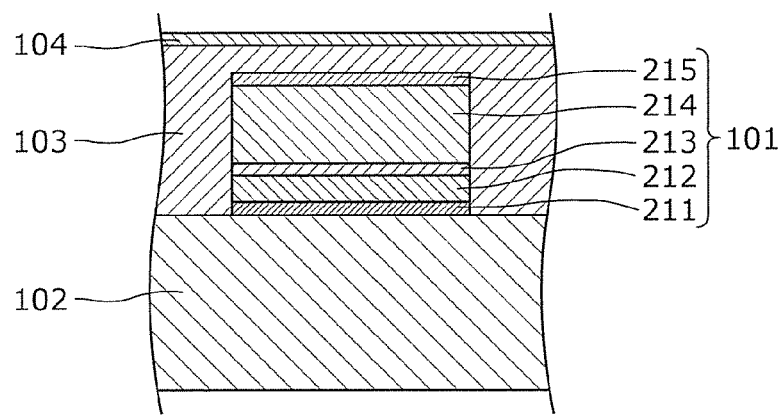
FIG. 12B is a cross-sectional view of another example of the structure of the electrode film and the periphery thereof in the fourth embodiment.
FIG. 12C is a cross-sectional view of still another example of the structure of the electrode film and the periphery thereof in the fourth embodiment.

FIG. 12A is a cross-sectional view of a structure of the electrode film 101, and the periphery thereof which configure the electrode fingers 121a of the IDT electrode 121 and the electrode fingers 131a of the comb-tooth capacitance electrode 145, according to the fourth embodiment.

As illustrated in the diagram, in the present embodiment, the electrode film 101 is formed by laminating a metal film 211 made of NiCr, a metal film 212 made of Pt, a metal film 213 made of Ti, a metal film 214 made of AlCu, and a metal film 215 made of Ti in this order from the substrate 102 side. In this case, the substrate 102 is made of, for example, LiNbO₃ piezoelectric single crystal.

Furthermore, the electrode film 101 is covered with the protective layer for the purposes of, for example, adjusting the frequency temperature characteristics and improving moisture resistance, as well as protecting the electrode film 101 from an external environment. In the present embodiment, the protective layer is formed by laminating a protective layer 103 made of SiO₂ and a protective layer 104 made of SiN in this order from the substrate 102 side.

Table 1 shows the film thicknesses at this time in detail.

TABLE 1

|  |  | Electrode Finger 121a of IDT | Electrode Finger 131a of Comb-Tooth Capacitance |
|---|---|---|---|
| Protective Layer | Protective Layer 104 (SiN) | 40.0 | 40.0 |
|  | Protective Layer 103 (SiO₂) | 1100.0 | 1100.0 |
| Electrode Film 101 | Metal Film 215 (Ti) | 10.0 | 10.0 |
|  | Metal film 214 (AlCu with Cu concentration of 10%) | 165.0 | 70.0 |
|  | Metal Film 213 (Ti) | 22.0 | 10.0 |
|  | Metal film 212 (Pt) | 110.0 | 10.0 |
|  | Metal film 211 (NiCr) | 10.0 | 10.0 |
| Film Thickness of Electrode Finger (film thickness of electrode film 101) |  | 317.0 | 110.0 |

(unit: μm)

Figure 12B:
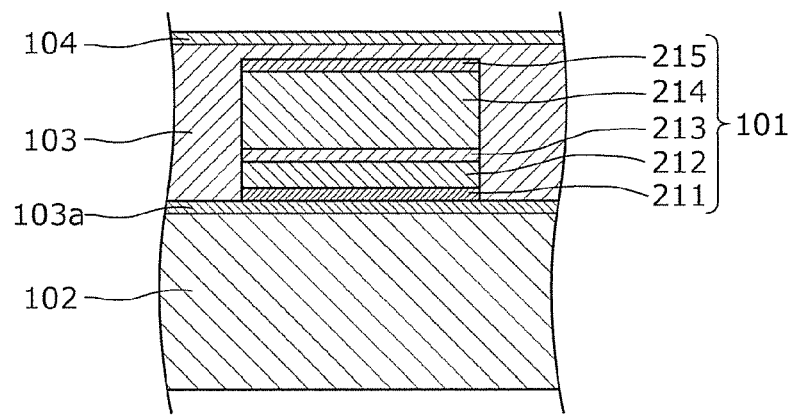

Note that as illustrated in FIG. 12B, an adjustment film 103a for adjusting an electromechanical coupling coefficient may be provided between the electrode film 101 and the substrate 102. The adjustment film 103a for adjusting the electromechanical coupling coefficient is made of SiO₂.

Figure 12C:
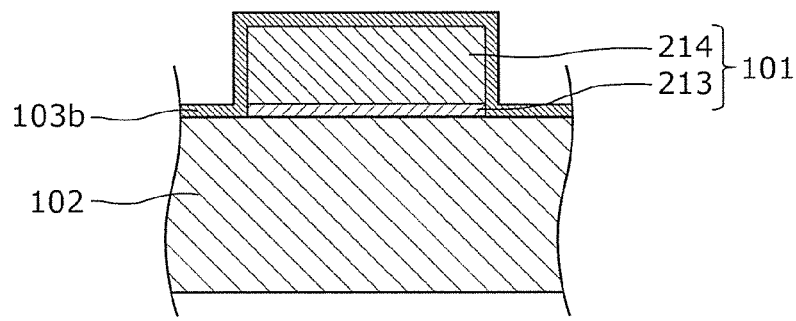

Furthermore, the structure of the electrode film 101 is not limited to the structures illustrated in FIG. 12A and FIG. 12B, and may be a structure illustrated in FIG. 12C. The electrode film 101 illustrated in the diagram is formed of the metal film 213 and the metal film 214 described above.

At this time, the substrate 102 is made of LiTaO₃ piezoelectric single crystal. In addition, a protective layer 103b having a film thickness smaller than that of the protective layer 103 is provided.

Note that these configurations are merely examples, and the configuration of the electrode film 101 that forms the electrode fingers 121a of the IDT electrode 121 and the electrode fingers 131a of the comb-tooth capacitance electrode 145 is not limited thereto. For example, the electrode film 101 may be formed of a single layer of the metal film instead of the laminated structure of the metal films. Furthermore, the material configuring each of the metal films and each of the protective layers is not limited to the materials described above. Furthermore, the electrode film 101 may be configured of a metal such as Ti, Al, Cu, Pt, Au, Ag, or Pd, or an alloy thereof, for example, or may be configured of a plurality of multilayer bodies configured of the above metal or alloy. In addition, the substrate 102 may be made of, for example, KNbO₃ piezoelectric single crystal, crystal, or piezoelectric ceramics. Furthermore, the configurations of the protective layers 103, 104, and 103b and the adjustment film 103a for adjusting the electromechanical coupling coefficient are not limited to the above-described configurations, and may be configured of, for example, a dielectric or an insulator such as SiO₂, SiN, AlN, polyimide, or a multilayer body thereof. In addition, the protective layers 103 and 104 may not be formed.

[4.3 Characteristics of Comb-Tooth Type Capacitance]

In the filter 10 according to the present embodiment, so long as the electrode finger pitches and the film thicknesses of the parallel arm resonator p1 (first acoustic wave resonator) and the capacitance element C1 satisfies the above relationships, an effect in which both the Q value of the parallel arm resonator p1 (first acoustic wave resonator) and the Q value of the capacitance element C1 are secured can be obtained.

This is because the characteristics of the capacitance element C1 depend on the design parameters. Therefore, the reason why the above-described effect is obtained will be described below using a comb-tooth capacitance of a typical example. Note that a configuration of the comb-tooth capacitance of the typical example is the same as that of the capacitance element C1, except for a point that a numerical range of the design parameter is not limited to a numerical range of the capacitance element C1.

Additionally, the characteristic comparison of the capacitance values and the capacitance Q values shown below is obtained by changing the electrode parameters for the capacitance element C1 in which the intermediate layer 148 and the three-dimensional wiring 147 are not arranged. However, the relative difference obtained by the following characteristic comparison can be similarly obtained for the capacitance element C1 of the third embodiment having the intermediate layer 148 and the three-dimensional wiring 147, and it is possible to define the electrode parameters of the capacitance element C1 according to the present embodiment on the basis of the relative difference.

[4.4 Relation with Electrode Finger Pitch]

First, descriptions will be given of a relation between the electrode finger pitch and the characteristics of the comb-tooth type capacitance of the typical example. Note that at this time, the design parameters other than the electrode finger pitch are constant, the electrode duty is 0.60 (that is, $Wc1/Pc1=0.60$), and a ratio of the film thickness to the electrode finger pitch is 0.20 (that is, $Tc1=0.20 \times Pc1$).

Figure 13A:
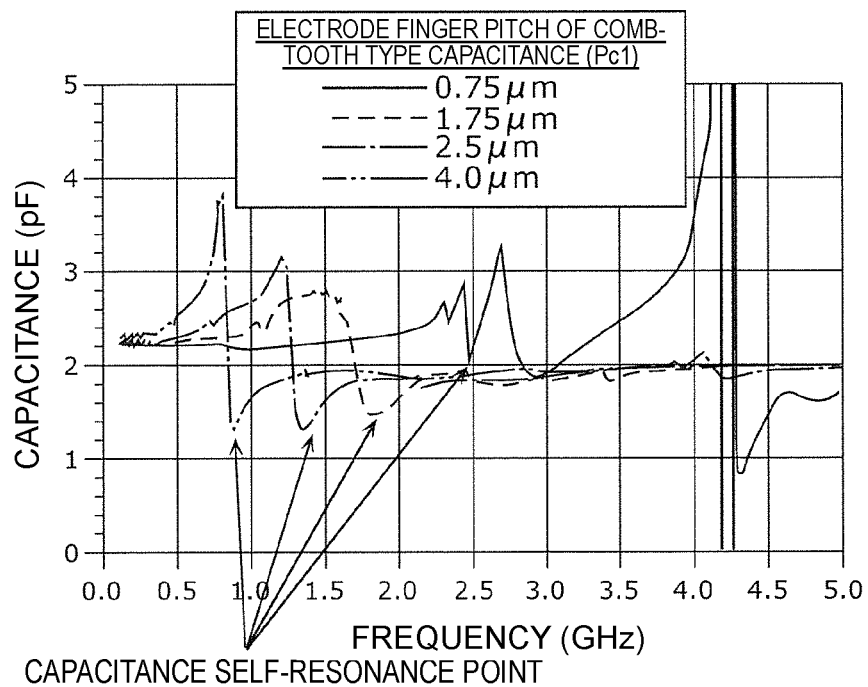
FIG. 13A is a graph showing a relation between an electrode finger pitch and a capacitance value of a comb-tooth capacitance in a typical example.
Figure 13B:
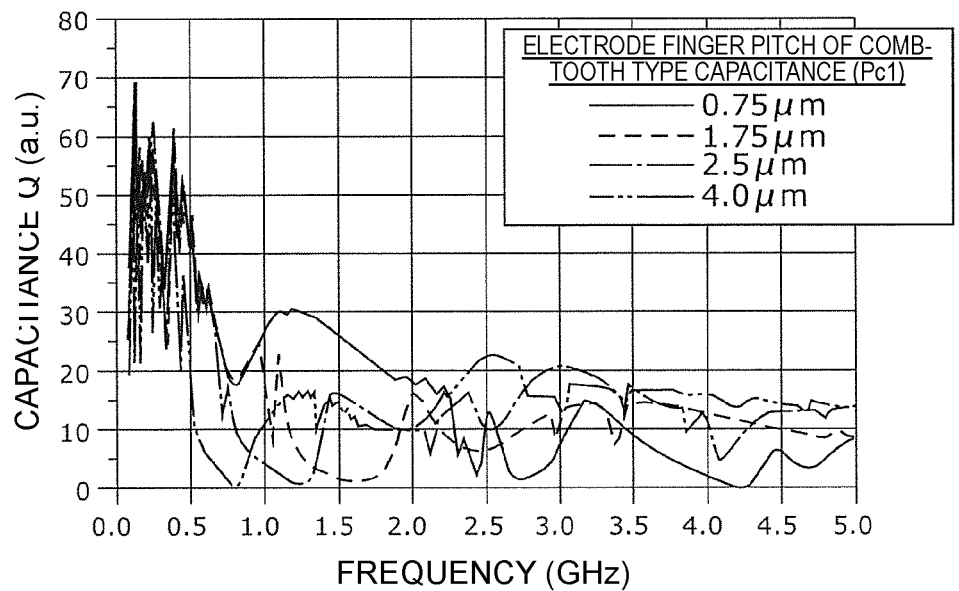
FIG. 13B is a graph showing a relation between the electrode finger pitch and a capacitance Q of the comb-tooth capacitance in the typical example.

FIG. 13A is a graph showing a relation between the electrode finger pitch Pc1 and the capacitance value of the comb-tooth type capacitance in the typical example. FIG. 13B is a graph showing a relation between the electrode finger pitch Pc1 and the Q value (capacitance Q) of the comb-tooth type capacitance in the typical example. Specifically, these graphs each show frequency characteristics when the electrode finger pitch Pc1 is set to 0.75, 1.75, 2.50, and 4.00 (the unit is µm in each case).

As shown in FIG. 13A, even if the electrode finger pitch Pc1 is changed, the capacitance value hardly changes. Note that the capacitance value described herein is a capacitance value (electrostatic capacitance value) in a low frequency region in which an influence due to self-resonance of the comb-tooth capacitance is almost negligible.

On the other hand, as shown in FIG. 13A, in the comb-tooth type capacitance, as the electrode finger pitch Pc1 becomes narrower, the self-resonant frequency shifts to the higher-band side. At this time, as shown in FIG. 13B, the Q value (capacitance Q) of the comb-tooth type capacitance approximately drops as the frequency increases, but locally drops at the self-resonance point. Therefore, by narrowing the electrode finger pitch Pc1 and driving the self-resonance point of the capacitance element C1 to the higher-band side than the pass band of the filter 10, it is possible to increase the Q value of the comb-tooth type capacitance in the pass band.

In other words, as the electrode finger pitch Pc1 is wider, the self-resonance point of the comb-tooth type capacitance shifts to the lower-band side. Therefore, the frequency of the self-resonance point is identical, in some cases, to the frequency of the resonance point or the anti-resonance point of the first acoustic wave resonator (in the present embodiment, the parallel arm resonator p1) connected to the comb-tooth type capacitance without interposing another acoustic wave resonator. In other words, the frequency of the resonance point or the anti-resonance point of the first acoustic wave resonator and the frequency at which the capacitance Q locally drops are identical to each other in some cases. In this case, at a resonance point or an anti-resonance point obtained by the combined characteristic of the first acoustic wave resonator and the comb-tooth capacitance, since the Q value drops due to the drop of the Q value of the comb-tooth type capacitance, it is difficult to secure a required Q value. Therefore, by narrowing the electrode finger pitch Pc1 and driving the self-resonance point of the comb-tooth type capacitance to the higher-band side than the resonant frequency and the anti-resonant frequency of the first acoustic wave resonator, it is possible to suppress the Q value of the combined characteristics of the first acoustic wave resonator and the comb-tooth capacitance from dropping and to secure the required Q value.

For example, in the case of the filter 10 (a filter in an 800 MHz to 900 MHz band) of the first embodiment, the electrode finger pitch Pp1 of the parallel arm resonator p1 connected to the capacitance element C1 is 2.2 µm. Accordingly, in the first embodiment, by setting the electrode finger pitch Pc1 of the capacitance element C1 to be less than 2.2 µm, the self-resonance point of the capacitance element C1 can be sufficiently driven from the 800 MHz band to the higher-band side. Therefore, both of the Q value of the parallel arm resonator p1 and the Q value of the capacitance element C1 can be secured.

Additionally, as a matter of course, as the electrode finger pitch Pc1 decreases, the capacitance element C1 can be reduced in size while maintaining the capacitance value, and thus miniaturization and space saving of the filter or the like including the capacitance element C1 can be achieved.

[4.5 Relation with Electrode Finger Film Thickness]

Next, descriptions will be given of a relation between the film thickness of the electrode fingers and the characteristics of the comb-tooth type capacitance of the typical example. Note that at this time, the design parameters other than the film thickness of the electrode fingers are constant, the electrode duty is 0.60 (that is, $Wc1/Pc1=0.60$), and the electrode finger pitch Pc1 is 2.50 µm.

Figure 14A:
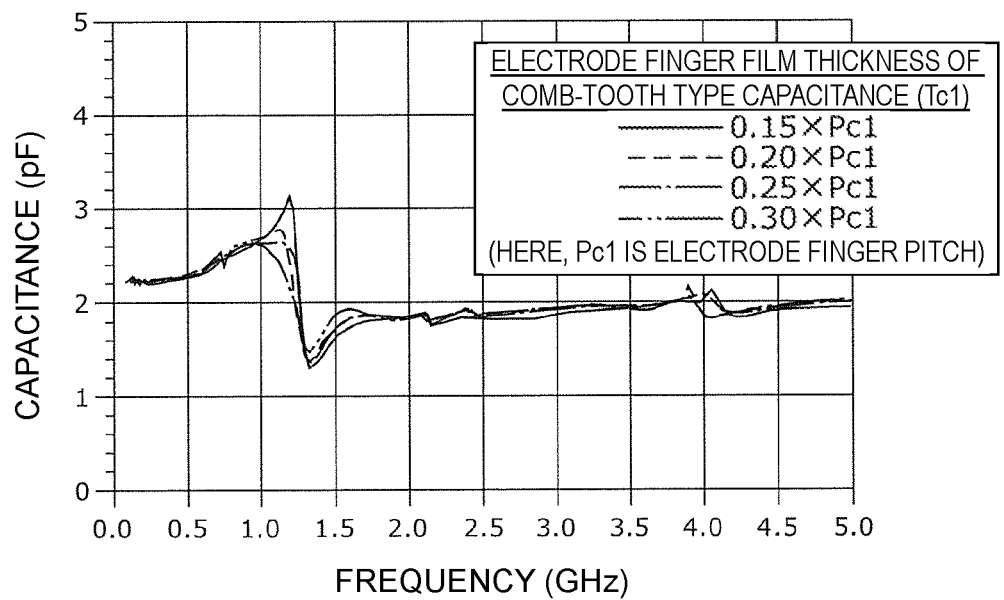
FIG. 14A is a graph showing a relation between a film thickness and the capacitance value of the comb-tooth capacitance in the typical example.
Figure 14B:
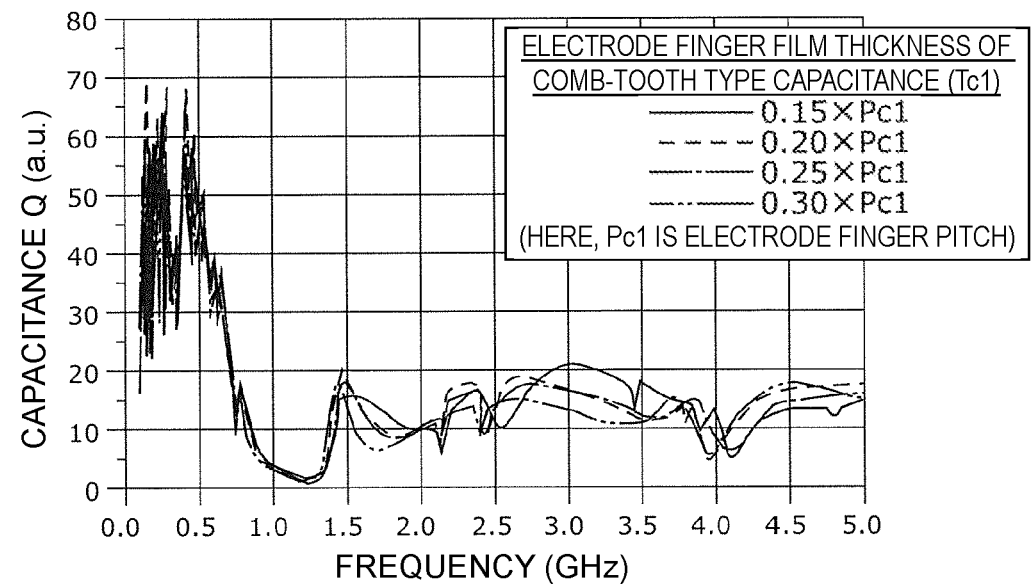
FIG. 14B is a graph showing a relation between the film thickness and the capacitance Q of the comb-tooth capacitance in the typical example.

FIG. 14A is a graph showing a relation between the film thickness Tc1 of the electrode fingers and the capacitance value of the comb-tooth type capacitance in the typical example. FIG. 14B is a graph showing a relation between the film thickness Tc1 of the electrode fingers and the capacitance Q of the comb-tooth type capacitance in the typical example. Specifically, these graphs each show frequency characteristics when a ratio of the film thickness Tc1 to the electrode finger pitch Pc1 is set to 0.15, 0.20, 0.25, and 0.30.

As shown in these graphs, even if the film thickness Tc1 of the electrode fingers is changed, there is no noticeable change in both the capacitance value and the capacitance Q. Therefore, the film thickness Tc1 of the electrode fingers may be appropriately determined from a viewpoint of manufacturing.

As for this, for the reasons in manufacturing, the upper limit of the film thickness Tc1 of the electrode fingers is limited by the electrode finger pitch Pc1, and specifically, it is necessary to design the film thickness Tc1 to be equal to or less than 40% of the electrode finger pitch Pc1. However, variation in the line width Wc1 of the electrode finger increases if the film thickness Tc1 is too thick, and the resistance of the electrode fingers increases if the film thickness Tc1 is too thin, and it is thus preferable that the film thickness Tc1 be approximately 20% of the electrode finger pitch Pc1. Here, the approximately 20% is not limited to 20%, and also includes an error range of approximately several percent.

[4.6 Relation with Electrode Duty]

Next, descriptions will be given of a relation between the electrode duty (duty ratio) and the characteristics of the comb-tooth type capacitance of the typical example. Note that at this time, the design parameters other than the electrode duty are constant, the electrode finger pitch Pc1 is 2.50 and the ratio of the film thickness to the electrode finger pitch is 0.20 (that is, Tc1=0.20×Pc1).

Figure 15A:
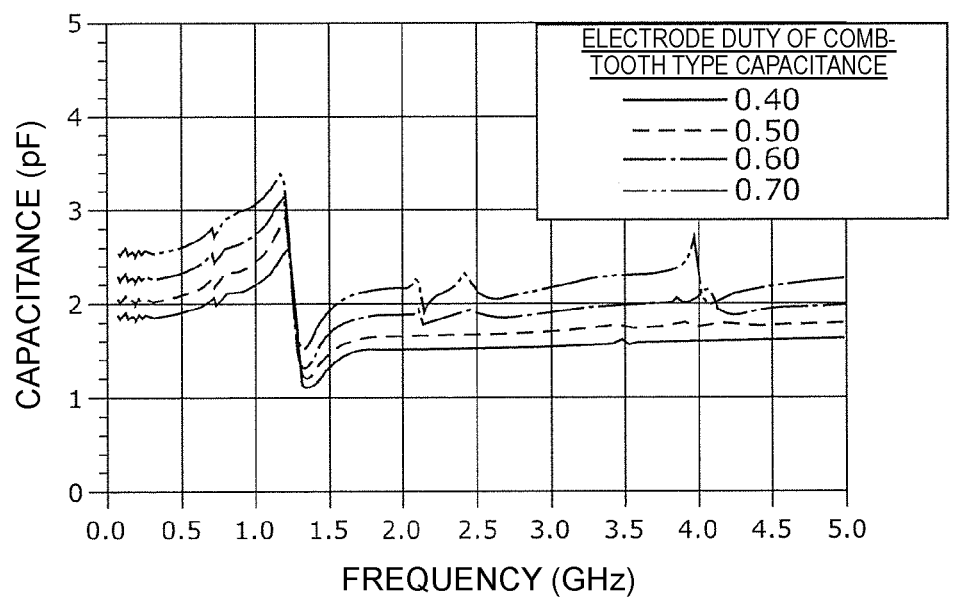
FIG. 15A is a graph showing a relation between an electrode duty and the capacitance value of the comb-tooth capacitance in the typical example.
Figure 15B:
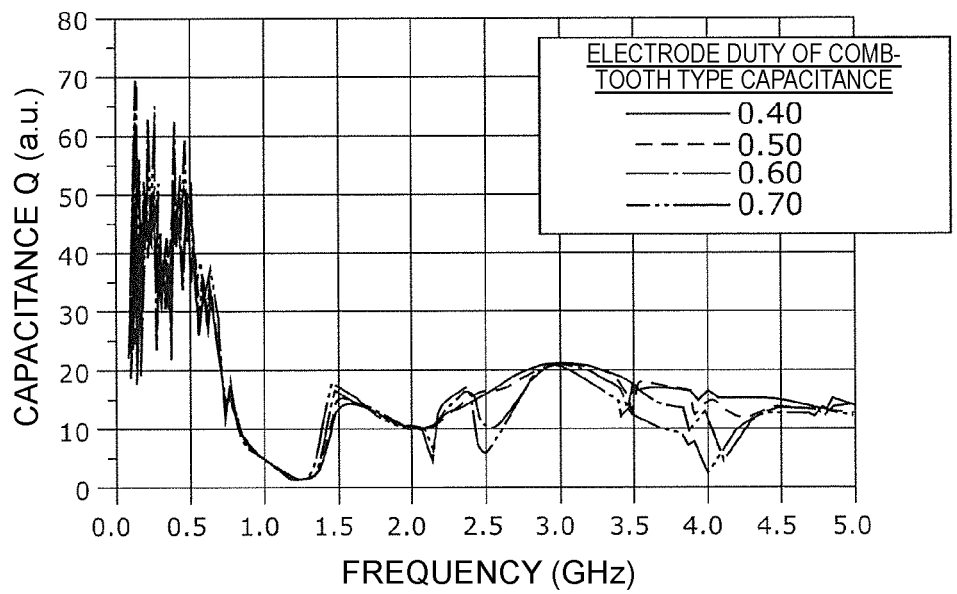
FIG. 15B is a graph showing a relation between the electrode duty and the capacitance Q of the comb-tooth capacitance in the typical example.

FIG. 15A is a graph showing a relation between the electrode dutys of the electrode fingers and the capacitance value of the comb-tooth type capacitance in the typical example. FIG. 15B is a graph showing a relation between the electrode duty of the electrode fingers and the capacitance Q of the comb-tooth type capacitance in the typical example. Specifically, these graphs each show frequency characteristics when the electrode duty is set to 0.40, 0.50, 0.60, and 0.70.

As shown in FIG. 15A, as the electrode duty increases, the capacitance value increases. On the other hand, as shown in FIG. 15B, even if the electrode duty is changed, there is no noticeable change in the capacitance Q.

Accordingly, since the comb-tooth type capacitance can increase the capacitance value per unit area by increasing the electrode duty, miniaturization and space saving can be achieved.

[4.7 Summary of Filter Electrode Structure]

As described above, in the filter 10 according to the present embodiment, the electrode finger pitch Pc1 of the plurality of electrode fingers 131a of the capacitance element C1 may be narrower than the electrode finger pitch Pp1 of the plurality of electrode fingers 121a of the parallel arm resonator p1 (first acoustic wave resonator), and the film thickness Tc1 of the plurality of electrode fingers 131a of the capacitance element C1 may be smaller than the film thickness Tp1 of the plurality of electrode fingers 121a of the parallel arm resonator p1.

Here, in the capacitance element C1, as the electrode finger pitch Pc1 narrows, the self-resonance point at which the Q value (capacitance Q) of the capacitance element C1 locally drops shifts to the higher-band side. Therefore, by making the electrode finger pitch Pc1 of the capacitance element C1 narrower than the electrode finger pitch Pp1 of the parallel arm resonator p1 and driving the self-resonance point of the capacitance element C1 to the higher-band side than the pass band of the filter 10, it is possible to increase the Q value of the capacitance element C1 in the pass band. In addition, when the frequency of the self-resonance point of the capacitance element C1 is identical to the frequency of the resonance point or the anti-resonance point of the parallel arm resonator p1 (first acoustic wave resonator), due to the drop of the capacitance Q of the capacitance element C1 connected to the parallel arm resonator p1 without interposing another acoustic wave resonator, the Q value of the resonance point or the anti-resonance point obtained by the combined characteristics of the parallel arm resonator p1 and the capacitance element C1 drops. Therefore, by narrowing the electrode finger pitch Pc1 and driving the self-resonance point of the comb-tooth type capacitance to the higher-band side than the resonant frequency and the anti-resonant frequency of the parallel arm resonator p1, it is possible to suppress the Q value of the combined characteristics of the parallel arm resonator p1 and the capacitance element C1 from dropping and to secure the required Q value. However, for the reasons in manufacturing, the electrode finger pitch is limited by the film thickness of the electrode fingers. Therefore, by making the film thickness Tc1 of the electrode fingers 131a of the capacitance element C1 smaller than the film thickness Tp1 of the electrode fingers 121a of the parallel arm resonator p1, the electrode finger pitch Pc1 of the capacitance element C1 can be made narrower, which makes it easier for both the Q value of the parallel arm resonator p1 and the Q value of the capacitance element C1 to be secured. Thus, with the filter 10 according to the present embodiment, since both the Q value of the parallel arm resonator p1 and the Q value of the capacitance element C1 can be secured, it is possible to suppress the loss in the pass band and to increase the steepness of an attenuation slope.

Furthermore, in the filter 10 according to the present embodiment, the capacitance element C1 is connected to the parallel arm resonator p1 (first acoustic wave resonator) without interposing another acoustic wave resonator. The parallel arm resonator p1 as described above is particularly susceptible to the influence of the Q value of the capacitance element C1 in the combined characteristics with the capacitance element C1. Therefore, setting the electrode finger pitch and the film thickness of each of the parallel arm resonator p1 and the capacitance element C1 so as to satisfy the above-described relationships (Pc1<Pp1 and Tc1<Tp1) is particularly useful in order to suppress the loss in the pass band and increase the steepness of the attenuation slope.

Furthermore, in the filter 10 according to the present embodiment, the film thickness Tc1 of the electrode fingers 131a of the capacitance element C1 may be equal to or less than 40% of the electrode finger pitch Pc1 of the capacitance element C1 (the pitch of the electrode fingers 131a). Here, for the reasons in manufacturing, the upper limit of the film thickness Tc1 of the electrode fingers 131a is limited by the electrode finger pitch Pc1. Therefore, by keeping the film thickness Tc1 of the electrode fingers 131a of the capacitance element C1 within an appropriate range, it is possible to manufacture the capacitance element C1 capable of securing the Q value.

Furthermore, in the filter 10 according to the present embodiment, the electrode finger pitch Pc1 of the capacitance element C1 may be equal to or less than 80% of the electrode finger pitch Pp1 of the parallel arm resonator p1 (first acoustic wave resonator). Here, when the electrode finger pitch Pc1 of the capacitance element C1 is increased and approaches the electrode finger pitch Pp1 of the parallel arm resonator p1, the following problem may occur. That is, by the frequency of the self-resonance point of the capacitance element C1 approaching the frequency of the anti-resonance point of the parallel arm resonator p1, due to the drop of the capacitance Q at the self-resonance point, the Q value of the anti-resonance point obtained by the combined characteristics of the parallel arm resonator p1 and the capacitance element C1 may drop. Accordingly, by keeping the electrode finger pitch Pc1 of the capacitance element C1 within an appropriate range, it is possible to more reliably secure the Q value obtained by the combined characteristics of the parallel arm resonator p1 and the comb-tooth capacitance.

(Other Modification of Variable Filter Circuit)

The configurations of the variable filters 10, 10A, 10B and 10C according to the first to fourth embodiments can be applied to a configuration of another tunable filter. Accordingly, as modifications of the variable filters according to the first to fourth embodiments, configurations and filter characteristics of other tunable filters will be described below.

Note that in the circuit configurations of the variable filters described in the following first to sixth modifications, although the capacitance element C2 (second capacitance element) which is a required constituent element of the variable filter according to the present disclosure is not explicitly illustrated, the capacitance element C2 is connected and arranged between the node x1 on the path connecting the input and output terminal 11m to the input and output terminal 11n and the ground or the frequency variable circuit in any circuit configurations.

[5.1 First Modification of Filter Circuit]

In the first embodiment, as an example of the frequency variable circuit 11, the descriptions have been given using the parallel connection circuit of the switch SW and the capacitance element C1. However, the frequency variable circuit is not limited to the configuration as described above.

Figure 16A:
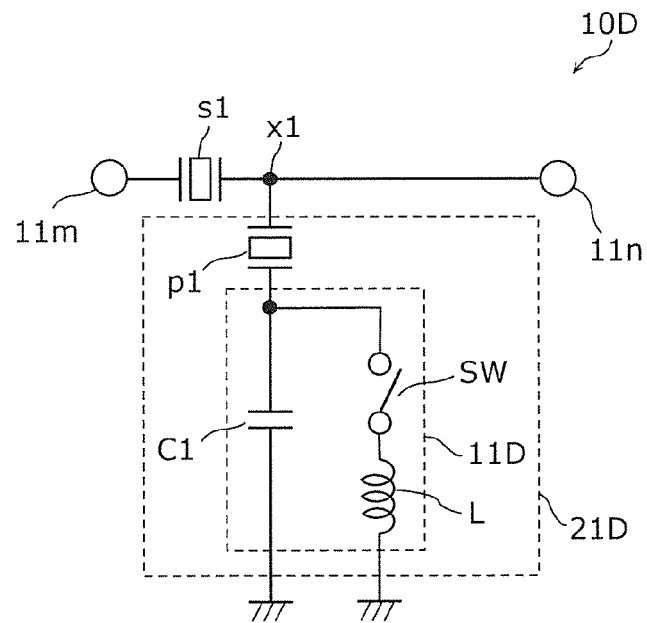
FIG. 16A is a circuit configuration diagram of a variable filter according to a first modification of the first embodiment.

FIG. 16A is a diagram illustrating part of a circuit configuration of a variable filter 10D according to a first modification of the first embodiment.

The variable filter 10D illustrated in the diagram further includes an inductor L connected in series to the switch SW, as compared with the variable filter 10 illustrated in FIG. 1A. In other words, in the present modification, by connecting a circuit in which the switch SW and the inductor L are connected in series to each other in parallel to the capacitance element C1, a frequency variable circuit 11D is configured. Furthermore, by connecting the frequency variable circuit 11D to the parallel arm resonator p1 (first acoustic wave resonator), a parallel arm resonance circuit 21D (first resonance circuit) is configured.

Note that the connection order between the switch SW and the inductor L is not particularly limited, and may be reversed from the connection order illustrated in FIG. 16A.

Figure 16B:
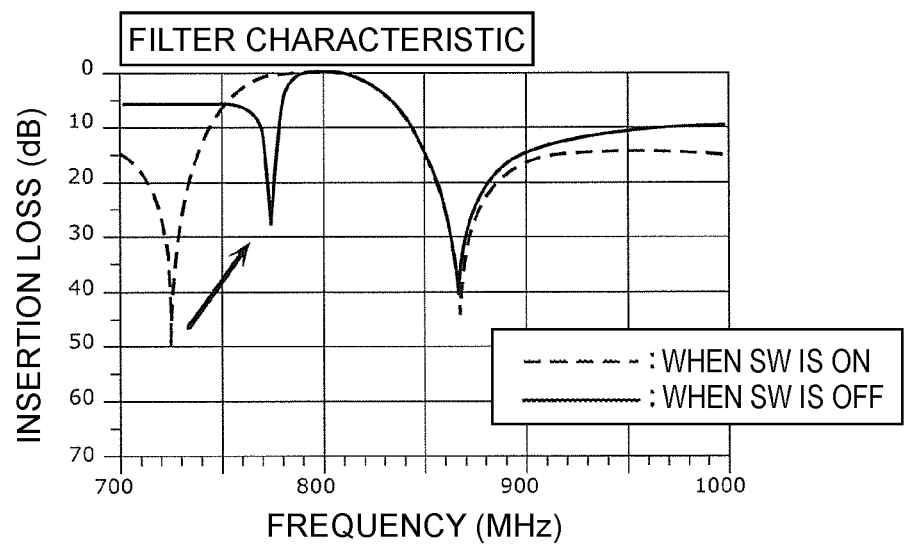
FIG. 16B is a graph showing a bandpass characteristic of the variable filter according to the first modification of the first embodiment.

FIG. 16B is a graph showing a bandpass characteristic of the variable filter 10D according to the first modification of the first embodiment. Specifically, the figure is a graph showing a comparison of the bandpass characteristics when the switch SW is on/off.

In the variable filter 10D, the anti-resonant frequency of the parallel arm resonance circuit 21D and the resonant frequency of the serial arm resonance circuit (in the present modification, the serial arm resonator s1) are brought close to each other to form the pass band.

At this time, in the present modification, to the parallel arm resonator p1, the inductor L is added when the switch SW is on, and the capacitance element C1 is added when the switch SW is off. Therefore, the resonant frequency of the parallel arm resonance circuit 21D shifts to the lower-band side than the resonant frequency of the parallel arm resonator p1 alone when the switch SW is off, and shifts to the higher-band side than the resonant frequency of the parallel arm resonator p1 alone when the switch SW is on. Accordingly, as shown in the graph, the variable filter 10D according to the present modification can widen the frequency variable width of the pass band in comparison with the variable filter 10 according to the first embodiment.

In this regard, the frequency variable width of the pass band of the variable filter 10D depends on the constants of the capacitance element C1 and the inductor L, and as the constant of the inductor increases, for example, the frequency variable width becomes wider. Therefore, the constant of the inductor L can be determined as appropriate based on the frequency specification required for the variable filter 10D. Furthermore, the inductor may be a variable inductor using MEMS (Micro Electro Mechanical Systems). With this, it is possible to finely adjust the frequency variable width.

In the variable filter 10D described above, the capacitance element C1 is configured of the comb-tooth capacitance electrode formed of the plurality of electrode fingers and the substrate. Additionally, although not illustrated in FIG. 16A, the capacitance element C2 is arranged between the node x1 and the ground or the frequency variable circuit 11D. Here, the capacitance element C2 is formed by the wiring, which is not connected to the capacitance element C1, of the IDT wirings connected to the IDT electrode of the parallel arm resonator p1 and the capacitance wiring connected to the capacitance element C1 intersecting with each other in the intersecting region. In other words, the capacitance element C2 is the multilayer type capacitor using the capacitance wiring in the intersection region and the IDT wiring in the intersection region as the opposite electrodes.

With this, in the capacitance element C2, the film thicknesses and the electrode areas of the opposite electrodes can be adjusted without being limited by the film thickness of the IDT electrode defined by the propagation characteristics of the acoustic wave, and thus the capacitance Q value can be increased. On the other hand, the capacitance element C1 can secure the large capacitance value. Accordingly, since the steepness of the pass band on the low-band side and the low loss characteristic of the pass band are secured, the bandpass characteristic of the variable filter 10D is improved.

Note that the capacitance element C1 and the inductor L as described above may be reversed and provided. In other words, a circuit in which the switch SW and the capacitance element C1 are connected in series to each other may be connected in parallel to the inductor L. According to this configuration, a shift direction of the attenuation pole when the switch SW is turned on/off becomes opposite from that of the variable filter 10D according to the first modification.

[5.2 Second Modification of Filter Circuit]

In the first embodiment and the first modification, one parallel arm resonator p1 (first acoustic wave resonator) is provided between the node x1 and the ground. However, a parallel arm resonator (third acoustic wave resonator) different from the parallel arm resonator p1 may be provided between the node x1 and the ground.

Figure 17A:
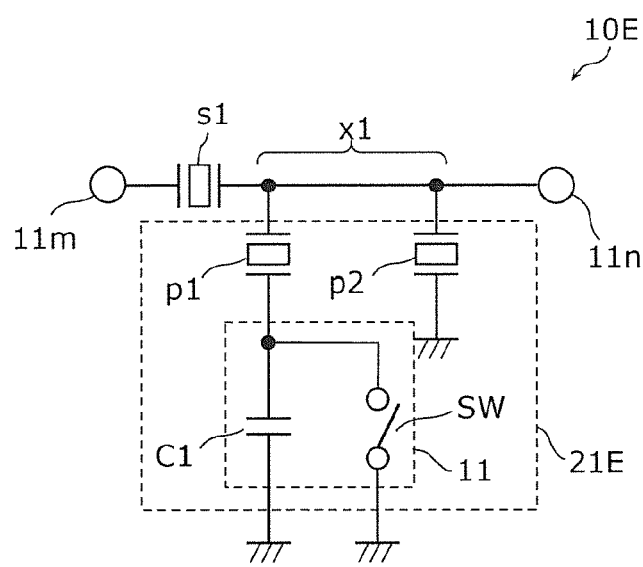
FIG. 17A is a circuit configuration diagram of a variable filter according to a second modification of the first embodiment.

FIG. 17A is a circuit configuration diagram of a filter 10E according to a second modification of the first embodiment.

The variable filter 10E illustrated in the diagram includes a parallel arm resonance circuit 21E (first resonance circuit) instead of the parallel arm resonance circuit 21 (first resonance circuit) included in the variable filter 10 illustrated in FIG. 1A. In comparison with the parallel arm resonance circuit 21, this parallel arm resonance circuit 21E further includes the parallel arm resonator p2 (third acoustic wave resonator) which is connected in parallel to the parallel arm resonator p1 (first acoustic wave resonator) between the node x1 and the ground and has a resonant frequency and an anti-resonant frequency different from those of the parallel arm resonator p1. In other words, the parallel arm resonator p1 and the parallel arm resonator p2 are connected to one node x1 on the serial arm connecting the input and output terminal 11m and the input and output terminal 11n. With this configuration, the variable filter 10E can perform frequency shift for at least one of the attenuation pole of the pass band on the low-band side and the attenuation pole of the pass band on the high-band side. Here, "one node" includes not only one point on a transmission line but also two different points located on one transmission line without interposing a resonator or an impedance element therebetween.

Specifically, the parallel arm resonator p2 has the higher resonant frequency and anti-resonant frequency than those of the parallel arm resonator p1, and the frequency variable circuit 11 is connected in series only to the parallel arm resonator p1 of the parallel arm resonator p1 and the parallel arm resonator p2. In other words, the parallel arm resonator p2 is connected in parallel to a circuit in which the parallel arm resonator p1 and the frequency variable circuit 11 are connected in series to each other.

In the parallel arm resonance circuit 21E configured as described above, the impedance is minimized at the resonant frequency of each of the parallel arm resonators p1 and p2. In other words, the parallel arm resonance circuit 21E has two resonant frequencies. In addition, in the parallel arm resonance circuit 21E, the impedance is maximized in a frequency band between the two resonant frequencies and in a frequency band on a higher-band side than the two resonant frequencies. In other words, the parallel arm resonance circuit 21E has two anti-resonant frequencies.

Figure 17B:
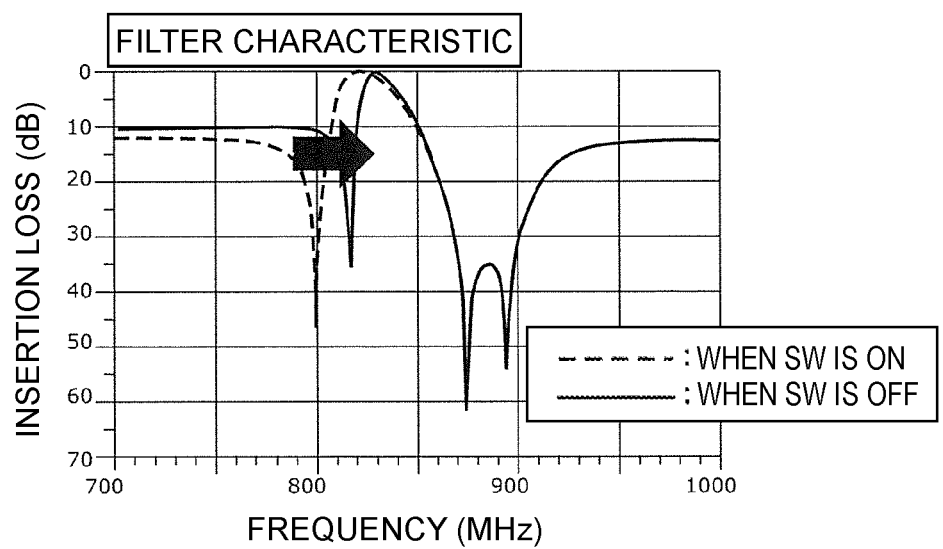
FIG. 17B is a graph showing a bandpass characteristic of the variable filter according to the second modification of the first embodiment.

FIG. 17B is a graph showing a bandpass characteristic of the variable filter 10E according to the second modification of the first embodiment. Specifically, the figure is a graph showing a comparison of the bandpass characteristics when the switch SW is on/off.

In the variable filter 10E, the anti-resonant frequency of two anti-resonant frequencies of the parallel arm resonance circuit 21E on the low-band side and the resonant frequency of the serial arm resonance circuit (in the present modification, the serial arm resonator s1) are brought close to each other to form the pass band.

At this time, in the present modification, to the parallel arm resonator p1, only when the switch SW is off, the capacitance element C1 is added. Therefore, the resonant frequency of the two resonant frequencies of the parallel arm resonance circuit 21E on the low-band side shifts to the higher-band side than the resonant frequency of the parallel arm resonator p1 alone when the switch SW is off. Additionally, the anti-resonant frequency of the parallel arm resonance circuit 21E on the low-band side shifts to the higher-band side than that when the switch SW is on, when the switch SW is off. Here, the attenuation pole of the pass band on the low-band side of the variable filter 10E is defined by the anti-resonant frequency of the parallel arm resonance circuit 21E on the low-band side. Additionally, the steepness of the attenuation slope of the pass band on the low-band side is defined by a difference frequency between the resonant frequency of on the low-band side and the anti-resonant frequency on the low-band side of the parallel arm resonance circuit 21E. Therefore, as shown in the graph, in the variable filter 10E, by switching the switch SW from on to off, while shifting the attenuation pole of the pass band on the low-band side to the higher-band side, without dropping the shoulder of the pass band on the low-band side, the pass band can be shifted to the higher-band side.

In the variable filter 10E described above, the capacitance element C1 is configured of the comb-tooth capacitance electrode formed of the plurality of electrode fingers and the substrate. Additionally, although not illustrated in FIG. 17A, the capacitance element C2 is arranged between the node x1 and the ground or the frequency variable circuit 11. Here, the capacitance element C2 is formed by the wiring, which is not connected to the capacitance element C1, of the IDT wirings connected to the IDT electrode of the parallel arm resonator p1 and the capacitance wiring connected to the capacitance element C1 intersecting with each other in the intersecting region. In other words, the capacitance element C2 is the multilayer type capacitor using the capacitance wiring in the intersection region and the IDT wiring in the intersection region as the opposite electrodes.

With this, in the capacitance element C2, the film thicknesses and the electrode areas of the opposite electrodes can be adjusted without being limited by the film thickness of the IDT electrode defined by the propagation characteristics of the acoustic wave, and thus the capacitance Q value can be increased. On the other hand, the capacitance element C1 can secure the large capacitance value. Accordingly, since the steepness of the pass band on the low-band side and the low loss characteristic of the pass band are secured, the bandpass characteristic of the variable filter 10E is improved.

[5.3 Third Modification of Filter Circuit]

In the second modification of the first embodiment, the frequency variable circuit 11 is connected in series only to the parallel arm resonator p1 of the parallel arm resonator p1 and the parallel arm resonator p2. However, the frequency variable circuit 11 may be connected in series only to the parallel arm resonator p2 of the parallel arm resonator p1 and the parallel arm resonator p2.

In other words, in the first embodiment and the first and second modifications, as an example of the first acoustic wave resonator connected to the capacitance element C1 without interposing another acoustic wave resonator, the descriptions have been given using the parallel arm resonator p1 having the resonant frequency on the lower-band side than the pass band of the filter. In contrast, in the present modification, as an example of the first acoustic wave resonator, descriptions will be given using the parallel arm resonator p2 having the resonant frequency on the higher-band side than the pass band of the filter.

In other words, in the present modification, the electrode finger pitch of the capacitance element C1 is narrower than the electrode finger pitch of the parallel arm resonator p2 (first acoustic wave resonator). In addition, the film thickness of the plurality of electrode fingers 131a of the capacitance element C1 is smaller than the film thickness of the plurality of electrode fingers of the parallel arm resonator p2.

Figure 18A:
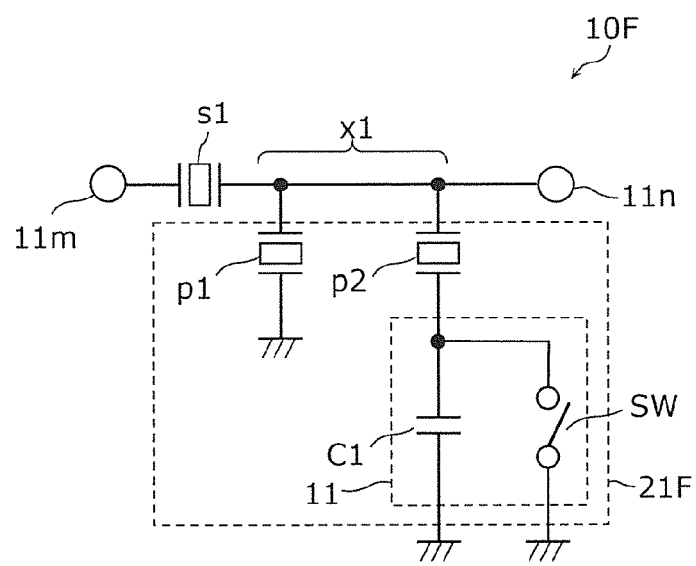
FIG. 18A is a circuit configuration diagram of a variable filter according to a third modification of the first embodiment.

FIG. 18A is a circuit configuration diagram of a variable filter 10F according to a third modification of the first embodiment.

The variable filter 10E illustrated in the diagram includes a parallel arm resonance circuit 21F (first resonance circuit) in which the frequency variable circuit 11 is connected in series only to the parallel arm resonator p2 of the parallel arm resonator p1 and the parallel arm resonator p2 instead of the parallel arm resonance circuit 21E (first resonance circuit) included in the variable filter 10F illustrated in FIG. 17A.

In other words, in the present modification, the parallel arm resonator p1 having the lower resonant frequency and anti-resonant frequency than those of the parallel arm resonator p2 (first acoustic wave resonator) is connected in parallel to the parallel arm resonator p2, and corresponds to the third acoustic wave resonator having a resonant frequency and an anti-resonant frequency different from those of the parallel arm resonator p2.

Figure 18B:
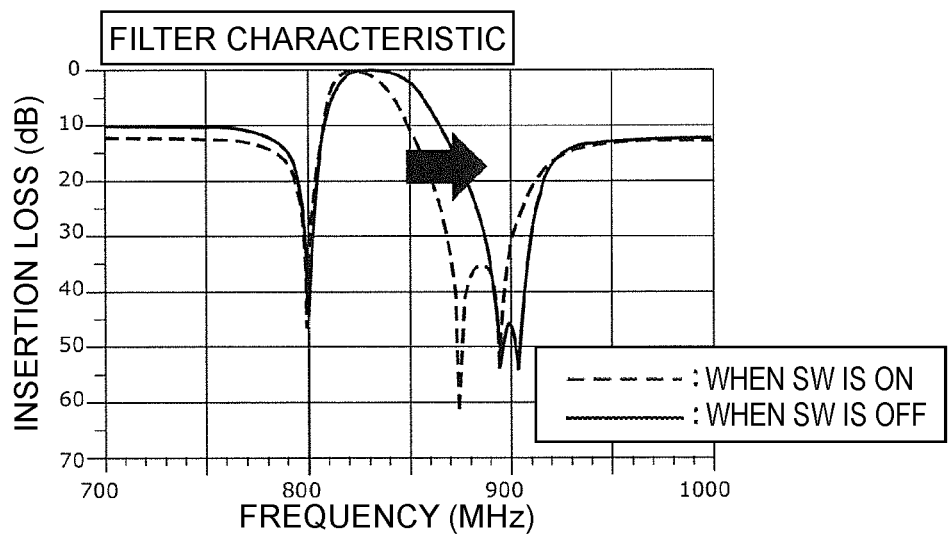
FIG. 18B is a graph showing a bandpass characteristic of the variable filter according to the third modification of the first embodiment.

FIG. 18B is a graph showing a bandpass characteristic of the variable filter 10F according to the third modification of the first embodiment. Specifically, the figure is a graph showing a comparison of the bandpass characteristics when the switch SW is on/off.

In the variable filter 10F, in the same manner as the variable filter 10E, the anti-resonant frequency of two anti-resonant frequencies of the parallel arm resonance circuit 21F on the low-band side and the resonant frequency of the serial arm resonance circuit (in the present modification, the serial arm resonator s1) are brought close to each other to form the pass band.

At this time, in the present modification, to the parallel arm resonator p2, only when the switch SW is off, the capacitance element C1 is added. Therefore, the resonant frequency of the two resonant frequencies of the parallel arm resonance circuit 21F on the high-band side shifts to the higher-band side than the resonant frequency of the parallel arm resonator p2 alone when the switch SW is off. Additionally, the anti-resonant frequency of the parallel arm resonance circuit 21F on the low-band side shifts to the higher-band side than that when the switch SW is on, when the switch SW is off. Here, the attenuation pole of the pass band on the high-band side of the variable filter 10F is defined by the anti-resonant frequency of the parallel arm resonance circuit 21F on the high-band side. Additionally, the steepness of the attenuation slope of the pass band on the high-band side is defined by a difference frequency between the resonant frequency on the high-band side and the anti-resonant frequency on the low-band side of the parallel arm resonance circuit 21F. Therefore, as shown in the graph, in the variable filter 10F, by switching the switch SW from on to off, while shifting the attenuation pole of the pass band on the high-band side to the higher-band side, without dropping the shoulder of the pass band on the low-band side, the pass band can be shifted to the higher-band side.

In the variable filter 10F described above, the capacitance element C1 is configured of the comb-tooth capacitance electrode formed of the plurality of electrode fingers and the substrate. Additionally, although not illustrated in FIG. 18A, the capacitance element C2 is arranged between the node x1 and the ground or the frequency variable circuit 11. Here, the capacitance element C2 is formed by the wiring, which is not connected to the capacitance element C1, of the IDT wirings connected to the IDT electrode of the parallel arm resonator p1, and the capacitance wiring connected to the capacitance element C1 intersecting with each other in the intersecting region. In other words, the capacitance element C2 is the multilayer type capacitor using the capacitance wiring in the intersection region and the IDT wiring in the intersection region as the opposite electrodes.

With this, in the capacitance element C2, the film thicknesses and the electrode areas of the opposite electrodes can be adjusted without being limited by the film thickness of the IDT electrode defined by the propagation characteristics of the acoustic wave, and thus the capacitance Q value can be increased. On the other hand, the capacitance element C1 can secure the large capacitance value. Accordingly, since the steepness of the pass band on the low-band side and the low loss characteristic of the pass band are secured, the bandpass characteristic of the variable filter 10F is improved.

[5.4 Fourth Modification of Filter Circuit]

In the second modification of the first embodiment, the variable filter 10E includes the frequency variable circuit 11 connected in series only to the parallel arm resonator p1 of the parallel arm resonator p1 and the parallel arm resonator p2. Additionally, in the third modification of the first embodiment, the variable filter 10F includes the frequency variable circuit 11 connected in series only to the parallel arm resonator p2 of the parallel arm resonator p1 and the parallel arm resonator p2. However, the filter may include both of the frequency variable circuits 11 as described above.

Figure 19A:
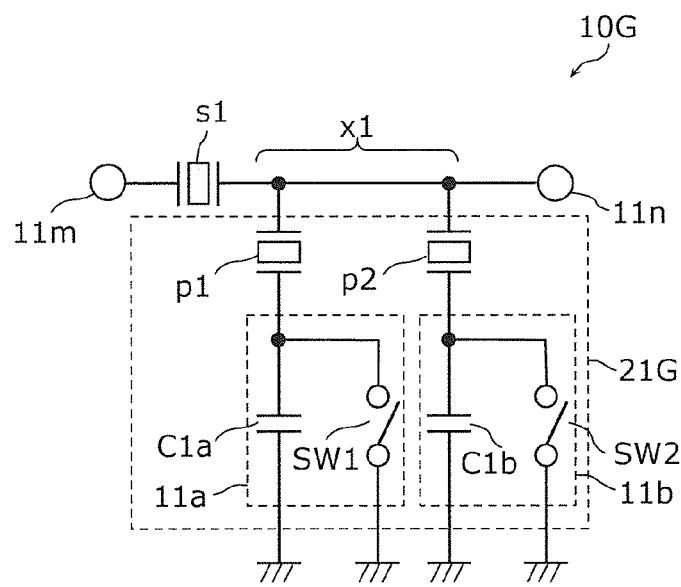
FIG. 19A is a circuit configuration diagram of a variable filter according to a fourth modification of the first embodiment.

FIG. 19A is a circuit configuration diagram of a variable filter 10G according to a fourth modification of the first embodiment.

The variable filter 10G illustrated in the diagram includes both the frequency variable circuit 11a that corresponds to the frequency variable circuit 11 included in the filter 10E illustrated in FIG. 17A and the frequency variable circuit 11b that corresponds to the frequency variable circuit 11 included in the variable filter 10F illustrated in FIG. 18A. In other words, a parallel arm resonance circuit 21G (first resonance circuit) in the present modification includes the frequency variable circuit 11a connected in series only to one of the parallel arm resonators p1 and p2 (first acoustic wave resonator and third acoustic wave resonator), and the frequency variable circuit 11b connected in series only to the other of the parallel arm resonators p1 and p2 (first acoustic wave resonator and third acoustic wave resonator).

Figure 19B:
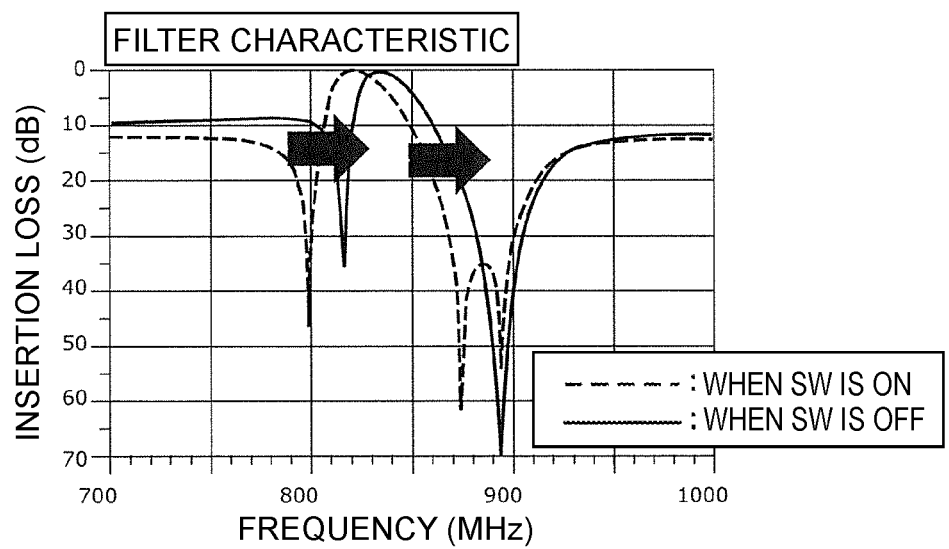
FIG. 19B is a graph showing a bandpass characteristic of the variable filter according to the fourth modification of the first embodiment.

FIG. 19B is a graph showing a bandpass characteristic of the variable filter 10G according to the fourth modification of the first embodiment. Specifically, the figure is a graph showing a comparison of the bandpass characteristics when the switches SW1 and SW2 are both on/both off.

In the present modification, to the parallel arm resonator p1, only when the switch SW1 is off, a capacitance element C1a is added. Additionally, to the parallel arm resonator p2, only when the switch SW2 is off, a capacitance element C1b is added. Accordingly, the resonant frequency of the two resonant frequencies of the parallel arm resonance circuit 21G on the low-band side shifts to the higher-band side than the resonant frequency of the parallel arm resonator p1 alone when the switch SW1 is off. Additionally, the resonant frequency on the high-band side of the two resonant frequencies of the parallel arm resonance circuit 21G shifts to the higher-band side than the resonant frequency of the parallel arm resonator p2 alone when the switch SW2 is off. Additionally, the anti-resonant frequency of the parallel arm resonance circuit 21G on the low-band side shifts to the higher-band side than that when both the switches SW1 and SW2 are on, when at least one of the switches SW1 and SW2 is off.

Therefore, as shown in the graph, in the variable filter 10G, by switching both the switches SW1 and SW2 from on to off, while shifting the attenuation poles of the pass band on the high-band side and of the pass band on the low-band side to the higher-band side, without dropping the shoulders of the pass band on the high-band side and of the pass band on the low-band side, the pass band can be shifted to the higher-band side. As a result, the variable filter 10G can shift a center frequency while maintaining the band width, for example.

Note that from a viewpoint of the filter bandpass characteristic, it is preferable that the frequency variable circuits 11a and 11b include the capacitance elements C1a and C1b, but in consideration of the bandpass characteristic, a size, and the like required for the variable filter 10G, one of the frequency variable circuits 11a and 11b may have, for example, a capacitance configured by being laminated on the substrate 102 or a variable capacitor such as a varicap and a DTC (Digital Tunable Capacitor) instead of the comb-tooth capacitance.

Furthermore, the variable filter 10G needs not turn both the switches SW1 and SW2 on/off, and may individually turn these switches on/off. However, when the switches SW1 and SW2 both are turned on/off, the number of control lines for controlling the switches SW1 and SW2 can be reduced, so that the configuration of the variable filter 10G can be simplified.

On the other hand, when these switches are individually turned on/off, it is possible to increase the variation on the pass band which can be switched by the variable filter 10G.

Specifically, in accordance with the on or off state of the switch SW2 connected in series to the parallel arm resonator p2, a high-band end of the pass band can be varied. Additionally, in accordance with the on or off state of the switch SW1 connected in series to the parallel arm resonator p1, a low-band end of the pass band can be varied.

Accordingly, by turning both the switches SW1 and SW2 on or off, both the low-band end and the high-band end of the pass band can be shifted to the lower-band side or the higher-band side. In other words, it is possible to shift the center frequency of the pass band to the lower-band side or the higher-band side. Furthermore, by switching one of the switches SW1 and SW2 from on to off and switching the other from off to on, it is possible to shift both the low-band end and the high-band end of the pass band so as to widen or narrow the frequency difference therebetween. In other words, it is possible to vary the pass band width while maintaining the center frequency of the pass band at a substantially constant frequency. Additionally, in a state in which one of the switches SW1 and SW2 is on or off, by turning the other on or off, it is possible to shift, in a state in which one of the low-band end and the high-band end of the pass band is fixed, the other to the lower-band side or the higher-band side. In other words, it is possible to vary the low-band end or the high-band end of the pass band.

As described above, the variable filter 10G includes the frequency variable circuit 11a which is connected in series only to the parallel arm resonator p1 of the parallel arm resonator p1 and the parallel arm resonator p2 and the frequency variable circuit 11b which is connected in series only to the parallel arm resonator p2 of the parallel arm resonator p1 and the parallel arm resonator p2, which makes it possible to enhance the degree of freedom for varying the pass band.

In the variable filter 10G described above, the capacitance elements C1a and C1b are each configured of the comb-tooth capacitance electrode formed of the plurality of electrode fingers and the substrate. Additionally, although not illustrated in FIG. 19A, the capacitance element C2 is arranged between the node x1 and the ground or the frequency variable circuits 11a and 11b. Here, the capacitance element C2 is formed by the wiring, which is not connected to the capacitance elements C1a and C1b, of the IDT wirings connected to the IDT electrode of the parallel arm resonator p1 and the capacitance wiring connected to the capacitance element C1a or C1b intersecting with each other in the intersecting region. In other words, the capacitance element C2 is the multilayer type capacitor using the capacitance wiring in the intersection region and the IDT wiring in the intersection region as the opposite electrodes.

With this, in the capacitance element C2, the film thicknesses and the electrode areas of the opposite electrodes can be adjusted without being limited by the film thickness of the IDT electrode defined by the propagation characteristics of the acoustic wave, and thus the capacitance Q value can be increased. On the other hand, the capacitance elements C1a and C1b can secure the large capacitance value. Accordingly, since the steepness of the pass band on the low-band side and the low loss characteristic of the pass band are secured, the bandpass characteristic of the variable filter 10G is improved.

[5.5 Fifth Modification of Filter Circuit]

In the second modification of the first embodiment, the frequency variable circuit 11 is connected in series only to the parallel arm resonator p1 of the parallel arm resonator p1 and the parallel arm resonator p2. Furthermore, in the third modification of the first embodiment, the frequency variable circuit 11 is connected in series only to the parallel arm resonator p2 of the parallel arm resonator p1 and the parallel arm resonator p2. However, the frequency variable circuit 11 may be connected in series to a circuit in which the parallel arm resonator p1 and the parallel arm resonator p2 are connected in parallel to each other.

Figure 20A:
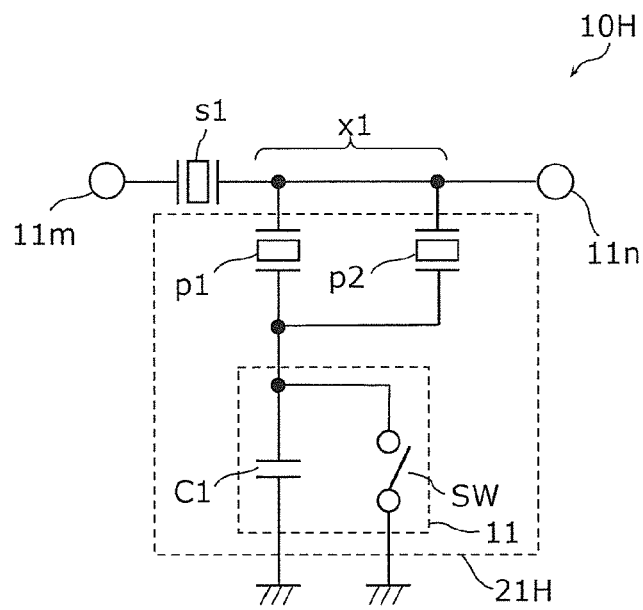
FIG. 20A is a circuit configuration diagram of a variable filter according to a fifth modification of the first embodiment.

FIG. 20A is a circuit configuration diagram of a variable filter 10H according to a fifth modification of the first embodiment.

The variable filter 10H illustrated in the diagram includes a parallel arm resonance circuit 21H (first resonance circuit) having the frequency variable circuit 11 which is connected in series to the circuit in which the parallel arm resonator p1 and the parallel arm resonator p2 are connected in parallel to each other.

In the present modification, the electrode finger pitch of the capacitance element C1 is narrower than the electrode finger pitch of the parallel arm resonator p1 and narrower than the electrode finger pitch of the parallel arm resonator p2. In addition, the film thickness of the plurality of electrode fingers 131a of the capacitance element C1 is smaller than the film thickness of the plurality of electrode fingers 121a of the parallel arm resonator p1 and smaller than the film thickness of the plurality of electrode fingers of the parallel arm resonator p2. With this configuration, it is possible to secure the Q value for each of the parallel arm resonators p1 and p2.

Note that the electrode finger pitch of the capacitance element C1 may be smaller than the electrode finger pitch of one parallel arm resonator and larger than the electrode finger pitch of the other parallel arm resonator, of the parallel arm resonators p1 and p2. In addition, the film thickness of the plurality of electrode fingers 131a of the capacitance element C1 may be smaller than the film thickness of the plurality of electrode fingers of the one parallel arm resonator and larger than the film thickness of the plurality of electrode fingers of the other parallel arm resonator.

Figure 20B:
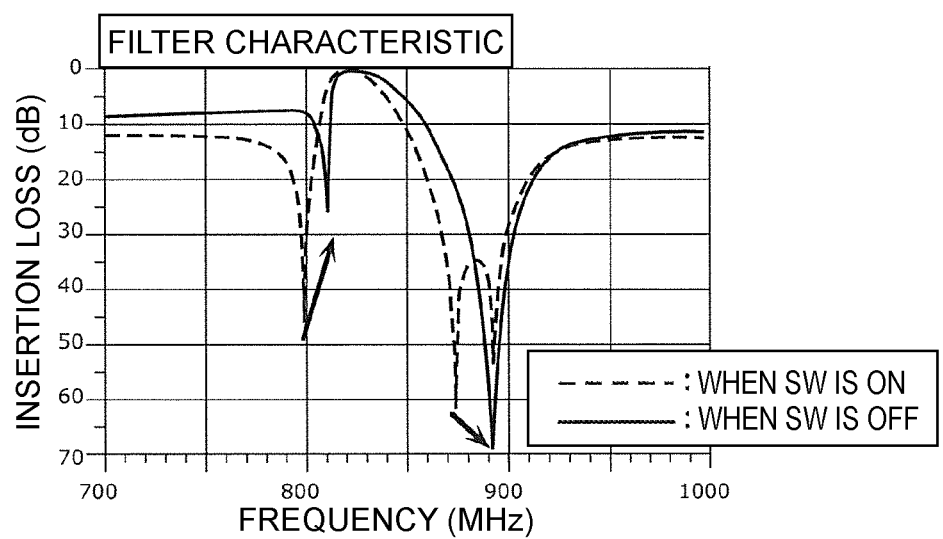
FIG. 20B is a graph showing a bandpass characteristic of the variable filter according to the fifth modification of the first embodiment.

FIG. 20B is a graph showing a bandpass characteristic of the variable filter 10H according to the fifth modification of the first embodiment. Specifically, the figure is a graph showing a comparison of the bandpass characteristics when the switch SW is on/off.

In the variable filter 10H, in the same manner as the variable filter 10E, the anti-resonant frequency of two anti-resonant frequencies of the parallel arm resonance circuit 21H on the low-band side and the resonant frequency of the serial arm resonance circuit (in the present modification, the serial arm resonator s1) are brought close to each other to form the pass band.

At this time, in the present modification, to each of the parallel arm resonators p1 and p2, only when the switch SW is off, the capacitance element C1 is added. Therefore, the resonant frequency of the two resonant frequencies of the parallel arm resonance circuit 21H on the low-band side shifts to the higher-band side than the resonant frequency of the parallel arm resonator p1 alone when the switch SW is off. Additionally, the resonant frequency of the two resonant frequencies of the parallel arm resonance circuit 21H on the high-band side shifts to the higher-band side than the resonant frequency of the parallel arm resonator p2 alone when the switch SW is off. However, the anti-resonant frequency of the parallel arm resonance circuit 21H on the low-band side is not shifted when the switch SW is off by the frequency variable circuit 11 being connected in series to the circuit in which the parallel arm resonator p1 and the parallel arm resonator p2 are connected in parallel to each other. Therefore, as shown in the graph, the variable filter 10H can shift the attenuation poles of the pass band on both sides to the higher-band side by switching the switch SW from on to off.

In the variable filter 10H described above, the capacitance element C1 is configured of the comb-tooth capacitance electrode formed of the plurality of electrode fingers and the substrate. Additionally, although not illustrated in FIG. 20A, the capacitance element C2 is arranged between the node x1 and the ground or the frequency variable circuit 11. Here, the capacitance element C2 is formed by the wiring, which is not connected to the capacitance element C1, of the IDT wirings connected to the IDT electrode of the parallel arm resonator p1 and the capacitance wiring connected to the capacitance element C1 intersecting with each other in the intersecting region. In other words, the capacitance element C2 is the multilayer type capacitor using the capacitance wiring in the intersection region and the IDT wiring in the intersection region as the opposite electrodes.

With this, in the capacitance element C2, the film thicknesses and the electrode areas of the opposite electrodes can be adjusted without being limited by the film thickness of the IDT electrode defined by the propagation characteristics of the acoustic wave, and thus the capacitance Q value can be increased. On the other hand, the capacitance element C1 can secure the large capacitance value. Accordingly, since the steepness of the pass band on the low-band side and the low loss characteristic of the pass band are secured, the bandpass characteristic of the variable filter 10H is improved.

[5.6 Sixth Modification of Filter Circuit]

The configuration of the filter (tunable filter) in which the frequency variable circuit is provided in the parallel arm resonance circuit has been described. In other words, as an example of the first acoustic wave resonator connected to the capacitance element C1 without interposing another acoustic wave resonator, the descriptions have been given using the parallel arm resonator. In addition, as an example of the first resonance circuit configured of the first acoustic wave resonator and the capacitance element C1, the descriptions have been given using the parallel arm resonance circuit. In addition, as an example of the second resonance circuit configured of one or more second acoustic wave resonators which form the pass band together with the first resonance circuit, the descriptions have been given using the serial arm resonance circuit.

However, the frequency variable circuit may be provided in the serial arm resonance circuit. Accordingly, in the present modification, descriptions will be given using the serial arm resonator s1 as an example of the first acoustic wave resonator, descriptions will be given using the serial arm resonance circuit as an example of the first resonance circuit, and descriptions will be given using the parallel arm resonance circuit (in the present modification, the parallel arm resonator p1) as an example of the second resonance circuit.

Figure 21A:
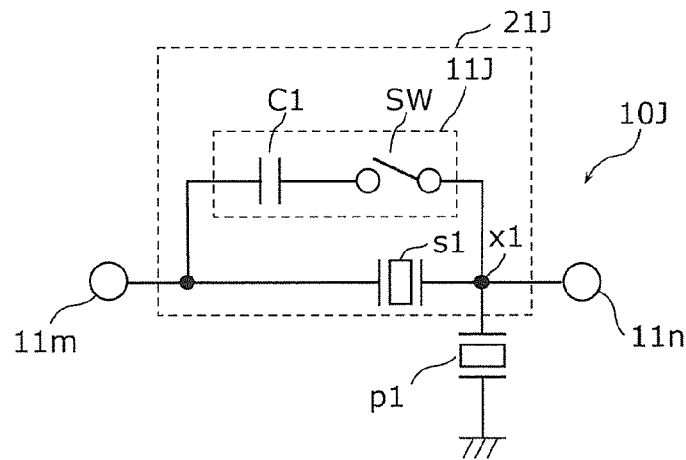
FIG. 21A is a circuit configuration diagram of a variable filter according to a sixth modification of the first embodiment.

FIG. 21A is a circuit configuration diagram of a variable filter 10J according to a sixth modification of the first embodiment.

In the variable filter 10J illustrated in the diagram, the switch SW (switch element) is connected in series to the capacitance element C1 (first capacitance element), and configures a frequency variable circuit 11J together with the capacitance element C1. Furthermore, the frequency variable circuit 11J is connected in parallel to the serial arm resonator s1 (first acoustic wave resonator). In other words, in the variable filter 10J, as compared with the variable filter 10 illustrated in FIG. 1A, the frequency variable circuit 11J configured by connecting the capacitance element C1 and the switch SW in series to each other is connected in parallel to the serial arm resonator s1.

Figure 21B:
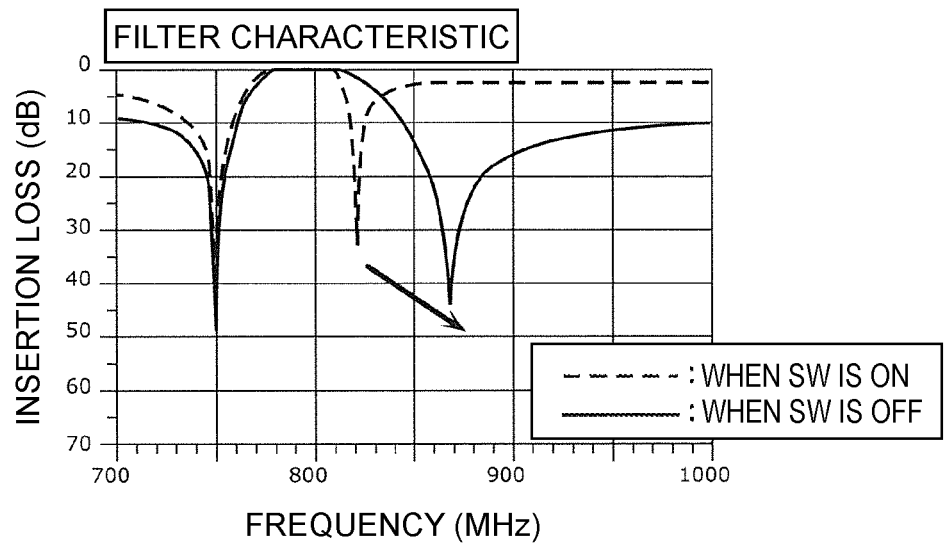
FIG. 21B is a graph showing a bandpass characteristic of the variable filter according to the sixth modification of the first embodiment.

FIG. 21B is a graph showing a bandpass characteristic of the variable filter 10J according to the sixth modification of the first embodiment. Specifically, the figure is a graph showing a comparison of the bandpass characteristics when the switch SW is on/off.

In the variable filter 10J, in the same manner as the variable filter 10, the anti-resonant frequency of the parallel arm resonance circuit (in the present modification, the parallel arm resonator p1) and the resonant frequency of a serial arm resonance circuit 21J are brought close to each other to form the pass band.

At this time, in the present modification, to the serial arm resonator s1, only when the switch SW is on, the capacitance element C1 is added. Therefore, the anti-resonant frequency of the serial arm resonance circuit 21J shifts to the lower-band side than the anti-resonant frequency of the serial arm resonator s1 when the switch SW is on. Therefore, as shown in the graph, the variable filter 10J can shift the attenuation pole of the pass band on the high-band side to the higher-band side by switching the switch SW from on to off.

In the variable filter 10J described above, the capacitance element C1 is configured of the comb-tooth capacitance electrode formed of the plurality of electrode fingers and the substrate. Additionally, although not illustrated in FIG. 21A, the capacitance element C2 is arranged between the node x1 on the path connecting the input and output terminals 11m and 11n and the ground. Here, the capacitance element C2 is formed by two IDT wirings connected to the IDT electrodes of the parallel arm resonator p1 intersecting with each other in the intersecting region. In other words, the capacitance element C2 is the multilayer type capacitor using the two wirings in the intersection region as the opposite electrodes. More specifically, a fourth wiring, which is connected to the parallel arm resonator p1 and the ground, of the one or more capacitance wirings connected to the ground, and the second wiring, which is connected to the parallel arm resonator p1, of the one or more IDT wirings connected to the IDT electrode of the serial arm resonator s1 intersect with each other when the substrate 102 is viewed in a plan view. Furthermore, the capacitance element C2 is configured of the fourth wiring in the intersecting region and the second wiring in the intersecting region.

In the above configuration, the pass band is configured by the resonant frequency of the serial arm resonance circuit 21J (first resonance circuit) and the anti-resonant frequency of the parallel arm resonator p1 (second resonance circuit). Additionally, the capacitance element C1 does not contribute to the resonant frequency of the serial arm resonance circuit 21J, and the capacitance element C2 contributes to the anti-resonant frequency of the parallel arm resonator p1. Therefore, the capacitance element C2 has a relatively small capacitance value and requires the high Q value.

According to the above configuration, the capacitance element C2 has the configuration in which the fourth wiring and the second wiring in the intersection region are used as the opposite electrodes. Therefore, even when the fourth wiring and the second wiring are formed on the same substrate, the film thicknesses of the opposite electrodes can be adjusted without being limited by the film thickness of the IDT electrode defined by the propagation characteristics of the acoustic wave, and it is thus possible to form the capacitance element C2 having the large capacitance Q value. Accordingly, since the steepness and the low loss characteristic of the pass band on the low-band side are particularly secured, the bandpass characteristic of the variable filter 10J is improved.

Fifth Embodiment

The configuration of the filter having the capacitance elements C1 and C2 described above is not limited to the one-stage ladder filter structure, and can also be applied to a multi-stage ladder filter structure. Accordingly, in the present embodiment, a filter having such a multi-stage ladder filter structure will be described using a tunable filter as an example.

Figure 22A:
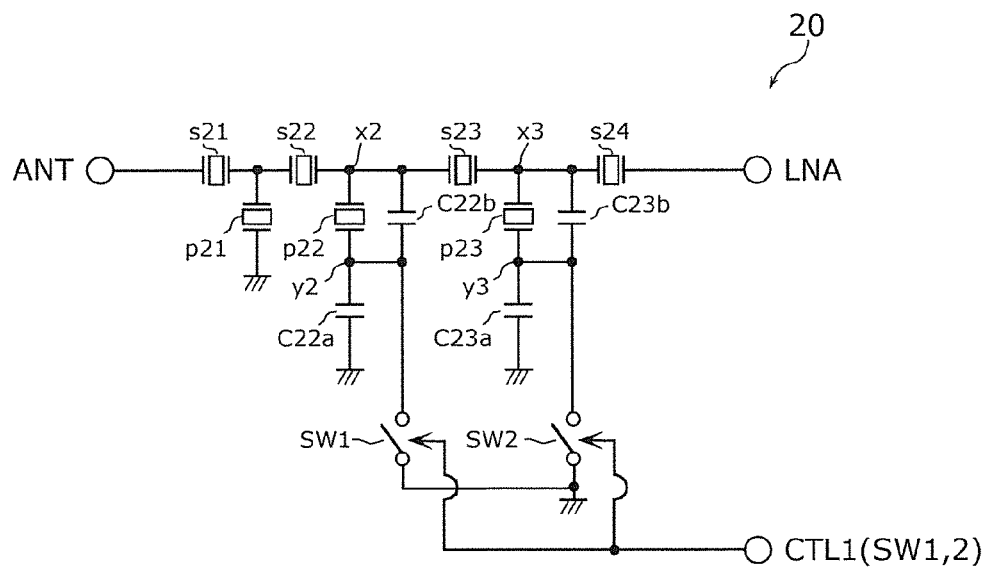
FIG. 22A is a circuit configuration diagram of a variable filter according to a fifth embodiment.

FIG. 22A is a circuit configuration diagram of a variable filter 20 according to a fifth embodiment.

Figure 23:
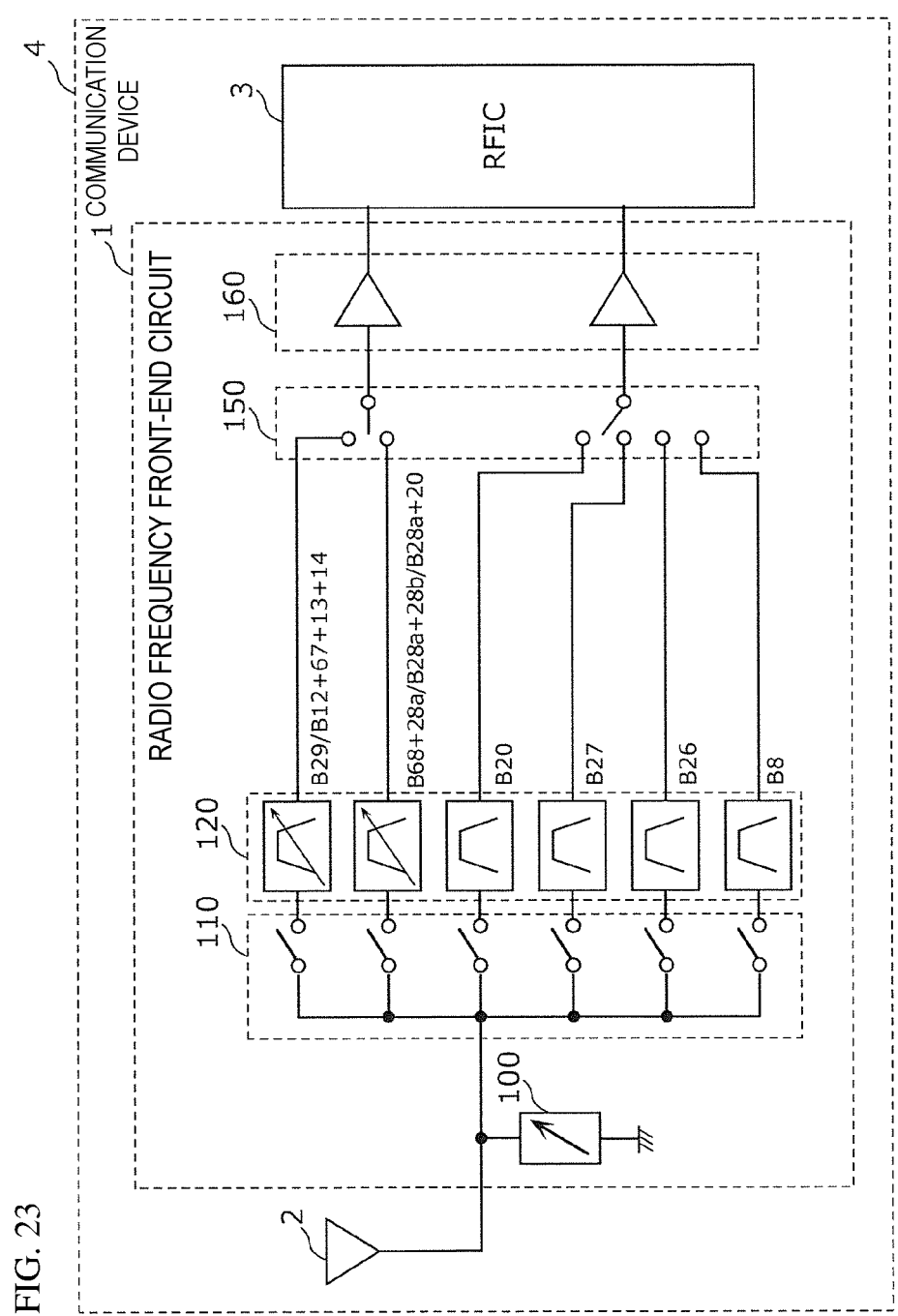
FIG. 23 is a configuration diagram of a radio frequency front-end circuit and a peripheral circuit thereof according to a sixth embodiment.

The variable filter 20 illustrated in the diagram filters, for example, a radio frequency signal inputted from an antenna element 2 (see FIG. 23) to an ANT terminal (first input and output terminal) with a predetermined pass band, and outputs the resulting signal from an LNA terminal (second input and output terminal) connected to a low noise amplifier (see FIG. 23). At this time, the variable filter 20 switches the predetermined pass band in accordance with a control signal inputted from a control unit such as an RFIC 3 (see FIG. 23) to a control terminal CTL1.

Specifically, the variable filter 20 is an acoustic wave device formed of a ladder filter structure including serial arm resonators s21 to s24 and parallel arm resonators p21 to p23. Furthermore, the variable filter 20 further includes capacitance elements C22a and C23a which are connected in series to the parallel arm resonators p22 and p23, respectively, a capacitance element C22b which is connected between the node x2 and a node y2, and a capacitance element C23b which is connected between a node x3 and a node y3. Note that the node x2 is a node connecting the serial arm resonators s22 and s23, and the node x3 is a node connecting the serial arm resonators s23 and s24. The node y2 is a node connecting the parallel arm resonator p22 and the capacitance element C22a, and the node y3 is a node connecting the parallel arm resonator p23 and the capacitance element C23a. Furthermore, the variable filter 20 further includes the switches SW1 and SW2 that are connected in parallel to the capacitance elements C22a and C23a, respectively, and configure the frequency variable circuit together with the capacitance elements C22a and C23a.

Furthermore, the switches SW1 and SW2 are turned on/off in accordance with the control signal inputted to the control terminal CTL1.

Here, at least one of the capacitance elements C22a and C23a is configured of the comb-tooth capacitance electrode formed of the plurality of electrode fingers and the substrate. On the other hand, at least one of the capacitance elements C22b and C23b is formed by the wiring, which is not connected to the capacitance elements C22a and C23a, of the IDT wirings connected to the IDT electrode of the parallel arm resonator p22 or p23 and the capacitance wiring connected to the capacitance element C22a or C23a intersecting with each other in the intersecting region. In other words, at least one of the capacitance elements C22b and C23b is the multilayer type capacitor using the capacitance wiring in the intersection region and the IDT wiring in the intersection region as the opposite electrodes.

With this, in at least one of the capacitance elements C22b and C23b, the film thicknesses and the electrode areas of the opposite electrodes can be adjusted without being limited by the film thickness of the IDT electrode defined by the propagation characteristics of the acoustic wave, and thus the capacitance Q value can be increased. On the other hand, at least one of the capacitance elements C22a and C23a can secure the large capacitance value. Accordingly, since the steepness of the pass band on the low-band side and the low loss characteristic of the pass band are secured, the bandpass characteristic of the variable filter 20 is improved.

Note that Table 2 shows the design parameters (the wave length of the acoustic wave, the electrode finger pitch, the number of pairs, and the cross-width) of each resonator configuring the variable filter 20 according to the present embodiment in detail. Note that the structure and the film thickness of the electrode fingers of the resonator are as described in the fourth embodiment with reference to FIG. 12A (see Table 1). In addition, a ratio of the film thickness to the electrode finger pitch of the resonator is equal to or more than 13.2% and equal to or less than 15.2%. In addition, the electrode duty of the resonator is 0.50.

TABLE 2

|  | Parallel Arm Resonator p21 | Parallel Arm Resonator p22 | Parallel Arm Resonator p23 |
|---|---|---|---|
| Wave Length of Acoustic Wave (μm) | 4.887 | 4.933 | 4.961 |
| Electrode Finger Pitch (μm) | 2.444 | 2.466 | 2.480 |
| The Number of Pairs (pairs) | 87.0 | 52.0 | 61.0 |
| Cross-Width (μm) | 129.66 | 267.24 | 204.43 |

|  | Serial Arm Resonator S21 | Serial Arm Resonator S22 | Serial Arm Resonator S23 | Serial Arm Resonator S24 |
|---|---|---|---|---|
| Wave Length of Acoustic Wave (μm) | 4.622 | 4.634 | 4.593 | 4.626 |
| Electrode Finger Pitch (μm) | 2.311 | 2.317 | 2.297 | 2.313 |
| The Number of Pairs (pairs) | 97.0 | 93.0 | 97.0 | 97.0 |
| Cross-Width (μm) | 94.36 | 54.37 | 44.23 | 37.59 |

Furthermore, Table 3 shows the design parameters (the electrode finger pitch, the number of pairs, and the cross-width) of the comb-tooth capacitance configuring the variable filter 20 according to the present embodiment in detail. Note that the structure and the film thickness of the electrode fingers of the comb-tooth capacitance are as described in the fourth embodiment with reference to FIG. 12A (see Table 1). In addition, a ratio of the film thickness to the electrode finger pitch of the comb-tooth capacitance is 16.9%. In addition, the electrode duty of the comb-tooth capacitance is 0.55.

TABLE 3

|  | Capacitance Element C22a | Capacitance Element C23a |
|---|---|---|
| Electrode Finger Pitch (μm) | 1.300 | 1.300 |
| The Number of Pairs (pairs) | 230.0 | 182 |
| Cross-Width (μm) | 119.39 | 71.39 |

|  | Capacitance Element C22b | Capacitance Element C23b |
|---|---|---|
| Planar x Dimension (μm) | 20.0 | 20.0 |
| Planar y Dimension (μm) | 33.8 | 31.0 |

Additionally, as shown in Table 2 and Table 3, the electrode finger pitches of the capacitance elements C22a and C23a are narrower than the electrode finger pitches of the parallel arm resonators p22 and p23 (first acoustic wave resonators), which are connected to the capacitance elements C22a and C23a, respectively, without interposing another acoustic wave resonator. In addition, the film thickness of the electrode fingers of each of the capacitance elements C22a and C23a is smaller than the film thickness of the electrode fingers of each of the parallel arm resonators p22 and p23 (see Table 1).

Thus, according to the variable filter 20, the Q values of the parallel arm resonators p22 and p23 (first acoustic wave resonators) and the Q values of the capacitance elements C22a and C23a can both be secured. In other words, the variable filter 20 can secure both the Q value of the acoustic wave resonator and the Q value of the comb-tooth capacitance in two or more stages of the multi-stage ladder filter structure (three stages in the present embodiment), and thus the loss in the pass band can be suppressed while increasing the attenuation in the attenuation band.

Figure 22B:
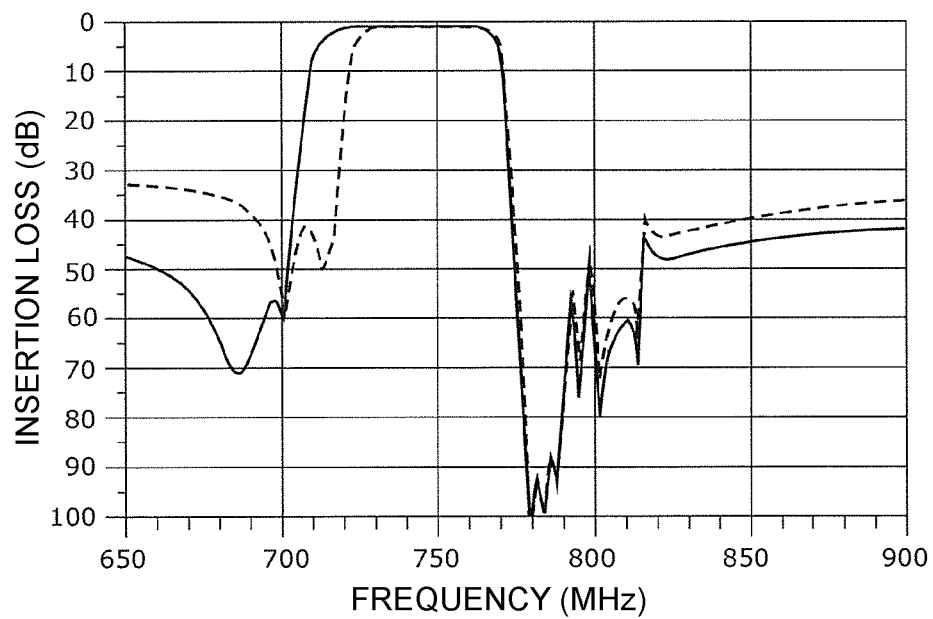
FIG. 22B is a graph showing a bandpass characteristic of the variable filter according to the fifth embodiment.

FIG. 22B is a graph showing the bandpass characteristic of the variable filter 20 according to the fifth embodiment. Specifically, the figure is a graph showing a comparison of the bandpass characteristics when the switches SW1 and SW2 are on/off. Note that in the graph, on an upper side of the graph showing the filter bandpass characteristic, a pass band corresponding to each bandpass characteristic and a state of the switches SW1 and SW2 at this time are shown.

As shown in the graph, in the variable filter 20, by the switches SW1 and SW2 being turned on/off in accordance with the control signal inputted to the control terminal CTL1, the pass band can be switched to an arbitrary one of the frequency bands assigned to Bands described in the following (i) and (ii).

Note that the frequency band assigned to each Band described below is defined by the LTE standard, and the detailed descriptions thereof will be omitted.

(i) Band 29
(ii) Band 12, 67, 13, or 14

As described above, with the variable filter 20 according to the present embodiment, the frequency variable circuit is provided in the two or more stages of the multi-stage ladder filter structure (three stages in the present embodiment), which makes it possible to more finely adjust the bandpass characteristic of the entire variable filter 20. For this reason, by appropriately selecting the on/off states of the switches SW1 and SW2, it is possible to switch to an appropriate band. Furthermore, by having the multi-stage filter structure, it is possible to increase the attenuation in the attenuation band.

Sixth Embodiment

The variable filters (acoustic wave devices) described in the above first to fifth embodiments can be applied to a radio frequency front-end circuit and the like. Accordingly, in the present embodiment, a configuration of such a radio frequency front-end circuit including the variable filter 20 according to the fifth embodiment will be described.

FIG. 23 is a configuration diagram of a radio frequency front-end circuit 1 and a peripheral circuit thereof according to a sixth embodiment. The diagram illustrates the radio frequency front-end circuit 1, the antenna element 2, and the RF signal processing circuit (RFIC) 3. The radio frequency front-end circuit 1, the RFIC 3, and the antenna element 2 configure a communication device 4. The antenna element 2, the radio frequency front-end circuit 1, and the RFIC 3 are arranged, for example, at the front end portion of a multi-mode/multi-band capable cellular phone.

The antenna element 2 is a multi-band capable antenna that transmits and receives a radio frequency signal and that is based on a communication standard such as LTE, for example. Note that the antenna element 2 may not handle all bands of the communication device 4, for example, and may handle only a band of a low-frequency band group or a high-frequency band group. Furthermore, the antenna element 2 may not be built in the communication device 4.

The RFIC 3 is an RF signal processing circuit that processes the radio frequency signal transmitted and received by the antenna element 2. Specifically, the RFIC 3 performs signal processing, such as down conversion, on a radio frequency signal (here, a radio frequency reception signal) inputted from the antenna element 2 through a reception-side signal path of the radio frequency front-end circuit 1 and outputs a reception signal generated by the signal processing to a baseband signal processing circuit (not illustrated). Furthermore, the RFIC 3 performs signal processing, such as up conversion, on a transmission signal inputted from the baseband signal processing circuit and outputs a radio frequency signal generated by the signal processing (here, a radio frequency transmission signal) to a transmission-side signal path of the radio frequency front-end circuit 1 (not illustrated).

The radio frequency front-end circuit 1 is a circuit for transmitting the radio frequency signal between the antenna element 2 and the RFIC 3. Specifically, the radio frequency front-end circuit 1 transmits the radio frequency signal outputted from the RFIC 3 (here, the radio frequency transmission signal) to the antenna element 2 through the transmission-side signal path (not illustrated). Furthermore, the radio frequency front-end circuit 1 transmits the radio frequency signal received by the antenna element 2 (here, the radio frequency reception signal) to the RFIC 3 through the reception-side signal path.

The radio frequency front-end circuit 1 includes a variable impedance matching circuit 100, a switch group 110, a filter group 120, a switch group 150, and a reception amplifier circuit group 160, in this order from the antenna element 2 side.

The switch group 110 is configured of one or more switches (in the present embodiment, a plurality of switches) which connect the antenna element 2 and a filter handling a predetermined band in accordance with the control signal from the control unit (not illustrated). Note that the number of the filters connected to the antenna element 2 is not limited to one, and a plurality of filters may be connected.

The filter group 120 is configured of one or more filters, and in the present embodiment, is configured of the following first to sixth filters, for example. Specifically, the first filter is a tunable filter that can handle Band 29, and Bands 12, 67, 13, and 14, and the filter 20 according to the fifth embodiment can be used therefor. The second filter is a tunable filter that can handle CA of Bands 68 and 28a, CA of Bands 28a and 28b, and CA of Bands 28a and 20. Each of the third to sixth filters is a filter having a fixed pass band, and the third filter handles Band 20, the fourth filter handles Band 27, the fifth filter handles Band 26, and the sixth filter handles Band 8.

The switch group 150 is configured of one or more switches (in the present embodiment, a plurality of switches) that connect a filter which handles a predetermined band and a reception amplifier circuit, which handles the predetermined band, of the reception amplifier circuit group 160 in accordance with the control signal from the control unit (not illustrated). Note that the number of the filters connected to the reception amplifier circuit is not limited to one, and a plurality of filters may be connected.

The reception amplifier circuit group 160 is configured of one or more low noise amplifiers (in the present embodiment, a plurality of low noise amplifiers) that amplify the radio frequency reception signal inputted from the switch group 150.

The radio frequency front-end circuit 1 configured as described above filters the radio frequency signal (here, the radio frequency reception signal) inputted from the antenna element 2 by a predetermined filter and amplifies the filtered signal by a predetermined low noise amplifier, and outputs the resulting signal to the RFIC 3. Note that the RFIC handling the low band and the RFIC handling the high band may be individually provided.

Here, the radio frequency front-end circuit 1 includes the variable filter 20 according to the fifth embodiment as the first filter (tunable filter). As described in the fifth embodiment, in the variable filter 20, at least one of the capacitance elements C22$a$ and C23$a$ is a capacitor configured of the comb-tooth capacitance electrode and the substrate. On the other hand, at least one of the capacitance elements C22$b$ and C23$b$ is the multilayer type capacitor. With this, in at least one of the capacitance elements C22$b$ and C23$b$, the film thicknesses and the electrode areas of the opposite electrodes can be adjusted without being limited by the film thickness of the IDT electrode defined by the propagation characteristics of the acoustic wave, and thus the capacitance Q value can be increased. On the other hand, at least one of the capacitance elements C22$a$ and C23$a$ can secure the large capacitance value. Accordingly, since the steepness of the pass band on the low-band side and the low loss characteristic of the pass band, of the variable filter 20, are secured, the propagation characteristics of the communication device 4 is improved.

Furthermore, by including the variable filter 20 (tunable filter) according to the fifth embodiment, since the number of filters can be reduced as compared with a case where a filter having a fixed pass band is provided, the radio frequency front-end circuit 1 can be reduced in size.

Note that the radio frequency front-end circuit 1 may include a variable filter corresponding to any one of the first to fourth embodiments and the modifications thereof as the second filter (tunable filter).

Note that in the present embodiment, the configuration for reception diversity in which the plurality of filters (reception filters) is provided in the reception-side signal path is described as the radio frequency front-end circuit 1. However, the configuration of the radio frequency front-end circuit is not limited to this, and may be a configuration for transmission diversity in which a plurality of filters (transmission filters) is provided in the transmission-side signal path. Furthermore, the radio frequency front-end circuit is not limited to the configuration for the diversity in which the plurality of reception filters or the plurality of transmission filters are included, may have a configuration in which only one reception filter or only one transmission filter is included, or may have a configuration for transmission and reception in which at least one transmission filter and at least one reception filter are included.

Other Embodiments

Although the acoustic wave device and the radio frequency front-end circuit according to the embodiments of the present disclosure have been described using the first to sixth embodiments, the present disclosure is not limited to the above embodiments. The present disclosure also encompasses other embodiments that are implemented by combining desired constituent elements in the above-described embodiments, modifications obtained by adding various changes to the above-described embodiments, which are conceived by those skilled in the art, without departing from the gist of the present disclosure, and various apparatuses incorporating the acoustic wave device and the radio frequency front-end circuit according to the present disclosure.

For example, the communication device 4 including the radio frequency front-end circuit and the RFIC 3 (RF signal processing circuit) described above is also included in the present disclosure. According to the communication device 4 as described above, it is possible to suppress the loss in the pass band.

Additionally, a multiplexer, such as a duplexer, including the variable filter as described above is also included in the present disclosure. In other words, in a multiplexer in which a plurality of filters are commonly connected, at least one variable filter may be any one of the variable filters described above.

In addition, among the acoustic wave resonators configuring the variable filter, at least one of one or more acoustic wave resonators, excluding the acoustic wave resonator (first acoustic wave resonator) connected to the comb-tooth capacitance without interposing another acoustic wave resonator, may be configured of an acoustic wave resonator using bulk waves or boundary acoustic waves.

Furthermore, for example, in the radio frequency front-end circuit or the communication device, an inductor or a capacitor may be connected between constituent elements. Note that the inductor may include a wiring inductor by a wiring connecting between the constituent elements.

The present disclosure is widely applicable to communication apparatuses, such as a cellular phone, as a variable filter, a multiplexer, a front-end circuit, and a communication device with a low loss.

1 RADIO FREQUENCY FRONT-END CIRCUIT
2 ANTENNA ELEMENT
3 RFIC (RF SIGNAL PROCESSING CIRCUIT)
4 COMMUNICATION DEVICE
10, 10A, 10B, 10C, 10D, 10E, 10F, 10G, 10H, 10J, 20 VARIABLE FILTER (ACOUSTIC WAVE DEVICE)
10W FILTER
11, 11A, 11$a$, 11$b$, 11D, 11J FREQUENCY VARIABLE CIRCUIT
11$g$ GROUND TERMINAL
11$m$, 11$n$, 11$n$1, 11$n$2 INPUT AND OUTPUT TERMINAL
11$s$ CONNECTION TERMINAL
21, 21A, 21B, 21D, 21E, 21F, 21H PARALLEL ARM RESONANCE CIRCUIT
21J SERIAL ARM RESONANCE CIRCUIT
101 ELECTRODE FILM
102 SUBSTRATE
103, 103$b$, 104 PROTECTIVE LAYER
103$a$ ADJUSTMENT FILM
110, 150 SWITCH GROUP
111, 121, 121$x$, 121$y$ IDT ELECTRODE
112, 122 REFLECTOR
120 FILTER GROUP
121$a$, 131$a$ ELECTRODE FINGER
141, 143, 144, 146, 151, 153, 154, 161, 163, 164 WIRING
142, 148, 152, 162 INTERMEDIATE LAYER 145, 155, 165, 175 COMB-TOOTH CAPACITANCE ELECTRODE
147 THREE-DIMENSIONAL WIRING
160 RECEPTION AMPLIFIER CIRCUIT GROUP
211, 212, 213, 214, 215 METAL FILM
C1, C11, C12, C2, C21, C22, C22a, C22b, C23a, C23b, C3 CAPACITANCE ELEMENT
L INDUCTOR
p1, p2, p21, p22, p23 PARALLEL ARM RESONATOR
s1, s21, s22, s23, s24 SERIAL ARM RESONATOR
SW, SW1, SW2 SWITCH (SWITCH ELEMENT)

The invention claimed is:
1. An frequency variable type acoustic wave device comprising:
   a first input-output terminal and a second input-output terminal, a first path connecting the first input-output terminal and the second input-output terminal, and a second path connecting a node on the first path and ground;
   a first resonance circuit in the first path or in the second path; and
   a second resonance circuit provided in the other of the first path or the second path, wherein:
   the first and second resonance circuits form a pass band of the acoustic wave device,
   the first resonance circuit comprises:
      a first acoustic wave resonator including a first interdigital transducer (IDT) electrode having a plurality of electrode fingers, and
      a frequency variable circuit connected to the first acoustic wave resonator and configured to vary the pass band,
   the frequency variable circuit comprises:
      a first capacitance element connected to the first acoustic wave resonator, and
      a switch configured to selectively switch a conduction path of the frequency variable circuit,
   the acoustic wave device further comprises a second capacitance element connected between the node and ground or the frequency variable circuit,
   the first IDT electrode, a first IDT wiring connected to the first IDT electrode, and a first capacitance wiring connected to the first capacitance element or ground, are provided on the same substrate,
   the first capacitance wiring and the first IDT wiring intersect each other when the substrate is viewed in a plan view, and
   the second capacitance element is provided by the intersection of the first capacitance wiring and the first IDT wiring.
2. The acoustic wave device according to claim 1, wherein:
   the first resonance circuit is provided in the second path,
   the first acoustic wave resonator is connected to the node,
   the frequency variable circuit is connected between the first acoustic wave resonator and ground,
   the first capacitance element and the switch are connected in parallel,
   a first wiring connected to the first capacitance element or to the switch and ground, and a second wiring connected to the second resonance circuit, intersect each other when the substrate is viewed in the plan view, and
   the second capacitance element is provided by the intersection of the first wiring and the second wiring.

3. The acoustic wave device according to claim 1, wherein:
   the first resonance circuit is provided in the second path,
   the first acoustic wave resonator is connected to the node,
   the frequency variable circuit is connected between the first acoustic wave resonator and ground,
   the first capacitance element and the switch are connected in parallel,
   a third wiring connected to the first capacitance element and the switch or to the first acoustic wave resonator, and a second wiring connected to the second resonance circuit, intersect each other when the substrate is viewed in the plan view, and
   the second capacitance element is provided by the intersection of the third wiring and the second wiring.
4. The acoustic wave device according to claim 1, wherein:
   the first resonance circuit is provided in the first path,
   the first acoustic wave resonator and the frequency variable circuit are connected in parallel,
   the first capacitance element and the switch are connected in series,
   a fourth wiring connected to the second resonance circuit and ground, and a second wiring connected to the second resonance circuit, intersect each other when the substrate is viewed in the plan view, and
   the second capacitance element is provided by the intersection of the fourth wiring and the second wiring.
5. The acoustic wave device according to claim 1, wherein the second capacitance element is further provided by a first intermediate layer made of an insulator or a dielectric and sandwiched between the first capacitance wiring and the first IDT wiring.
6. The acoustic wave device according to claim 5, wherein the first intermediate layer is made of silicon oxide, alumina, silicon nitride, or polyimide.
7. The acoustic wave device according to claim 1, wherein a film thickness of an IDT wiring that is not connected to the first capacitance element is greater than a film thickness of the first capacitance wiring.
8. The acoustic wave device according to claim 1, wherein the first capacitance element is further provided by a comb-tooth capacitance electrode having a plurality of electrode fingers formed on the substrate.
9. The acoustic wave device according to claim 8, wherein a film thickness of the first capacitance wiring or the first IDT wiring is greater than a film thickness of the comb-tooth capacitance electrode.
10. The acoustic wave device according to claim 8, the acoustic wave device further comprising:
    a second intermediate layer formed on the comb-tooth capacitance electrode and made of an insulator or a dielectric; and
    a three-dimensional wiring formed on the second intermediate layer and connected to the first IDT wiring.
11. The acoustic wave device according to claim 10, wherein the comb-tooth capacitance electrode, the substrate, and the three-dimensional wiring have a capacitance configured to suppress excitation of an acoustic wave generated in the comb-tooth capacitance electrode.
12. The acoustic wave device according to claim 10, wherein the three-dimensional wiring is connected to an electrode of the comb-tooth capacitance electrode having the first IDT wiring interposed between the three-dimensional wiring and the comb-tooth capacitance electrode.
13. The acoustic wave device according to claim 10, wherein a film thickness of the three-dimensional wiring is greater than a film thickness of the plurality of electrode fingers of the comb-tooth capacitance electrode.

14. The acoustic wave device according to claim 10, wherein the second intermediate layer is made of silicon oxide, alumina, silicon nitride, or polyimide.

15. The acoustic wave device according to claim 8, wherein:
- a pitch of the plurality of electrode fingers of the comb-tooth capacitance electrode is narrower than a pitch of the plurality of electrode fingers of the first IDT electrode,
- the film thickness of the plurality of electrode fingers of the comb-tooth capacitance electrode is less than a film thickness of the plurality of electrode fingers of the first IDT electrode, and
- a self-resonance of the comb-tooth capacitance electrode and the substrate is closer to an upper limit of the pass band than to a lower limit of the pass band.

16. The acoustic wave device according to any one of claim 1, wherein:
- the second resonance circuit comprises a second acoustic wave resonator having a second IDT electrode having a plurality of electrode fingers,
- the first resonance circuit is provided in the second path and the second resonance circuit is provided in the first path,
- the switch is connected in parallel with the first capacitance element, and
- the frequency variable circuit is connected in series with the first acoustic wave resonator between the node and the ground.

17. The acoustic wave device according to claim 16, wherein:
- the first resonance circuit further comprises a third acoustic wave resonator,
- the third acoustic wave resonator is connected in parallel with the series connection of the first acoustic wave resonator and the frequency variable circuit, and
- a resonant frequency of the third acoustic wave resonator is different from a resonant frequency of the first acoustic wave resonator, and an anti-resonant frequency of the third acoustic wave resonator is different from an anti-resonant frequency of the first acoustic wave resonator.

18. The acoustic wave device according to claim 16, wherein:
- the frequency variable circuit further comprises an inductor connected in series with the switch, and
- the series connection of the switch and the inductor is connected in parallel with the comb-tooth capacitance.

19. The acoustic wave device according to claim 1, wherein:
- the first resonance circuit is provided in the first path,
- the second resonance circuit is provided in the second path,
- the switch is connected in series with the first capacitance element, and
- the frequency variable circuit is connected in parallel with the first acoustic wave resonator.

* * * * *